(12) United States Patent
Yamazaki et al.

(10) Patent No.: US 9,219,163 B2
(45) Date of Patent: Dec. 22, 2015

(54) DISPLAY DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/662,440

(22) Filed: Mar. 19, 2015

(65) Prior Publication Data

US 2015/0255613 A1     Sep. 10, 2015

Related U.S. Application Data

(63) Continuation of application No. 13/667,208, filed on Nov. 2, 2012, now Pat. No. 8,988,625.

(30) Foreign Application Priority Data

Nov. 11, 2011  (JP) .................................. 2011-247256
Nov. 11, 2011  (JP) .................................. 2011-247258

(51) Int. Cl.
G02F 1/136    (2006.01)
H01L 29/786   (2006.01)
H01L 29/66    (2006.01)

(52) U.S. Cl.
CPC ...... H01L 29/7869 (2013.01); H01L 29/66969 (2013.01); H01L 29/78606 (2013.01)

(58) Field of Classification Search
USPC ................................................... 349/43, 141
See application file for complete search history.

(56) References Cited

U.S. PATENT DOCUMENTS 5,477,355 A    12/1995    Sasaki et al.
5,731,856 A    3/1998    Kim et al.
(Continued)

FOREIGN PATENT DOCUMENTS

EP    1737044 A    12/2006
EP    2144294 A    1/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Lucy Chien
(74) *Attorney, Agent, or Firm* — Fish & Richardson P.C.

(57) ABSTRACT

The display device includes a gate electrode, a gate insulating film provided over the gate electrode, a semiconductor film provided over the gate insulating film to overlap with the gate electrode, an island-shaped first insulating film provided over the semiconductor film to overlap with the gate electrode, a first conductive film provided over the semiconductor film, a pair of second conductive films which is provided over the semiconductor film and between which the first insulating film is sandwiched, and a second insulating film provided over the first insulating film, the first conductive film, and the pair of second conductive films. In the second insulating film and the semiconductor film, an opening portion which is positioned between the first conductive film and the one or the other of the pair of second conductive films is provided.

26 Claims, 33 Drawing Sheets

(56) References Cited

U.S. PATENT DOCUMENTS

| | | |
|---|---|---|
| 5,744,864 A | 4/1998 | Cillessen et al. |
| 5,886,761 A | 3/1999 | Sasaki et al. |
| 6,097,452 A | 8/2000 | Shimada et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 6,900,854 B1 | 5/2005 | Kim et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,279,370 B2 * | 10/2007 | Lim et al. ...................... 438/155 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,495,252 B2 | 2/2009 | Ahn et al. |
| 7,501,293 B2 | 3/2009 | Ito et al. |
| 7,576,394 B2 | 8/2009 | Furuta et al. |
| 7,601,984 B2 | 10/2009 | Sano et al. |
| 7,642,038 B2 | 1/2010 | Fujii |
| 7,674,650 B2 | 3/2010 | Akimoto et al. |
| 7,732,819 B2 | 6/2010 | Akimoto et al. |
| 7,863,607 B2 | 1/2011 | Lee et al. |
| 7,910,490 B2 | 3/2011 | Akimoto et al. |
| 7,919,396 B2 | 4/2011 | Ahn et al. |
| 7,932,521 B2 | 4/2011 | Akimoto et al. |
| 7,994,500 B2 | 8/2011 | Kim et al. |
| 8,148,779 B2 | 4/2012 | Jeong et al. |
| 8,188,480 B2 | 5/2012 | Itai |
| 8,203,143 B2 | 6/2012 | Imai |
| 8,222,092 B2 | 7/2012 | Yamazaki et al. |
| 8,274,077 B2 | 9/2012 | Akimoto et al. |
| 2001/0046027 A1 | 11/2001 | Tai et al. |
| 2002/0056838 A1 | 5/2002 | Ogawa |
| 2002/0075423 A1 | 6/2002 | Fujino |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0221203 A1 | 10/2005 | Fujii |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0145157 A1 | 7/2006 | Choi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267094 A1 | 11/2006 | Ahn et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0006833 A1 | 1/2010 | Ha et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051938 A1 | 3/2010 | Hayashi et al. |
| 2010/0051943 A1 | 3/2010 | Fujii |
| 2010/0051949 A1 | 3/2010 | Yamazaki et al. |
| 2010/0065844 A1 | 3/2010 | Tokunaga |
| 2010/0072467 A1 | 3/2010 | Yamazaki et al. |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0102311 A1 | 4/2010 | Ito et al. |
| 2010/0105163 A1 | 4/2010 | Ito et al. |
| 2010/0109002 A1 | 5/2010 | Itagaki et al. |
| 2010/0136743 A1 | 6/2010 | Akimoto et al. |
| 2010/0140612 A1 | 6/2010 | Omura et al. |
| 2010/0163865 A1 | 7/2010 | Arai |
| 2010/0163868 A1 | 7/2010 | Yamazaki et al. |
| 2010/0283049 A1 | 11/2010 | Sato et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |

(56) References Cited

U.S. PATENT DOCUMENTS

| | | |
|---|---|---|
| 2011/0037068 A1 | 2/2011 | Yamazaki et al. |
| 2011/0084265 A1 | 4/2011 | Arasawa et al. |
| 2011/0085104 A1 | 4/2011 | Arasawa et al. |
| 2011/0193083 A1 | 8/2011 | Kim et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2012/0052606 A1 | 3/2012 | Yamazaki |
| 2012/0052625 A1 | 3/2012 | Yamazaki |
| 2012/0061664 A1 | 3/2012 | Yamazaki et al. |
| 2012/0061665 A1 | 3/2012 | Miyake et al. |
| 2012/0061673 A1 | 3/2012 | Yamazaki et al. |
| 2012/0062813 A1 | 3/2012 | Koyama |
| 2012/0062814 A1 | 3/2012 | Yamazaki et al. |
| 2012/0064650 A1 | 3/2012 | Yamazaki et al. |
| 2012/0088151 A1 | 4/2012 | Yamazaki et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2013/0120702 A1 | 5/2013 | Yamazaki et al. |
| 2013/0134414 A1 | 5/2013 | Yamazaki et al. |

FOREIGN PATENT DOCUMENTS

| | | | |
|---|---|---|---|
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2000-357586 | A | 12/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2005-077822 | A | 3/2005 |
| JP | 2007-073559 | A | 3/2007 |
| JP | 2007-096055 | A | 4/2007 |
| JP | 2007-123861 | A | 5/2007 |
| JP | 2010-040552 | A | 2/2010 |
| WO | WO-2004/114391 | | 12/2004 |
| WO | WO-2009/072532 | | 6/2009 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistros Produced at Room Temperature", Appl. Phys. Lett. (Applied Physics Letters) , Sep. 27, 2004, vol. 85, No. 13, pp. 2541-2543.

Fung.T et al., "2-D Numerical Stimulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journals of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of Slates", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 579-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

(56) References Cited

OTHER PUBLICATIONS

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn]at Temperatures over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—GaA—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters) Jul. 31, 2000, vol. 85, No. 5, pp. 1012-1015.

Kamiya.T et al., "Carrier transport properties and electronic structures of amorphous oxide semiconductors: the present status", Solid State Physics, Sep. 1, 2009, vol. 44, No. 9, pp. 621-633, AGNE GIJUTSU center.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Quirk.M et al., "Semiconductor manufacturing technology", Prentice-Hall, 2001, pp. 314-320, Prentice-Hall, Inc.

Kim.H et al., "22.1: Invited Paper: Technological Challenges for Large-Size AMOLED Display", SID Digest '08 : SID International Symposium Digest of Technical Papers, May 20, 2008, vol. 39, No. 1, pp. 291-294.

* cited by examiner

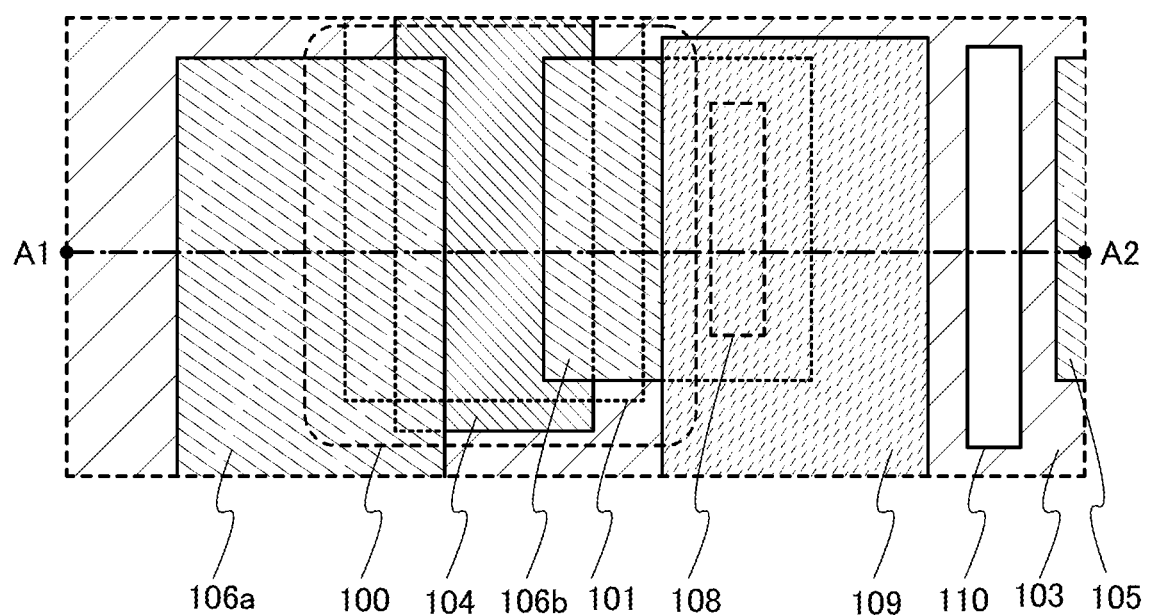

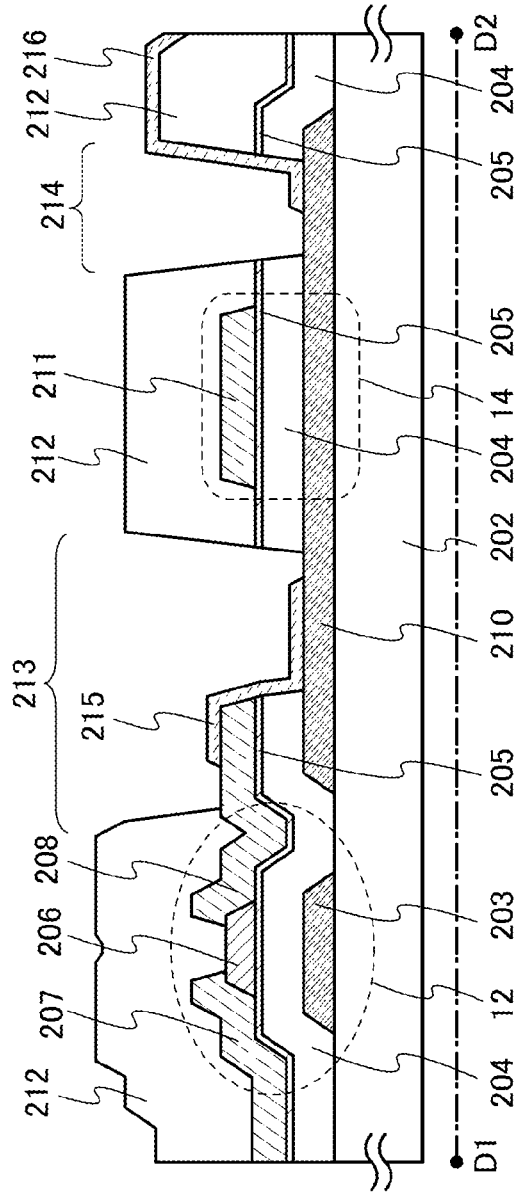
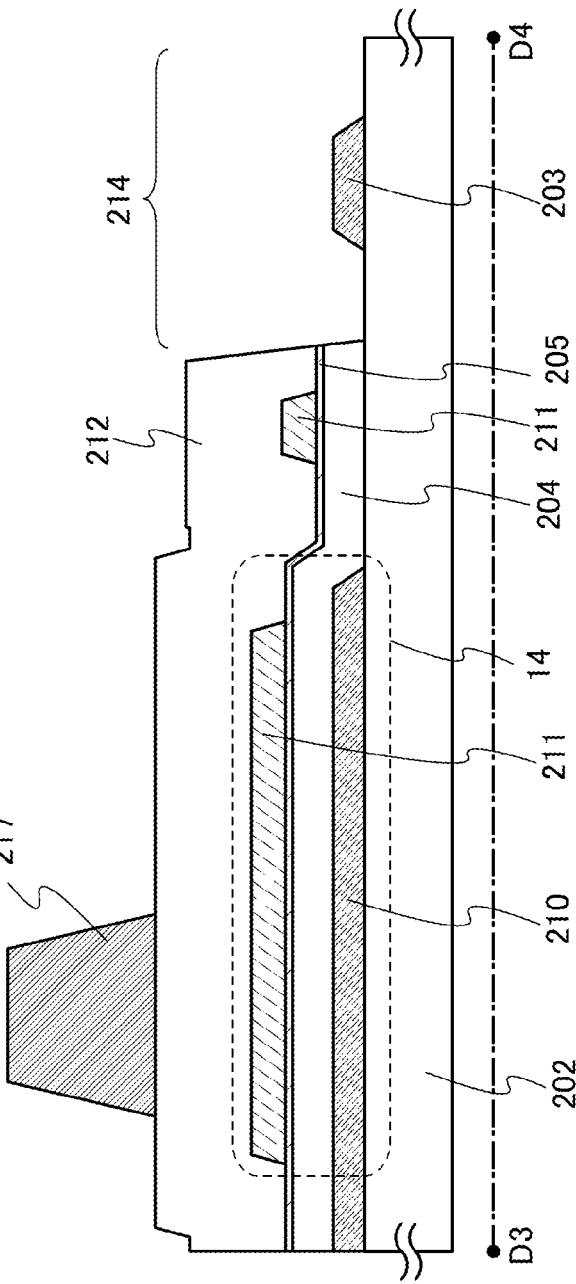
FIG. 6A
FIG. 6B

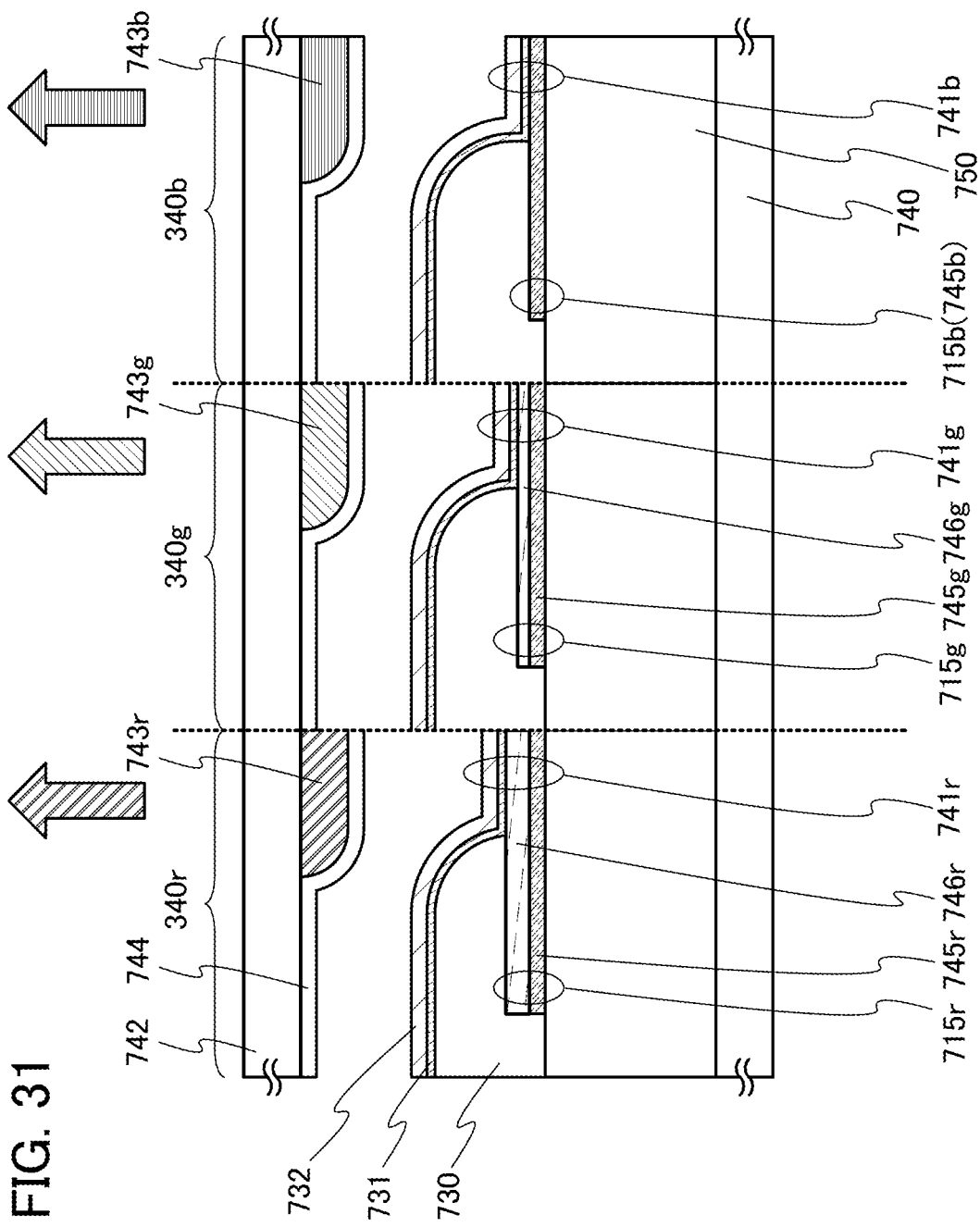

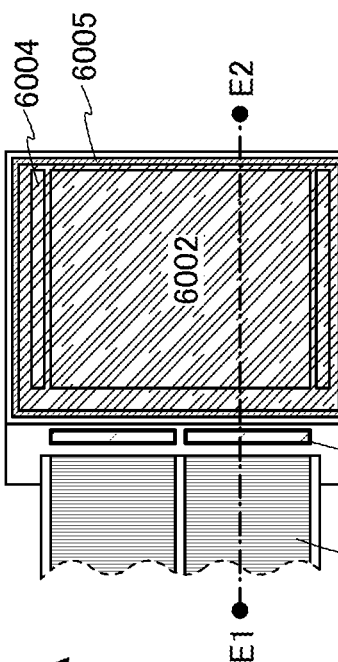
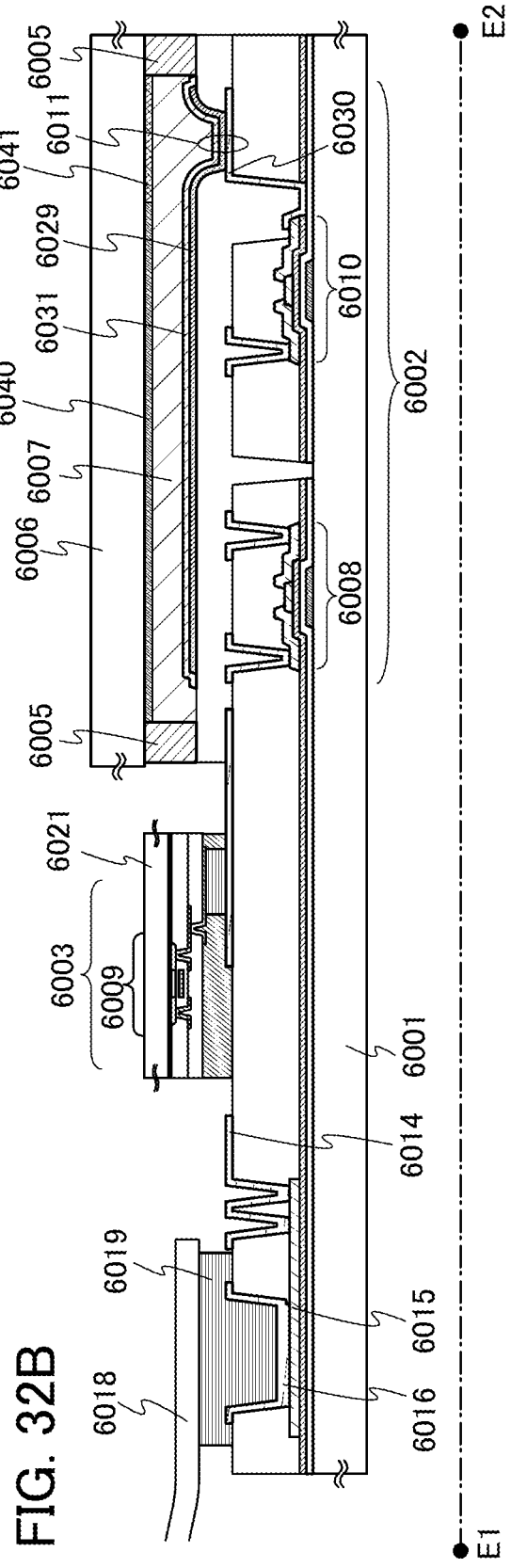
FIG. 32A
FIG. 32B

DISPLAY DEVICE AND MANUFACTURING METHOD THEREOF

CROSS-REFERENCE TO RELATED APPLICATIONS

This application is a continuation of U.S. application Ser. No. 13/667,208, filed Nov. 2, 2012, now allowed, which claims the benefit of foreign priority applications both of which were filed in Japan as Serial No. 2011-247258, and Serial No. 2011-247256 on Nov. 11, 2011, all of which are incorporated by reference.

BACKGROUND OF THE INVENTION

1. Field of the Invention

The present invention relates to a liquid crystal display device in which transistors are provided in respective pixels, and a manufacturing method thereof. The present invention also relates to a light-emitting display device in which transistors are provided in respective pixels, and a manufacturing method thereof.

2. Description of the Related Art

In recent years, a metal oxide having semiconductor characteristics, which is called an oxide semiconductor, has attracted attention as a novel semiconductor material having both high mobility almost the same as that of crystalline silicon and uniform element characteristics almost the same as those of amorphous silicon. The metal oxide is used for a variety of applications. For example, indium oxide is a well-known metal oxide and used as a material of a light-transmitting pixel electrode included in a liquid crystal display device or the like. Examples of such metal oxides having semiconductor characteristics include tungsten oxide, tin oxide, indium oxide, and zinc oxide. Transistors in each of which a channel formation region is formed using such a metal oxide having semiconductor characteristics have been known (Patent Documents 1 and 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

For transistors used in a liquid crystal display device, it is preferable that change in electric characteristics (such as threshold voltage, mobility, or S value) due to deterioration over time be small and variation in electric characteristics due to deterioration over time be small. With use of transistors in which change in electric characteristics due to deterioration over time is small or transistors in which variation in electric characteristics due to deterioration over time is small, reliability of the liquid crystal display device can be improved, and quality of displayed images can be enhanced.

A mask for light exposure, which is used in a photolithography method, is generally expensive. In addition, in a photolithography method, a series of steps including formation of a photoresist, exposure, development, etching, separation, and the like is needed for one mask. Thus, as the number of masks needed for manufacturing the liquid crystal display device is increased, the number of manufacturing steps is increased, and manufacturing cost is increased.

In view of the foregoing technical background, an object of the present invention is to provide a highly reliable liquid crystal display device. Another object of the present invention is to provide a highly reliable liquid crystal display device which can be manufactured with use of a small number of masks.

Further, another object of the present invention is to provide a method for manufacturing a highly reliable liquid crystal display device with use of a small number of masks.

In an active matrix light-emitting display device including a light-emitting element such as organic light emitting diode (OLED) for transistors provided in respective pixels, it is preferable that change in electric characteristics due to deterioration over time be small and variation in electric characteristics due to deterioration over time be small. With use of transistors in which change in electric characteristics due to deterioration over time is small or transistors in which variation in electric characteristics due to deterioration over time, is small reliability of a light-emitting device can be improved, and quality of displayed images can be enhanced.

A mask for light exposure, which is used in a photolithography method, is generally expensive. In addition, in a photolithography method, a series of steps including formation of a photoresist, exposure, development, etching, separation, and the like is needed for one mask. Thus, as the number of masks needed for manufacturing the light-emitting device is increased, the number of manufacturing steps is increased, and manufacturing cost is increased.

In view of the foregoing technical background, an object of the present invention is to provide a highly reliable light-emitting device. Another object of the present invention is to provide a highly reliable light-emitting device which can be manufactured with use of a small number of masks.

Further, another object of the present invention is to provide a method for manufacturing a highly reliable light-emitting device with use of a small number of masks.

In one embodiment of the present invention, when an opening portion through which a pixel electrode is connected to a source electrode or a drain electrode is formed in an insulating film provided over the source electrode and the drain electrode, not only the insulating film but also a semiconductor film are processed to change shapes thereof. Specifically, in a method for manufacturing a liquid crystal display device according to one embodiment of the present invention, a photolithography method using a mask is used for a step in which a gate electrode is formed, a step in which an insulating film for protecting a channel formation region in a semiconductor film (hereinafter, the insulating film is referred to as a channel protective film) is formed, a step in which a source electrode and a drain electrode are formed, a step in which an opening portion is formed in an insulating film over the source electrode and drain electrode and the semiconductor film is processed to change its shape, and a step in which a pixel electrode is formed. Thus, a photolithography step which is conducted only for processing a semiconductor film to change its shape can be omitted in one embodiment of the present invention.

Further specifically, in a method for manufacturing a light-emitting device according to one embodiment of the present invention, a photolithography method using a mask is used for a step in which a gate electrode is formed, a step in which an insulating film for protecting a channel formation region in a semiconductor film is formed, a step in which a source electrode and a drain electrode are formed, a step in which an opening portion is formed in an insulating film over the source electrode and the drain electrode and the semiconductor film is processed to change its shape, a step in which a pixel electrode is formed, and a step in which an opening portion is formed in an insulating film over the pixel electrode to form a partition wall. Thus, a photolithography step which is conducted only for processing a semiconductor film to change its shape can be omitted in one embodiment of the present invention.

Note that the source and drain electrodes and a conductive film formed in the same layer as the source and drain electrodes are positioned between the semiconductor film and the insulating film provided over the source and drain electrodes. Thus, in the case where the above-described manufacturing method in which both the insulating film over the source and drain electrodes and the semiconductor film is processed to change shapes thereof with use of one mask is employed, it is difficult to process a portion of the semiconductor film, which is located below the conductive film. Further, in a situation where a plurality of conductive films overlap with the semiconductor film, by an electric field applied to the semiconductor film from the pixel electrode, a channel (parasitic channel) may be formed in the semiconductor film between the conductive films. When the parasitic channel is formed, the conductive films which should be electrically isolated are connected electrically through the semiconductor film, and accordingly deterioration in displayed images is caused.

Thus, in a liquid crystal display device or a light-emitting device according to one embodiment of the present invention, an insulating film provided over a plurality of conductive films has an opening portion which is sandwiched between the conductive films, and a portion in the semiconductor film, which overlaps with the opening portion, is removed. Therefore, the semiconductor film is divided by the opening portion into semiconductor films overlapping with the conductive films. According to the above structure, formation of a parasitic channel is suppressed, and the conductive films can be prevented from being electrically connected.

In the case where impurities are attached to a surface of the semiconductor film or a surface of the channel protective film, which is exposed by etching in a step of forming the channel protective film or a step of forming the source and drain electrodes, the amount of off-state current of the transistor easily increases or electric characteristics of the transistor easily deteriorates. In addition, a parasitic channel is easily generated in the semiconductor film, and the conductive films which should be electrically isolated are likely to be electrically connected through the semiconductor film. The above impurities concretely include an element constituting the source and drain electrodes, an element existing in a treatment chamber where etching is performed, an element contained in an etching gas or an etchant used for etching, or the like. Thus, in a method for manufacturing a liquid crystal device or a light-emitting device according to one embodiment of the present invention, a step in which impurities supposed to be attached to a surface of the semiconductor film or a surface of the channel protective film are removed is performed after etching for forming the channel protective film or etching for forming the source and drain electrodes is performed.

Specifically, a liquid crystal display device according to one embodiment of the present invention includes a gate electrode, a gate insulating film provided over the gate electrode, a semiconductor film which is over the gate insulating film and overlaps with the gate electrode, an island-shaped first insulating film which is over the semiconductor film and overlaps with the gate electrode, a first conductive film provided over the semiconductor film, a pair of second conductive films which is over the semiconductor film and between which the island-shaped first insulating film is sandwiched, a second insulating film provided over the semiconductor film, the island-shaped first insulating film, the first conductive film, and the pair of second conductive films, and a pixel electrode which is provided over the second insulating film and electrically connected to one of the pair of second conductive films through a first opening portion formed in the second insulating film. In the second insulating film and the semiconductor film, a second opening portion is formed at a portion between the first conductive film and the one of the pair of second conductive films or the other of the pair of second conductive films.

Specifically, a method for manufacturing a liquid crystal display device according to one embodiment of the present invention includes the steps of: forming a semiconductor film over a gate insulating film so as to overlap with a gate electrode; forming an island-shaped first insulating film over the semiconductor film by a photolithography method so as to overlap with the gate electrode; forming a first conductive film and a pair of second conductive films between which the island-shaped first insulating film is sandwiched over the semiconductor film by a photolithography method; forming a second insulating film over the semiconductor film, the island-shaped first insulating film, the first conductive film, and the pair of second conductive films; forming a first opening portion in which one of the pair of second conductive films is partly exposed and a second opening portion which is in the second insulating film and the semiconductor film and positioned between the first conductive film and the one of the pair of second conductive films or the other of the pair of second conductive films, by a photolithography method; and forming a pixel electrode which is over the second insulating film and electrically connected to the one of the pair of second conductive films through the first opening portion, by a photolithography method.

Specifically, a light-emitting device according to one embodiment of the present invention includes a gate electrode, a gate insulating film provided over the gate electrode, a semiconductor film which is over the gate insulating film and overlaps with the gate electrode, an island-shaped first insulating film which is over the semiconductor film and overlaps with the gate electrode, a first conductive film over the semiconductor film, a pair of second conductive films which is over the semiconductor film and between which the island-shaped first insulating film is sandwiched, a second insulating film provided over the semiconductor film, the island-shaped first insulating film, the first conductive film, and the pair of second conductive films, a pixel electrode which is provided over the second insulating film and electrically connected to one of the pair of second conductive films through a first opening portion formed in the second insulating film, and a third insulating film over the pixel electrode. In the second insulating film and the semiconductor film, a second opening portion is provided at a portion between the first conductive film and the one of the pair of second conductive films or the other of the pair of second conductive films. In the third insulating film, a third opening portion is provided to partly expose the pixel electrode.

Specifically, a method for manufacturing a light-emitting device according to one embodiment of the present invention includes the steps of: forming a semiconductor film over a gate insulating film so as to overlap with a gate electrode; forming an island-shaped first insulating film over the semiconductor film by a photolithography method so as to overlap with the gate electrode; over the semiconductor film, forming a first conductive film and a pair of second conductive films between which the island-shaped first insulating film is sandwiched by a photolithography method; forming a second insulating film over the semiconductor film, the island-shaped first insulating film, the first conductive film, and the pair of second conductive films; by a photolithography method, forming a first opening portion in which one of the pair of second conductive films is partly exposed and a second opening portion which is in the second insulating film and the semiconductor film and positioned between the first conductive film and the one of the pair of second conductive films or the other of the pair of second conductive films; by a photolithography method, forming a pixel electrode which is over the second insulating film and electrically connected to the one of the pair of second conductive films through the first opening portion; and by a photolithography method, forming a third insulating film which is over the pixel electrode and has an opening portion in a portion overlapping with the pixel electrode.

According to one embodiment of the present invention, a highly reliable liquid crystal display device can be provided. Further, according to one embodiment of the present invention, a highly reliable liquid crystal display device manufactured with use of a small number of masks can be provided.

Further, by a method for manufacturing a liquid crystal display device according to one embodiment of the present invention, a highly reliable liquid crystal display device can be manufactured with use of a small number of masks.

According to one embodiment of the present invention, a highly reliable light-emitting device can be provided. Further, according to one embodiment of the present invention, a highly reliable light-emitting device manufactured with use of a small number of masks can be provided.

Further, by a method for manufacturing a light-emitting device according to one embodiment of the present invention, a highly reliable light-emitting device can be manufactured with a small number of masks.

BRIEF DESCRIPTION OF THE DRAWINGS

FIG. 2 illustrates a structure of a liquid crystal display device.

FIGS. 6A and 6B are cross-sectional views of a liquid crystal display device.

FIG. 31 is a cross-sectional view of a pixel.

FIGS. 32A and 32B illustrate a structure of a panel.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that in this specification, the category of a liquid crystal display device includes a panel in which liquid crystal elements are formed in respective pixels, and a module in which an IC or the like including a driver circuit or a controller is mounted on the panel. Further, a liquid crystal display device according to one embodiment of the present invention includes, in its category, an element substrate corresponding to one mode before a liquid crystal element is completed in a manufacturing process of the liquid crystal display device. In the element substrate, each of a plurality of pixels is provided with a transistor, and a pixel electrode to which voltage is applied through the transistor.

Note that in this specification, a light-emitting device includes, in its category, a panel in which light-emitting elements are formed in respective pixels and a module in which an IC or the like including a driver circuit or a controller is mounted on the panel. Further, a light-emitting device according to one embodiment of the present invention includes, in its category, an element substrate corresponding to one mode before a light-emitting element is completed in a manufacturing process of the light-emitting device. In the element substrate, each of a plurality of pixels is provided with a transistor, and a pixel electrode to which voltage is applied through the transistor.

Embodiment 1

Figure 1A:
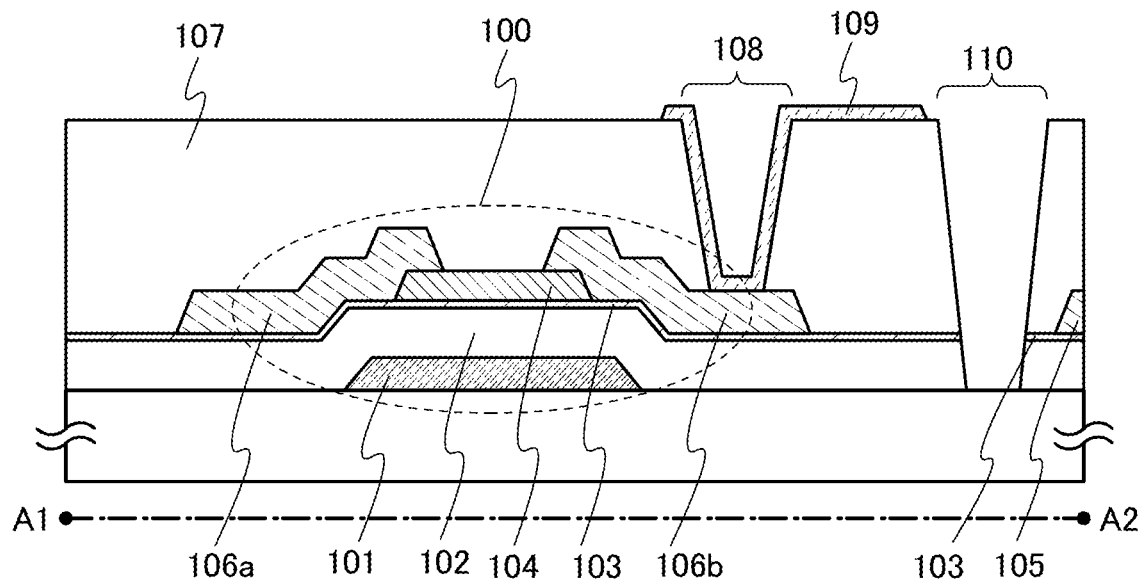
FIGS. 1A and 1B illustrate a structure of a liquid crystal display device.
Figure 1B:
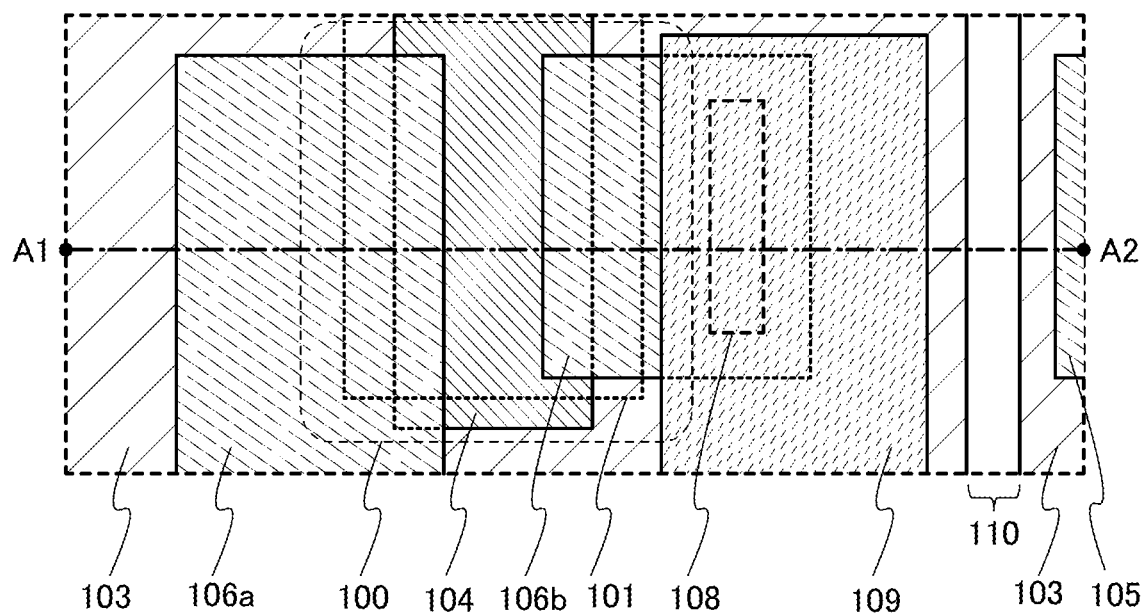

FIGS. 1A and 1B illustrate a structure of a liquid crystal display device according to one embodiment of the present invention. FIG. 1A is an example of a cross-sectional view in the channel length direction of a transistor 100 included in a pixel.

FIG. 1A illustrates the following components: a gate electrode 101 over an insulating surface; a gate insulating film 102 provided over the gate electrode 101; a semiconductor film 103 which is provided over the gate insulating film 102 and overlaps with the gate electrode 101; an island-shaped insulating film 104 which is provided over the semiconductor film 103 and overlaps with the gate electrode 101; a conductive film 105 provided over the semiconductor film 103; a conductive film 106a and a conductive film 106b which are provided over the semiconductor film 103 and between which the insulating film 104 is sandwiched; an insulating film 107 provided over the semiconductor film 103, the insulating film 104, the conductive film 105, the conductive film 106a, and the conductive film 106b; a pixel electrode 109 which is provided over the insulating film 107 and connected to the conductive film 106b through an opening portion 108 formed in the insulating film 107; and an opening portion 110 formed in the insulating film 107 and the semiconductor film 103.

Further, in FIG. 1A, the transistor 100 includes the gate electrode 101, the gate insulating film 102, the semiconductor film 103, the insulating film 104 functioning as a channel protective film, the conductive film 106a and the conductive film 106b. One of the conductive film 106a and the conductive film 106b functions as a source electrode, and the other functions as a drain electrode.

In a method for manufacturing a liquid crystal display device according to one embodiment of the present invention, a photolithography method with use of a mask is used for the following steps: a step in which the gate electrode 101 is formed; a step in which the insulating film 104 is formed; a step in which the conductive film 105, the conductive film 106a, and the conductive film 106b are formed; a step in which the opening portion 108 is formed in the insulating film 107 and the opening portion 110 is formed in the insulating film 107 and the semiconductor film 103; and a step in which the pixel electrode 109 is formed. In other words, according to one embodiment of the present invention, an independent photolithography step only for processing the semiconductor film 103 to change its shape can be omitted because the semiconductor film 103 is shaped in the step of forming the opening portion 110 in the insulating film 107. Thus, part of a series of steps performed in a photolithography method (steps of formation of a photoresist, exposure, development, etching, separation, and the like) can be skipped in manufacture of the liquid crystal display device according to one embodiment of the present invention. As a result, the number of light-exposure masks which are expensive can be small, and cost for manufacturing liquid crystal display devices can be accordingly reduced.

Note that the conductive film 105, the conductive film 106a, and the conductive film 106b are positioned between the insulating film 107 and the semiconductor film 103. Thus, in the case where the semiconductor film 103 is processed to change its shape in the step of forming the opening portion 108 in the insulating film 107, it is difficult to process portions of the semiconductor film 103, which are positioned below the conductive film 105, the conductive film 106a, and the conductive film 106b. In addition, when the semiconductor film 103 overlaps with the conductive film 105, the conductive film 106a, and the conductive film 106b, a parasitic channel may be formed in the semiconductor film 103 by an electric field applied from the pixel electrode 109 to the semiconductor film 103. When a parasitic channel is formed, the conductive film 105 is electrically connected to the conductive film 106a or the conductive film 106b through the semiconductor film 103 though they should be electrically isolated; thus, deterioration in displayed images is caused.

Thus, in a liquid crystal display device according to one embodiment of the present invention, a position of the opening portion 110 is set between the conductive film 105 and the conductive film 106a or 106b, and the semiconductor film 103 is partly removed. Note that FIG. 1A illustrates a case where in the opening portion 110, the gate insulating film 102 is removed as well as the semiconductor film 103 and the insulating film 107. In one embodiment of the present invention, the gate insulating film 102 is not necessarily removed in the opening portion 110. In the opening portion 110, the gate insulating film 102 may be left.

FIG. 1B shows an example of a top view of the liquid crystal display device having the cross-sectional structure illustrated in FIG. 1A. Note that in the top view illustrated in FIG. 1B, the gate insulating film 102 and the insulating film 107 are not illustrated for a simple layout of the liquid crystal display device. A cross-sectional view along dashed-dotted line A1-A2 in FIG. 1B corresponds to FIG. 1A.

As illustrated in FIGS. 1A and 1B, in one embodiment of the present invention, the opening portion 110 is provided in the semiconductor film 103 and the insulating film 107 to be positioned between the conductive film 105 and the conductive film 106a or 106b.

In one embodiment of the present invention, as illustrated in FIGS. 1A and 1B, the semiconductor film 103 is divided by the opening portion 110 into the semiconductor film 103 positioned below the conductive film 106a or 106b and the semiconductor film 103 positioned below the conductive film 105. Thus, in one embodiment of the present invention, even when an electric field is applied from the pixel electrode 109 or the like to the semiconductor film 103, formation of a parasitic channel in the semiconductor film 103 can be suppressed by the opening portion 110 which is positioned between the conductive film 105 and the conductive film 106a or 106b. Furthermore, when formation of a parasitic channel is suppressed, unintentional electrical connection between the conductive film 105 and the conductive film 106a or 106b can be prevented; accordingly, deterioration in images displayed on the liquid crystal display device can be prevented.

Note that FIG. 1B illustrates a case where the semiconductor film 103 positioned below the conductive film 106a or 106b and the semiconductor film 103 positioned below the conductive film 105 are definitely separated. However, in one embodiment of the present invention, the semiconductor film 103 is not necessarily divided definitely. The semiconductor film 103 positioned between the conductive film 105 and the conductive film 106a or 106b may be partly divided.

FIG. 2 shows an example of a top view of the liquid crystal display device having the cross-sectional structure illustrated in FIG. 1A. Note that in the top view of FIG. 2, the gate insulating film 102 and the insulating film 107 are not illustrated for a simple layout of the liquid crystal display device.

In the liquid crystal display device illustrated in FIG. 2, the shape of the opening portion 110 is different from that in FIG. 1B. In FIG. 2, although the opening portion 110 is positioned between the conductive film 105 and the conductive film 106a or 106b as in the case of FIG. 1B, in a region other than the opening portion 110, the semiconductor film 103 positioned below the conductive film 106a or 106b is connected to the semiconductor film 103 positioned below the conductive film 105. In other words, in FIG. 2, the semiconductor film 103 positioned between the conductive film 105 and the conductive film 106a or 106b is partly divided. Even in the state where the semiconductor film 103 is partly divided, an effect of suppression of generation of a parasitic channel can be obtained.

Further, part of a region where the opening portion 110 is formed may overlap with the conductive film 106a or the conductive film 106b. Alternatively, part of a region where the opening portion 110 is formed may overlap with the conductive film 105.

Figure 3A:
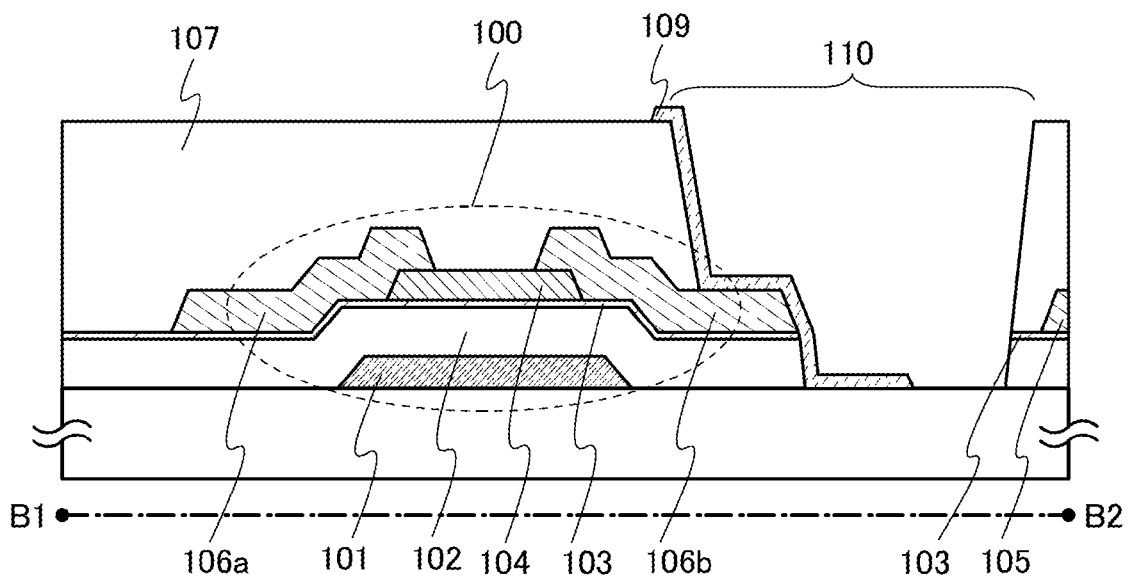
FIGS. 3A and 3B illustrate a structure of a liquid crystal display device.
Figure 3B:
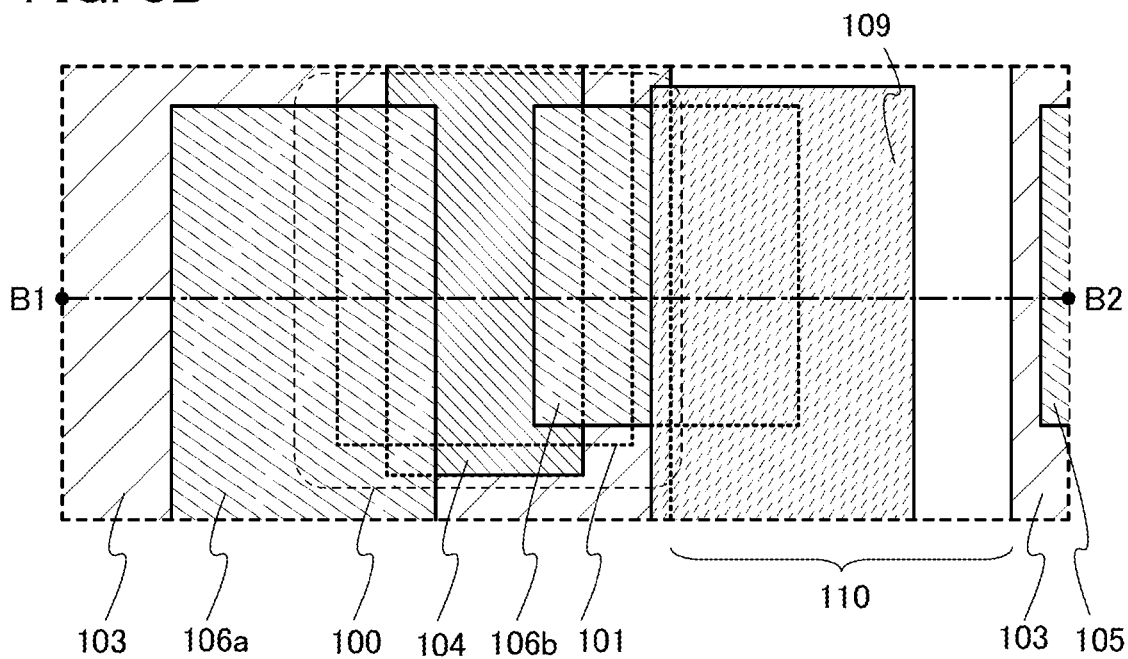

FIG. 3A shows an example of a cross-sectional view in the channel length direction of the transistor 100 included in a pixel. FIG. 3B shows an example of a top view of a liquid crystal display device having a cross-sectional structure illustrated in FIG. 3A. Note that in the top view of FIG. 3B, the gate insulating film 102 and the insulating film 107 are not illustrated for a simple layout of the liquid crystal display device. A cross-sectional view along dashed-dotted line B1-B2 in FIG. 3B corresponds to FIG. 3A.

A region where the opening portion 110 is formed in the liquid crystal display device illustrated in FIGS. 3A and 3B is different from that in FIGS. 1A and 1B. In FIGS. 3A and 3B, part of the region where the opening portion 110 is formed overlaps with the conductive film 106b. The semiconductor film 103 positioned below the conductive film 106b is not removed in formation of the opening portion 110. Thus, in the region where the opening portion 110 is formed, the semiconductor film 103 is partly left, and in the opening portion 110, an end portion of the semiconductor film 103 and an end portion of the insulating film 107 are not aligned with each other.

In one embodiment of the present invention, as illustrated in FIGS. 3A and 3B, even when part of the region where the opening portion 110 is formed overlaps with a region where the conductive film 106b is formed, the semiconductor film 103 positioned below the conductive film 106b can be separated from the semiconductor film 103 positioned below the conductive film 105. As a result, an effect of suppression of generation of a parasitic channel can be obtained.

Note that also in the case where part of the region where the opening portion 110 is formed overlaps with a region where the conductive film 106a is formed, an effect of suppression of generation of a parasitic channel can be obtained. Alternatively, also in the case where part of the region where the opening portion 110 is formed overlaps with a region where the conductive film 105 is formed, an effect of suppression of generation of a parasitic channel can be obtained.

Further, in the case where the region where the opening portion 110 is formed partly overlaps with the region where the conductive film 106b is formed, it is not necessary to form the opening portion 108 for connecting the conductive film 106b and the pixel electrode 109. Thus, a region where the opening portion 108 is formed does not need to be ensured; accordingly, high definition of a pixel portion can be achieved.

Figure 4A:
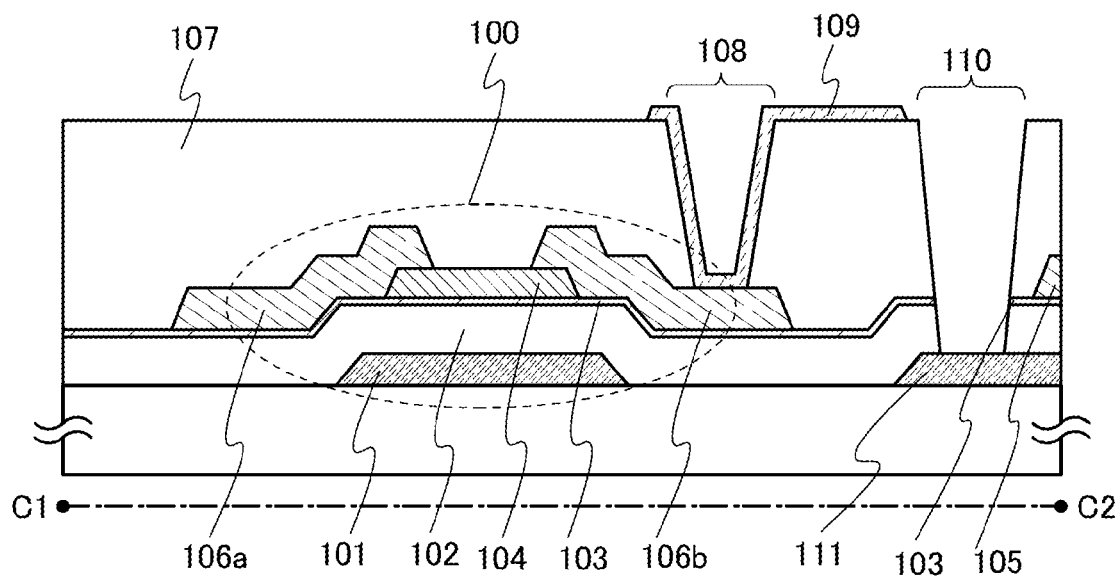
FIGS. 4A and 4B illustrate a structure of a liquid crystal display device.
Figure 4B:
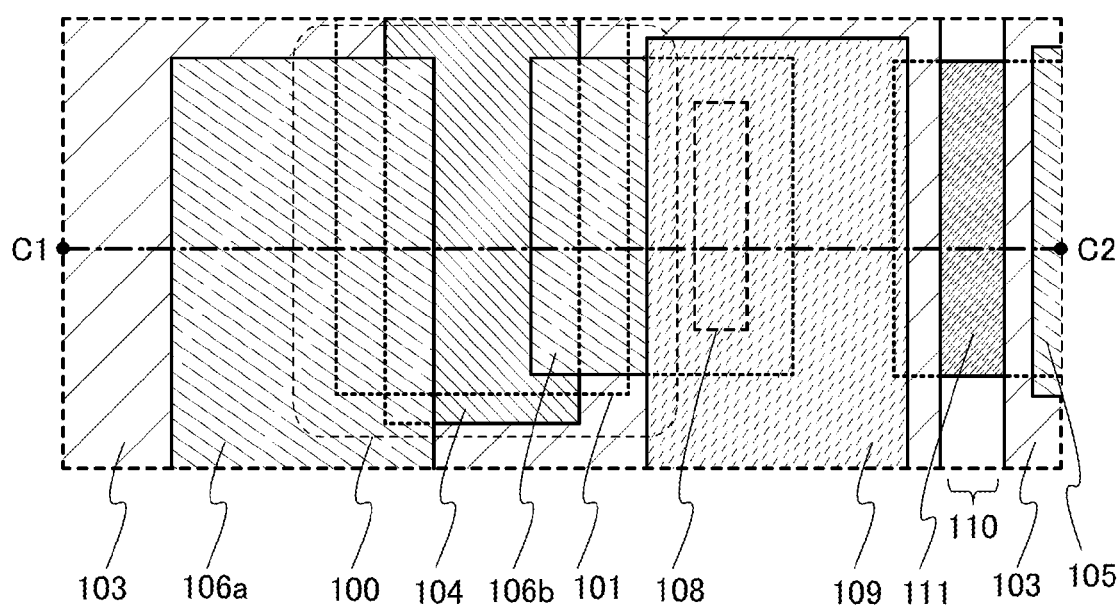

FIG. 4A shows an example of a cross-sectional view in the channel length direction of the transistor 100 included in a pixel. FIG. 4B shows an example of a top view of a liquid crystal display device having a cross-sectional structure illustrated in FIG. 4A. Note that in the top view of FIG. 4B, the gate insulating film 102 and the insulating film 107 are not illustrated for a simple layout of the liquid crystal display device. A cross-sectional view along dashed-dotted line C1-C2 in FIG. 4B corresponds to FIG. 4A.

In the liquid crystal display device illustrated in FIGS. 4A and 4B, a conductive film 111 is formed in the same layer as the gate electrode 101, which is different from the structure of the liquid crystal display device illustrated in FIGS. 1A and 1B. Specifically, in FIGS. 4A and 4B, the conductive film 111 is provided over the insulating surface, the gate insulating film 102 and the semiconductor film 103 are stacked in this order over the conductive film 111, and the conductive film 105 is provided over the semiconductor film 103 to overlap with the conductive film 111.

In addition, in FIGS. 4A and 4B, a region where the opening portion 110 is formed partly overlaps with the region where the conductive film 111 is formed, whereby part of the conductive film 111 is exposed in the opening portion 110. Further, since the conductive film 111 is positioned below the semiconductor film 103, the semiconductor film 103 is partly removed in the opening portion 110. Thus, also in the case of FIGS. 4A and 4B, the semiconductor film 103 positioned below the conductive film 106a or 106b is separated from the semiconductor film 103 positioned below the conductive film 105; accordingly, an effect of suppression of generation of a parasitic channel can be obtained.

Note that in the liquid crystal display device according to one embodiment of the present invention, the semiconductor film 103 included in the transistor 100 contains a wide-gap semiconductor such as an oxide semiconductor.

An oxide semiconductor preferably contains at least indium (In) or zinc (Zn). The oxide semiconductor preferably contains, in addition to In and Zn, gallium (Ga) serving as a stabilizer that reduces variations in electric characteristics among transistors using the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor for the semiconductor film 103, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn, and there is no limitation on the composition ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that the amount of off-state current can be sufficiently reduced. Further, the In—Ga—Zn-based oxide has high mobility.

For example, an In—Ga—Zn-based oxide with an atomic ratio where In:Ga:Zn=1:1:1 (=1/3:1/3:1/3) or In:Ga:Zn=2:2:1 (=2/5:2/5:1/5), or an oxide with an atomic ratio close to the above atomic ratio can be used. Alternatively, an In—Sn—Zn-based oxide with an atomic ratio where In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratio may be used.

For example, relatively high mobility can be obtained easily in the case of using an In—Sn—Zn-based oxide. However, mobility can be increased by reducing the defect density in a bulk also in the case of using an In—Ga—Zn-based oxide.

Note that a highly purified oxide semiconductor obtained by a reduction of impurities such as moisture or hydrogen which serves as an electron donor (donor) and by a reduction of oxygen vacancies is an intrinsic (i-type) semiconductor or a substantially i-type semiconductor. Therefore, a transistor including the oxide semiconductor has an extremely small amount of off-state current. Furthermore, the band gap of the oxide semiconductor is 2 eV or more, preferably 2.5 eV or more, further preferably 3 eV or more. With use of an oxide semiconductor film which is highly purified by a sufficient decrease in the concentration of impurities such as moisture and hydrogen and a reduction of oxygen vacancies, the off-state current of a transistor can be decreased.

Specifically, various experiments can prove low off-state current of a transistor in which a purified oxide semiconductor is used for a semiconductor film. For example, even with an element with a channel width of $1 \times 10^6$ µm and a channel length of 10 µm, in a range of from 1 V to 10 V of voltage (drain voltage) between a source terminal and a drain terminal, the off-state current can be lower than or equal to the measurement limit of a semiconductor parameter analyzer, that is, lower than or equal to $1 \times 10^{-13}$ A. In this case, it can be seen that the off-state current corresponding to a value obtained by dividing the off-state current by the channel width of the transistor is 100 zA/µm or lower. In addition, a capacitor and a transistor are connected to each other and the off-state current is measured with a circuit in which charge flowing into or from the capacitor is controlled by the transistor. In the measurement, a purified oxide semiconductor film has been used for a channel formation region of the transistor, and the off-state current of the transistor has been measured from a change in the amount of charge of the capacitor per unit time. As a result, it can be seen that, in the case where the voltage between the source terminal and the drain terminal of the transistor is 3 V, a lower off-state current of several tens of yoctoamperes per micrometer (yA/µm) is obtained. Consequently, the transistor whose channel formation region is formed in a highly purified oxide semiconductor film has much lower off-state current than a transistor including crystalline silicon.

Unless otherwise specified, in the case of an n-channel transistor, the off-state current in this specification is a current which flows between a source terminal and a drain terminal when, in the state where the potential of the drain terminal is higher than that of the source terminal and that of a gate electrode, the potential of the gate electrode is lower than or equal to zero with respect to the potential of the source terminal. Alternatively, in this specification, in the case of a p-channel transistor, the off-state current is a current which flows between a source terminal and a drain terminal when, in the state where the potential of the drain terminal is lower than that of the source terminal and that of a gate electrode, the potential of the gate electrode is higher than or equal to zero with respect to the potential of the source terminal.

In addition, a "source terminal" of a transistor means a source region that is a part of an active layer or a source electrode connected to an active layer. Similarly, a "drain terminal" of a transistor means a drain region that is a part of an active layer or a drain electrode connected to an active layer.

An oxide semiconductor film is in a single crystal state, a polycrystalline (also referred to as polycrystal) state, an amorphous state, or the like. Preferably, a CAAC-OS (c-axis aligned crystalline oxide semiconductor) film can be used as the oxide semiconductor film.

The CAAC-OS film is not completely single crystal or completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Embodiment 2

Next, an example of a specific structure of a pixel portion of a liquid crystal display device according to one embodiment in the present invention will be described.

Figure 8A:
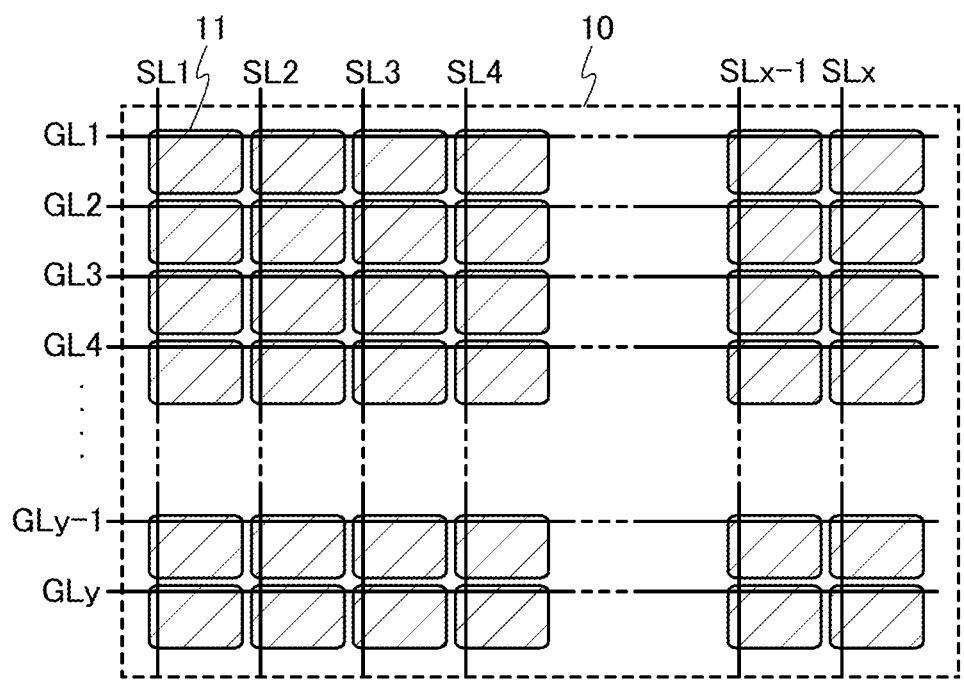
FIG. 8A illustrates a structure of a pixel portion of a liquid crystal display device.

FIG. 8A illustrates a structure example of a pixel portion 10. In FIG. 8A, y scan lines GL (GL1 to GLy) whose potentials are controlled by a scan line driver circuit and x signal lines SL (SL1 to SLx) whose potentials are controlled by a signal line driver circuit are provided in the pixel portion 10.

The scan lines GL are connected to a plurality of pixels 11. Specifically, each scan line GL is connected to x pixels 11 in a given row, among the plurality of pixels 11 arranged in matrix.

Each signal line SL is connected to y pixels 11 in a given column, among the plurality of pixels 11 arranged in matrix of x columns and y rows in the pixel portion 10.

Note that the term "connection" in this specification refers to electrical connection and corresponds to the state in which current, potential, or voltage can be supplied or transmitted. Accordingly, a connection state means not only a state of a direct connection but also a state of indirect connection through a circuit element such as a wiring, a resistor, a diode, or a transistor so that current, potential, or voltage can be supplied or transmitted.

Note that even when independent components are illustrated in a circuit diagram so that they are connected to each other, in practice, one conductive film may have functions of a plurality of components, such as the case where part of a wiring also functions as an electrode. The term "connection" also means such a case where one conductive film has functions of a plurality of components.

Figure 8B:
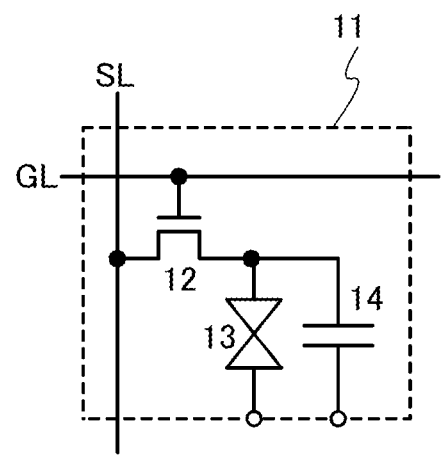
FIG. 8B is circuit diagram of a pixel.

FIG. 8B shows an example of a circuit diagram of the pixel 11. The pixel 11 shown in FIG. 8B includes a transistor 12 functioning as a switching element, a liquid crystal element 13 whose transmittivity is controlled in accordance with the potential of an image signal supplied through the transistor 12, and a capacitor 14.

The liquid crystal element 13 includes the pixel electrode, the common electrode, and a liquid crystal layer having liquid crystal to which a voltage between the pixel electrode and the common electrode is applied. The capacitor 14 has a function of holding the voltage between the pixel electrode and the common electrode included in the liquid crystal element 13.

The liquid crystal layer can be formed using a liquid crystal material categorized by a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

Alternatively, liquid crystal exhibiting a blue phase for which an alignment film is unnecessary may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral agent or an ultraviolet curable resin is added so that the temperature range is improved. The liquid crystal composition which includes a liquid crystal exhibiting a blue phase and a chiral agent is preferable because it has a small response time of less than or equal to 1 msec, and has optical isotropy which makes the alignment process unneeded and viewing angle dependence small.

Moreover, the following methods can be used for driving the liquid crystal, for example: a TN (twisted nematic) mode, an STN (super twisted nematic) mode, a VA (vertical alignment) mode, an MVA (multi-domain vertical alignment) mode, an IPS (in-plane-switching) mode, an OCB (optically compensated birefringence) mode, an FFS (fringe field switching) mode, a blue phase mode, a TBA (transverse bend alignment) mode, a VA-IPS mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, and a guest-host mode.

Note that the pixel 11 may further include another circuit element such as a transistor, a diode, a resistor, a capacitor, or an inductor as needed.

Specifically, in FIG. 8B, a gate electrode of the transistor 12 is connected to the scan line GL. One of a source terminal and a drain terminal of the transistor 12 is connected to the signal line SL, and the other is connected to the pixel electrode of the liquid crystal element 13. One electrode of the capacitor 14 is connected to the pixel electrode of the liquid crystal element 13, and the other electrode is connected to a node supplied with a specific potential. Note that a specific potential is also supplied to the common electrode of the liquid crystal element 13. The potential supplied to the common electrode may be in common with the potential supplied to the other electrode of the capacitor 14.

Although FIG. 8B shows the case where one transistor 12 is used as a switching element in the pixel 11, the present invention is not limited to this structure. A plurality of transistors may be used as switching elements. In the case where a plurality of transistors functions as switching elements, the plurality of transistors may be connected to each other in parallel, in series, or in combination of parallel connection and series connection.

Note that in this specification, the state where the transistors are connected to each other in series means a state where only one of a source terminal and a drain terminal of a first transistor is connected to only one of a source terminal and a drain terminal of a second transistor. In addition, the state in which transistors are connected to each other in parallel means the state in which one of a source terminal and a drain terminal of a first transistor is connected to one of a source terminal and a drain terminal of a second transistor and the other of the source terminal and the drain terminal of the first transistor is connected to the other of the source terminal and the drain terminal of the second transistor.

When a channel formation region of the transistor 12 includes an oxide semiconductor, the amount of off-state current of the transistor 12 can be extremely small and the withstand voltage thereof can be high. Further, when the transistor 12 having the above-described structure is used as a switching element, leakage of charge accumulated in the liquid crystal element 13 can be prevented effectively as compared to the case of using a transistor including a normal semiconductor material such as silicon or germanium.

The transistor 12 with an extremely small amount of off-state current is used, whereby a period in which a voltage supplied to the liquid crystal element 13 is held can be prolonged. Accordingly, for example, in the case where image signals having the same image data are written to the pixel portion 10 for some consecutive frame periods, like in the case of a still image, a displayed image can be maintained even when driving frequency is low, in other words, the number of writings of image signals to the pixel portion 10 in a certain period is reduced. For example, the transistor 12 in which a highly purified oxide semiconductor is used for an active layer is employed, whereby an interval between writings of image signals can be increased to 10 seconds or more, preferably 30 seconds or more, more preferably 1 minute or more. As the interval between writings of image signals is made longer, power consumption can be further reduced.

In addition, since the potential of an image signal can be held for a longer period, deterioration in a displayed image can be prevented even when the capacitor 14 for holding the potential of an image signal is not connected to the liquid crystal element 13. Thus, it is possible to increase the aperture ratio by reducing the size of the capacitor 14 or by omitting the capacitor 14, which leads to reduction in power consumption of the liquid crystal display device.

In addition, by inversion driving in which the polarity of the potential of an image signal is inverted with respect to the potential of the common electrode, deterioration of a liquid crystal called burn-in can be prevented. However, in the inversion driving, change in the potential supplied to the signal line SL is increased at the time of changing the polarity of the image signal; thus, a potential difference between a source terminal and a drain terminal of the transistor 12 which functions as a switching element is increased. Accordingly, deterioration in characteristics such as a shift in threshold voltage is easily caused in the transistor 12. Furthermore, in order to maintain the voltage held in the liquid crystal element 13, the off-state current needs to be low even when the potential difference between the source terminal and the drain terminal is large. A semiconductor whose band gap is larger than that of silicon or germanium and whose intrinsic carrier density is lower than that of silicon or germanium, such as an oxide semiconductor, is used for the transistor 12; therefore, the resistance of the transistor 12 can be increased and the amount of off-state current can be considerably small. Therefore, as compared to the case of using a transistor including a normal semiconductor material such as silicon or germanium, deterioration in the transistor 12 can be prevented and the voltage held in the liquid crystal element 13 can be maintained.

Figure 5:
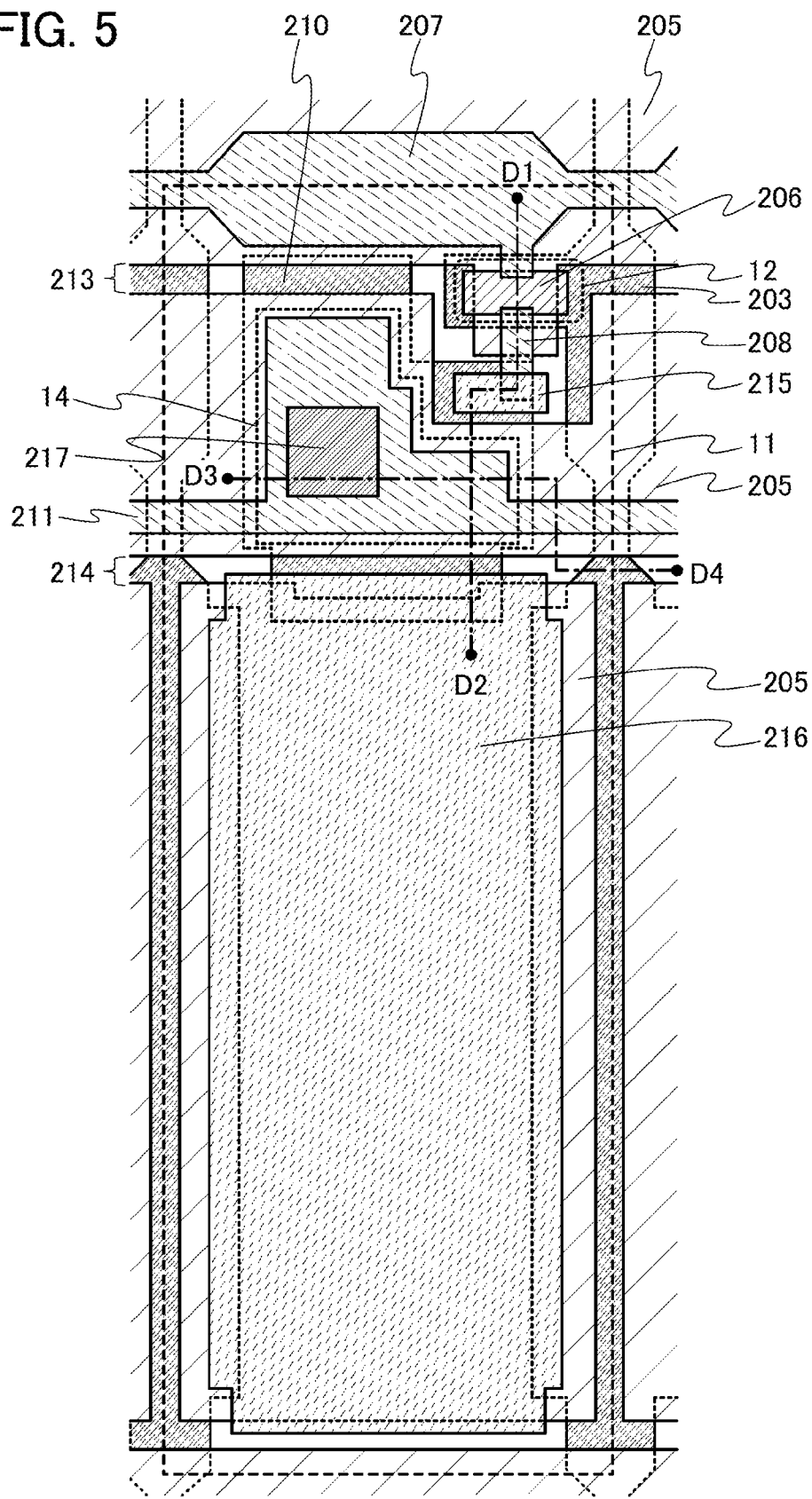
FIG. 5 is a top view of a pixel of a liquid crystal display device.

Next, the layout of the pixel 11 shown in FIG. 8B is described with reference to FIG. 5 and FIGS. 6A and 6B. FIG. 5 is an example of a top view of the pixel 11. FIG. 6A corresponds to an example of a cross-sectional view taken along dashed-dotted line D1-D2 of the top view in FIG. 5. FIG. 6B corresponds to an example of a cross-sectional view taken along dashed-dotted line D3-D4 of the top view in FIG. 5. Note that in order to clearly show the layout of the pixel 11, some insulating films are not illustrated in the top view of the pixel 11 in FIG. 5. In addition, in order to clearly show the layout of various semiconductor elements included in the pixel 11, the liquid crystal layer and the common electrode of the liquid crystal element 13 are not illustrated in the top view of the pixel 11 in FIG. 5.

In the pixel 11 illustrated in FIG. 5 and FIGS. 6A and 6B, the transistor 12 includes over a substrate 202 having an insulating surface, a conductive film 203 functioning as a gate electrode, a gate insulating film 204 provided over the conductive film 203, a semiconductor film 205 provided over the gate insulating film 204 to overlap with the conductive film 203, an insulating film 206 which functions as a channel protective film and is provided over the semiconductor film 205 to overlap with the conductive film 203, and a conductive film 207 and a conductive film 208 which function as a source terminal and a drain terminal and are provided over the semiconductor film 205.

The conductive film 203 also serves as a scan line supplying a potential to the gate electrode of the transistor 12. The conductive film 207 also serves as a signal line supplying a potential of an image signal to the pixel 11.

The capacitor 14 includes, over the substrate 202 having an insulating surface, a conductive film 210, the gate insulating film 204 and the semiconductor film 205 over the conductive film 210, and a conductive film 211 provided over the gate insulating film 204 and the semiconductor film 205 to overlap with the conductive film 210.

Further, an insulating film 212 is provided over the conductive film 207, the conductive film 208, and the conductive film 211. Furthermore, in the insulating film 212, the semiconductor film 205, and the gate insulating film 204, an opening portion 213 and an opening portion 214 are provided.

The opening portion 213 is positioned between the conductive film 207 or 208 and the conductive film 211. Part of a region where the opening portion 213 is formed overlaps with part of a region where the conductive film 208 is formed and part of a region where the conductive film 210 is formed. In the opening portion 213, the insulating film 212 which is over the conductive film 208 is removed, and in addition, the insulating film 212, the semiconductor film 205, and the gate insulating film 204 which are over the conductive film 210 are removed. In the opening portion 213, the conductive film 208 and the conductive film 210 are electrically connected through a conductive film 215 provided over the conductive film 208 and the conductive film 210.

In the opening portion 214, the insulating film 212, the semiconductor film 205, and the gate insulating film 204 which are over the conductive film 210 are removed, and the conductive film 210 is connected to a conductive film 216 functioning as a pixel electrode. The conductive film 216 is provided not only over the conductive film 210 in the opening portion 214 but also over the insulating film 212.

In addition, in the opening portion 214, the insulating film 212, the semiconductor film 205, and the gate insulating film 204 which are over the conductive film 203 are also removed. With the above structure, parasitic capacitance generated in a region where the conductive film 203, the gate insulating film 204, and the semiconductor film 205 overlap with each other can be made small.

Further, an insulating film 217 functioning as a spacer is provided over the insulating film 212 to overlap with the conductive film 211.

Note that FIG. 5 and FIGS. 6A and 6B illustrate the case where part of the region where the opening portion 213 is formed overlaps with part of the region where the conductive film 208 is formed and part of the region where the conductive film 210 is formed. In this case, both connection between the conductive film 208 and the conductive film 215 and connection between the conductive film 210 and the conductive film 215 are made in the opening portion 213. However, in one embodiment of the present invention, the connection between the conductive film 208 and the conductive film 215 and the connection between the conductive film 210 and the conductive film 215 may be made in different opening portions.

Figure 7:
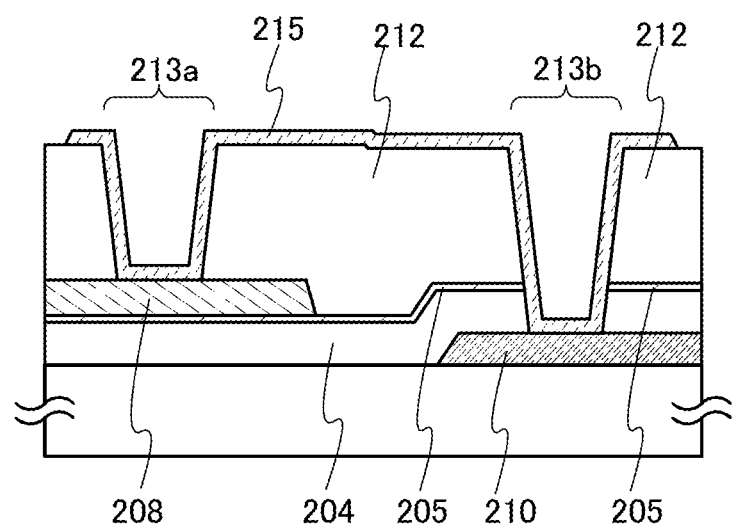
FIG. 7 illustrates a structure of a liquid crystal display device.

FIG. 7 is an example of a cross-sectional view of the pixel 11 in a connection portion between the conductive film 208 and the conductive film 215 and a connection portion between the conductive film 210 and the conductive film 215. In FIG. 7, the conductive film 208 and the conductive film 215 are connected in an opening portion 213a provided in the insulating film 212. In addition, the conductive film 210 and the conductive film 215 are connected in an opening portion 213b provided in the insulating film 212, the semiconductor film 205, and the gate insulating film 204.

Note that when both the connection between the conductive film 208 and the conductive film 215 and the connection between the conductive film 210 and the conductive film 215 are made in the opening portion 213 as illustrated in FIG. 5 and FIGS. 6A and 6B, it is not necessary to ensure regions for a plurality of opening portions; thus, high definition of the pixel portion 10 can be achieved.

FIG. 5 and FIGS. 6A and 6B illustrate a layout of the pixel 11 in which a liquid crystal layer and a common electrode are provided in this order over the conductive film 216 functioning as a pixel electrode; however, a liquid crystal display device according to one embodiment of the present invention is not limited to this structure. The pixel 11 may have a structure in which a liquid crystal layer is provided over a pixel electrode and a common electrode as in an IPS liquid crystal element or a liquid crystal element exhibiting a blue phase.

This embodiment can be implemented in appropriate combination with any of the other embodiments.

Embodiment 3

In this embodiment, a method for manufacturing a liquid crystal display device according to one embodiment of the present invention will be described, with use of the pixel 11 illustrated in FIG. 5 and FIGS. 6A and 6B as an example.

Figure 9A:
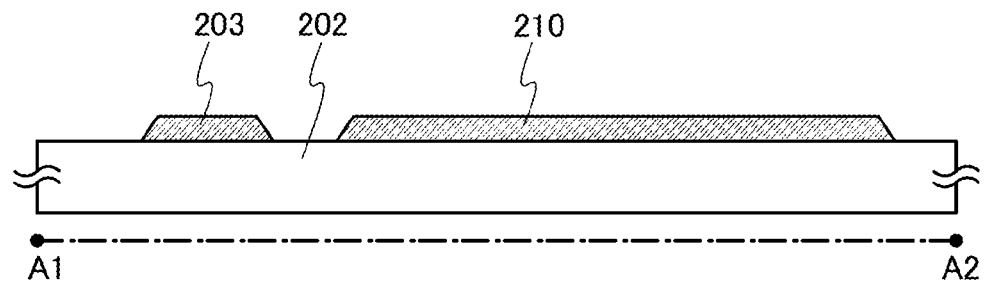
FIGS. 9A to 9D illustrate a method for manufacturing a liquid crystal display device.

First, as illustrated in FIG. 9A, over the substrate 202 having an insulating surface, the conductive film 203 functioning as a gate electrode and the conductive film 210 functioning as an electrode of the capacitor 14 are formed.

Although there is no particular limitation on a substrate that can be used as the substrate 202 having an insulating surface, the substrate needs to have heat resistance high enough to withstand at least heat treatment to be performed later. For example, a glass substrate manufactured by a fusion process or a float process can be used. In addition, when the temperature of the heat treatment performed later is high, a glass substrate having a strain point of 730° C. or higher is preferably used. As a glass substrate, a glass material such as aluminosilicate glass, aluminoborosilicate glass, or barium borosilicate glass is used, for example.

Note that as the above glass substrate, a substrate formed using an insulator, such as a ceramic substrate, a quartz substrate, or a sapphire substrate may be used. Alternatively, crystallized glass or the like may be used. Alternatively, metal substrates of a stainless alloy and the like with the surface provided with an insulating film may be employed. Note that in the case where the liquid crystal display device is a transmissive or transflective liquid crystal display device, a light-transmitting substrate is used as the substrate 202.

The conductive film 203 and the conductive film 210 can be formed to have a single layer or a stacked layer using a conductive film including a metal material such as molybdenum, titanium, chromium, tantalum, tungsten, aluminum, copper, neodymium, scandium, or niobium, an alloy material which contains any of these metal materials as a main component, or a nitride of any of these metals. Note that aluminum or copper can also be used as such a metal material if it can withstand the temperature of heat treatment to be performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, when the conductive film 203 and the conductive film 210 have a two-layer structure, it is preferable to employ any of a two-layer structure in which a copper film is stacked over a titanium film, a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked. When the conductive film 203 and the conductive film 210 have a three-layer structure, it is preferable, for example, to employ a three-layer structure in which a titanium nitride film, a copper film, and a tungsten film are stacked.

A light-transmitting metal oxide of indium oxide, indium oxide-tin oxide, indium oxide-zinc oxide, zinc oxide, zinc aluminum oxide, zinc aluminum oxynitride, gallium zinc oxide, or the like can be used for the conductive film 203 and the conductive film 210.

Each thickness of the conductive film 203 and the conductive film 210 is 10 nm to 400 nm, preferably 100 nm to 200 nm. In this embodiment, the conductive film 203 and the conductive film 210 are formed in the following manner: a tungsten film is formed to a thickness of 200 nm by a sputtering method, and the tungsten film is processed (patterned) to have a desired shape with a photolithography method. Note that the end portions of the conductive film 203 and the conductive film 210 are preferably tapered because coverage with a gate insulating film 204 stacked thereover is improved. Note that a resist mask may be formed by an inkjet method. Formation of the resist mask by an inkjet method needs no photomask; thus, manufacturing cost can be reduced.

Although in this embodiment, the conductive film 203 and the conductive film 210 are formed directly on the substrate 202, an insulating film functioning as a base film may be formed over the substrate 202, and then the conductive film 203 and the conductive film 210 may be formed over the base film. As the base film, for example, a single layer of a silicon oxide film, a silicon oxynitride film, a silicon nitride film, a silicon nitride oxide film, an aluminum nitride film, or an aluminum nitride oxide film or a stacked layer of a plurality of these films can be used. In particular, an insulating film having a high barrier property, for example, a silicon nitride film, a silicon nitride oxide film, an aluminum nitride film, an aluminum oxide film, or an aluminum nitride oxide film is used for the base film, so that impurities in an atmosphere, such as moisture or hydrogen, or impurities included in the substrate 202, such as an alkali metal or a heavy metal, can be prevented from entering the semiconductor film 205, the gate insulating film 204, or at the interface between the semiconductor film 205 and another insulating film and the vicinity thereof.

Also, in this specification, an oxynitride compound denotes a material containing a higher quantity of oxygen than that of nitrogen, and a nitride oxide compound denotes a material containing a higher quantity of nitrogen than that of oxygen.

Figure 11:
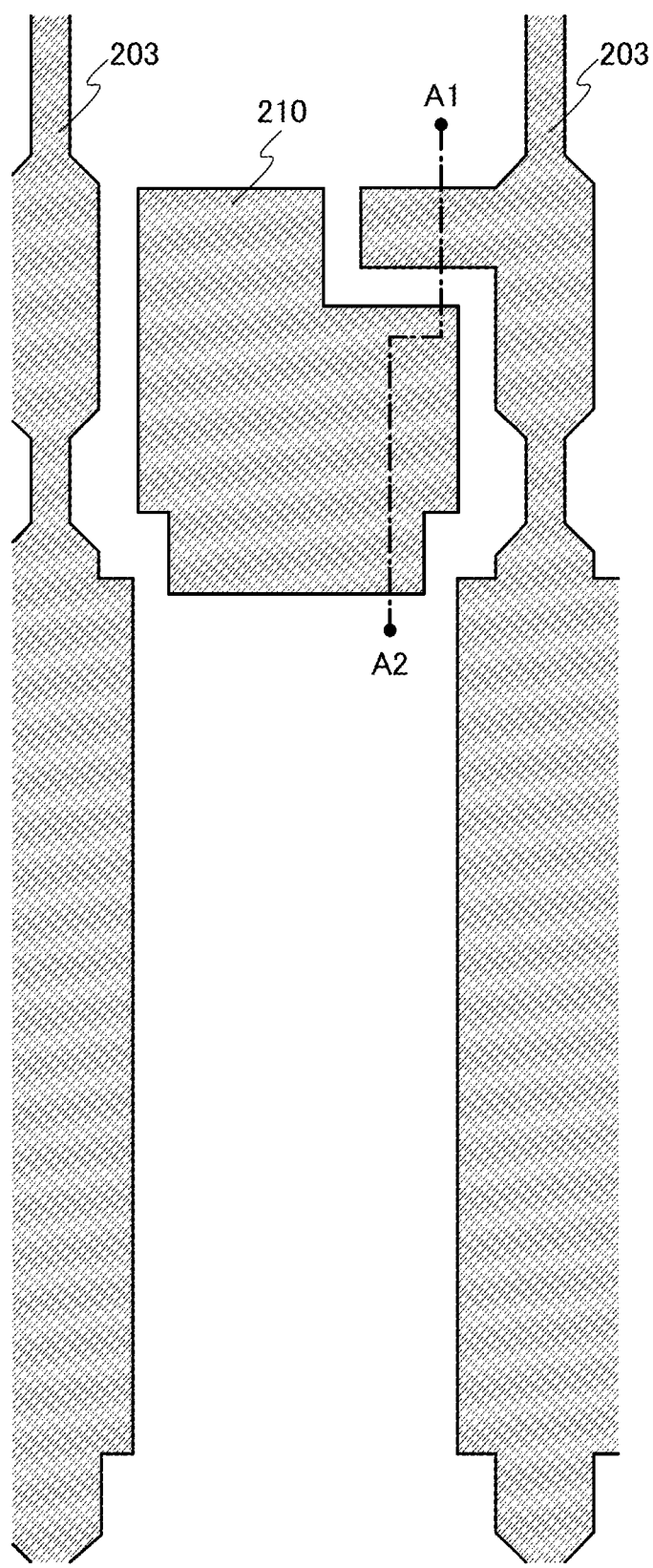
FIG. 11 illustrates a method for manufacturing a liquid crystal display device.

Note that FIG. 11 is a top view illustrating a liquid crystal display device after the above steps. A cross-sectional view along dashed-dotted line A1-A2 in FIG. 11 corresponds to FIG. 9A.

Figure 9B:
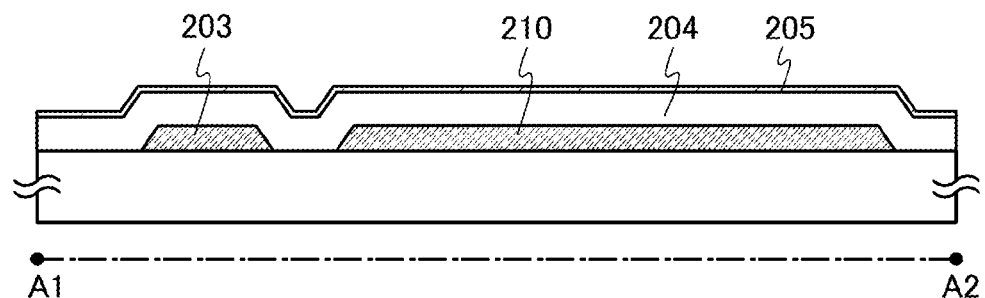

Next, as illustrated in FIG. 9B, the gate insulating film 204 is formed over the conductive film 203 and the conductive film 210. The gate insulating film 204 can be formed with a single-layer structure or a stacked-layer structure including any of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a yttrium oxide film, a gallium oxide film, a lanthanum oxide film, or a tantalum oxide film, by a plasma CVD method, a sputtering method, or the like. It is preferable that the gate insulating film 204 contain impurities such as moisture and hydrogen as little as possible.

The gate insulating film 204 may be formed with a single insulating film or a stacked structure including a plurality of insulating films. In either structure, the gate insulating film 204 is preferably formed so that an insulating film containing a larger amount of oxygen than the stoichiometric amount thereof is in contact with the semiconductor film 205 which is formed in a later step. With the above structure, oxygen can be supplied from the gate insulating film 204 to the semiconductor film 205, so that the transistor 12 with favorable electric characteristics can be provided.

Further, in the case of forming the gate insulating film 204 with a structure in which an insulating film having a high barrier property and an insulating film containing oxygen are stacked, the insulating film having a high barrier property is preferably formed between the insulating film containing oxygen and the conductive film 203 and the conductive film 210. The insulating film having a high barrier property can prevent impurities in an atmosphere, such as moisture or hydrogen, or impurities in the substrate 202, such as an alkali metal or a heavy metal, from entering the semiconductor film 205, the gate insulating film 204, or the interface between the semiconductor film 205 and another insulating film and the vicinity thereof. As the insulating film having a high barrier property, a silicon nitride film, a silicon nitride oxide film, an aluminum nitride film, an aluminum oxide film, an aluminum nitride oxide film, or the like can be given, for example.

The thickness of the gate insulating film 204 may be determined as appropriate, depending on characteristics necessary for the transistor. For example, the thickness is greater than or equal to 1 nm and less than or equal to 800 nm, preferably greater than or equal to 200 nm and less than or equal to 500 nm. When the gate insulating film 204 is formed to have a large thickness, the withstand voltage of the transistor 12 can be improved. In this embodiment, a silicon oxynitride film with a thickness of 100 nm which is formed by a plasma CVD method is used as the gate insulating film 204.

Next, as illustrated in FIG. 9B, over the gate insulating film 204, the semiconductor film 205 is formed to have a thickness greater than or equal to 2 nm and less than or equal to 200 nm, preferably greater than or equal to 3 nm and less than or equal to 50 nm, further preferably greater than or equal to 3 nm and less than or equal to 20 nm. The semiconductor film 205 is formed by a sputtering method using an oxide semiconductor as a target. The semiconductor film 205 can be formed by a sputtering method in a rare gas (e.g., argon) atmosphere, an oxygen atmosphere, or a mixed atmosphere of a rare gas (e.g., argon) and oxygen.

Before the oxide semiconductor film is formed by a sputtering method, dust on a surface of the gate insulating film 204 is preferably removed by reverse sputtering in which an argon gas is introduced and plasma is generated. The reverse sputtering refers to a method in which voltage is applied to a substrate side, but not to a target side, in an argon atmosphere by using an RF power supply and plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As an oxide semiconductor used for the semiconductor film 205, the following can be given: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like.

For example, the semiconductor film 205 can be formed by a sputtering method using a target including indium (In), gallium (Ga), and zinc (Zn). In the case where the In—Ga—Zn-based semiconductor film 205 is deposited by a sputtering method, it is preferable to use an In—Ga—Zn-based oxide target having an atomic ratio where In:Ga:Zn=1:1:1, 4:2:3, 3:1:2, 1:1:2, 2:1:3, or 3:1:4. When an oxide semiconductor film is formed using an In—Ga—Zn-based oxide target having the aforementioned atomic ratio, a polycrystal or CAAC is readily formed. The filling factor of the target including In, Ga, and Zn is higher than or equal to 90% and lower than or equal to 100%, and preferably higher than or equal to 95% and lower than or equal to 100%. With use of the target with high filling factor, a dense oxide semiconductor film is formed.

In the case where an In—Zn-based oxide material is used as an oxide semiconductor, a target used has such a composition that In:Zn=50:1 to 1:2 in an atomic ratio (In$_2$O$_3$:ZnO=25:1 to 1:4 in a molar ratio), preferably, In:Zn=20:1 to 1:1 in an atomic ratio (In$_2$O$_3$:ZnO=10:1 to 1:2 in a molar ratio), further preferably, In:Zn=15:1 to 1.5:1 in an atomic ratio (In$_2$O$_3$:ZnO=15:2 to 3:4 in a molar ratio). For example, in a target used for formation of an In—Zn—O-based oxide semiconductor as the semiconductor film 205 which has an atomic ratio where In:Zn:O=X:Y:Z, the relation of Z>(1.5X+Y) is satisfied. The mobility can be improved by keeping the ratio of Zn within the above range.

In the case where a material of an In—Sn—Zn-based oxide is used as the oxide semiconductor, a composition of the target to be used is preferably In:Sn:Zn=1:2:2, 2:1:3, 1:1:1, or 20:45:35 in an atomic ratio.

In this embodiment, the oxide semiconductor film is formed over the substrate 202 in such a manner that the substrate is held in a treatment chamber kept at reduced pressure, a sputtering gas from which hydrogen and moisture have been removed is introduced into the treatment chamber while moisture remaining therein is removed, and the above-described target is used. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water (H$_2$O), (preferably, also a compound containing a carbon atom), and the like are removed, whereby the concentration of impurities contained in the oxide semiconductor film formed in the treatment chamber can be reduced.

There are three methods for forming the semiconductor film 205 including a CAAC-OS. One of the methods (first method) is to form the semiconductor film 205 at a temperature higher than or equal to 200° C. and lower than or equal to 450° C. Another method (second method) is to form the semiconductor film 205 with a small thickness and then heat it at a temperature higher than or equal to 200° C. and lower than or equal to 700° C. The other method (third method) is to form a first oxide semiconductor film with a small thickness, then heat it at a temperature higher than or equal to 200° C. and lower than or equal to 700° C., and form a second oxide semiconductor film, thereby forming the semiconductor film 205.

In this embodiment, the semiconductor film 205 including an In—Ga—Zn-based oxide semiconductor is formed to have a thickness of 25 nm under such conditions that the distance between the substrate 202 and the target is 100 mm, the pressure is 0.4 Pa, the direct current (DC) power source is 0.5 kW, the substrate temperature is 250° C., and the argon flow rate and the oxygen flow rate are 30 sccm and 15 sccm, respectively.

In order for the semiconductor film 205 to contain hydrogen, a hydroxyl group, and moisture as little as possible, it is preferable to preheat the substrate 202 provided with the gate insulating film 204 in a preheating chamber of a sputtering apparatus before film formation, so that impurities such as moisture or hydrogen attached on the substrate 202 are discharged and removed. The temperature for the preheating is higher than or equal to 100° C. and lower than or equal to 400° C., preferably, higher than or equal to 150° C. and lower than or equal to 300° C.

Note that the semiconductor film 205 formed by a sputtering method or the like contains a large amount of moisture or hydrogen (including a hydroxyl group) as impurities in some cases. Moisture or hydrogen easily forms donor levels and thus serves as an impurity in the oxide semiconductor. In one embodiment of the present invention, in order to reduce impurities such as moisture or hydrogen in the semiconductor film 205 (dehydrate or dehydrogenate the semiconductor film), the semiconductor film 205 is subjected to heat treatment in a reduced-pressure atmosphere, an inert gas atmosphere of nitrogen, a rare gas, or the like after the semiconductor film 205 is formed.

By heat treatment performed on the semiconductor film 205, moisture or hydrogen in the semiconductor film 205 can be released. Specifically, heat treatment may be performed at a temperature higher than or equal to 250° C. and lower than or equal to 750° C., preferably higher than or equal to 400° C. and lower than the strain point of a substrate. When RTA is used for the heat treatment, dehydration or dehydrogenation can be performed in a short time; thus, treatment can be performed even at a temperature higher than the strain point of a glass substrate. In this embodiment, heat treatment is performed in an ultra-dry air atmosphere at 450° C. for one hour.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), further preferably greater than or equal to 7 N (99.99999%) (i.e., the impurity concentration is preferably less than or equal to 1 ppm, further preferably less than or equal to 0.1 ppm).

Through the above steps, the concentration of moisture or hydrogen in the semiconductor film 205 can be reduced. Note that in the semiconductor film 205, as well as a removal of moisture or hydrogen, an increase of oxygen vacancies due to release of oxygen might be caused by the heat treatment. Thus, it is preferable that treatment for supplying oxygen to the semiconductor film 205 be performed after the heat treatment, so that oxygen vacancies are reduced.

In addition, with the highly purified semiconductor film 205 in which the concentration of moisture or hydrogen is reduced and oxygen vacancies are reduced, the transistor 12 with high withstand voltage and an extremely small amount of off-state current can be manufactured.

For example, by heat treatment performed in an atmosphere containing oxygen, oxygen can be supplied to the semiconductor film 205. Heat treatment for supplying oxygen may be performed under conditions similar to those of the above heat treatment for reducing the concentration of moisture or hydrogen. Note that heat treatment for supplying oxygen is performed in an atmosphere such as an oxygen gas or an ultra dry air atmosphere (the moisture content is lower than or equal to 20 ppm (−55° C. by conversion into a dew point), preferably lower than or equal to 1 ppm, further preferably lower than or equal to 10 ppb, in the measurement with use of a dew point meter of a cavity ring down laser spectroscopy (CRDS) system).

It is preferable that in the gas containing oxygen, the concentration of water or hydrogen be low. Specifically, the concentration of impurities in the oxygen gas is lower than or equal to 1 ppm, preferably lower than or equal to 0.1 ppm.

Alternatively, as a method for supplying oxygen to the semiconductor film 205, an ion implantation method, an ion doping method, a plasma immersion ion implantation method, plasma treatment, or the like can be used. If a crystal part included in the semiconductor film 205 is damaged after oxygen is supplied to the semiconductor film 205, heat treatment may be performed so that the damaged crystal part is repaired.

A resist mask for forming the semiconductor film 205 may be formed by an inkjet method. Formation of the resist mask by an inkjet method needs no photomask; thus, manufacturing cost can be reduced.

Figure 9C:
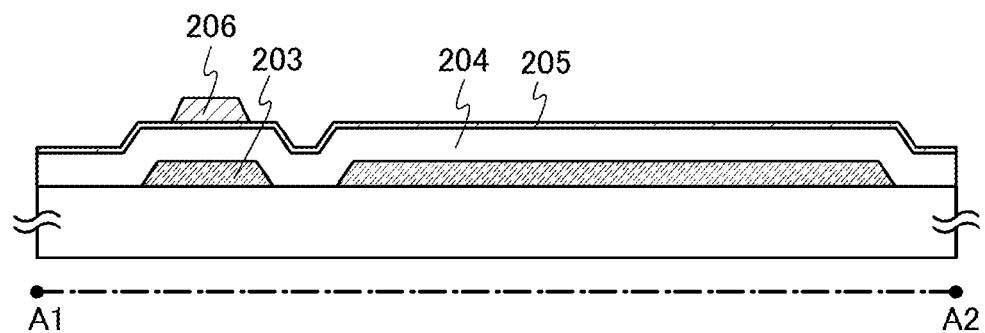

Next, as illustrated in FIG. 9C, the island-shaped insulating film 206 functioning as a channel protective film is formed in the following manner: an insulating film is formed over the semiconductor film 205, and then the insulating film is etched with a photolithography method to have a desired shape. The insulating film 206 is provided over the semiconductor film 205 so as to overlap with the conductive film 203.

The thickness of the insulating film 206 is greater than or equal to 50 nm and less than or equal to 600 nm, preferably greater than or equal to 100 nm and less than or equal to 400 nm. The insulating film 206 can be formed using a structure and a material similar to those of the gate insulating film 204. Further, the insulating film 206 preferably contains impurities such as moisture or hydrogen as little as possible and contains a large amount of oxygen exceeding its stoichiometry, like the gate insulating film 204. With the above structure, the concentration of impurities such as moisture or hydrogen in the semiconductor film 205 can be low, and oxygen can be supplied from the insulating film 206 to the semiconductor film 205. Thus, the transistor 12 to be manufactured can have favorable electric characteristics.

In this embodiment, a silicon oxynitride film with a thickness of 300 nm formed by a plasma CVD method is used as the insulating film 206.

Note that for the insulating film 206, a metal oxide which contains at least one of In and Zn and whose insulating property is improved when Ti, Zr, Hf, Ge, Ce, or the like is included may be used. The insulating property of such a metal oxide is superior to that of the semiconductor film 205.

For example, for the insulating film 206, an In-$M_1$-$M_2$-Zn-based oxide may be used. An element $M_1$ refers to any of trivalent elements belonging to Group 3A, Group 3B, and Group 4A. An element $M_2$ refers to any of quadrivalent elements belonging to Group 4A and Group 4B. Specifically, in the case where Ga is used for the element $M_1$, part of trivalent Ga is substituted with a quadrivalent element in the In-$M_1$-$M_2$-Zn-based oxide. The number of bonds of a quadrivalent element is larger by one than the number of bonds of a trivalent element. Thus, when part of trivalent elements is substituted with a quadrivalent element, the bonding force between oxygen and a metal element ($M_1$ or $M_2$) included in the In-$M_1$-$M_2$-Zn-based oxide can be increased. Therefore, when the In-$M_1$-$M_2$-Zn-based oxide is used for the insulating film 206, the insulating property of the insulating film 206 can be high. Specifically, examples of the element $M_2$ include Ti, Zr, Hf, Ge, and Ce.

For example, with use of a target in which In:Zr:Ga:Zn=3:0.05:0.95:2, the insulating film 206 may be formed using an In-$M_1$-$M_2$-Zn-based oxide by a sputtering method.

Alternatively, for example, an In-M-Zn-based oxide represented by a chemical formula $InMZnO_x$ may be used for the insulating film 206. An element M is an element for making the In-M-Zn-based oxide have a higher insulating property than the metal oxide included in the semiconductor film 205. For example, as the element M, a quadrivalent element such as Ti, Zr, Hf, Ge, or Ce can be employed. Since the number of bonds of a quadrivalent element is larger by one than the number of bonds of a trivalent element, in the In-M-Zn-based oxide including such a quadrivalent element as the element M, the bonding force between the element M and oxygen is strong. Thus, when the In-M-Zn-based oxide is used for the insulating film 206, the insulating property of the insulating film 206 can be increased.

For example, the energy gap of an In—Zr—Zn-based oxide in which Zr is used as the element M is larger than the energy gap of an In—Ga—Zn-based oxide (about 3.2 eV). In other words, the In—Zr—Zn-based oxide has a higher insulating property than the In—Ga—Zn-based oxide.

Further, electronegativity of yttrium is lower than that of Ga. When in the In-$M_1$-$M_2$-Zn-based oxide, yttrium is employed as the element $M_2$, a difference in electronegativity between oxygen and the element $M_2$ can be large, and the bond formed by an ionic bond with oxygen in the metal oxide can be strengthened. Thus, even in the case where yttrium is employed as the element $M_2$, the insulating property of the insulating film 206 including the In-$M_1$-$M_2$-Zn-based oxide can be enhanced. Further, when in the In-M-Zn-based oxide, yttrium is employed as the element M, a difference in electronegativity between oxygen and the element M can be large, and the bond formed by an ionic bond with oxygen in the metal oxide can be strengthened. Thus, even in the case where yttrium is employed as the element M, the insulating property of the insulating film 206 including the In-M-Zn-based oxide can be increased.

Note that in this specification, the term "energy gap" has the same meaning as "band gap" or "forbidden band". As a value of the band gap, a value obtained by measuring a single material film with an ellipsometer is used.

Further, in the In-M-Zn-based oxide, the content of the element M is greater than or equal to 0.3 times and less than 1.3 times as high as the content of In. Furthermore, in the In-M-Zn-based oxide, the content of the element M is greater than or equal to 0.3 times and less than 1.3 times as high as the content of Zn. As the relative number of In or Zn with respect to the element M becomes smaller, the insulating property of the insulating film 206 can be higher.

Specifically, in the case where the metal oxide material including the element M is formed by a sputtering method, it is preferable to use a metal oxide target with the following atomic ratio: In:M:Zn=1:1:1, 3:1:3, 3:2:4, 2:1:3, 4:5:4, or 4:2:3.

When an In-M-Zn-based oxide or an In-$M_1$-$M_2$-Zn-based oxide is used for the insulating film 206, an interface between the insulating film 206 and the semiconductor film 205 can be kept in a favorable state, and the transistor 12 with favorable electric characteristics can be obtained.

Impurities are easily attached onto a surface of the semiconductor film 205, which is exposed by etching performed for forming the insulating film 206. The above impurities include an element contained in an etching gas or an etchant used for etching or an element existing in the treatment chamber where etching is performed. As specific impurities, boron, chlorine, fluorine, carbon, aluminum, or the like can be given.

When the above impurities are attached on the surface of the semiconductor film 205, an increase in the amount of off-state current of the transistor or deterioration in electric characteristics of the transistor is likely to occur. In addition, a parasitic channel is easily generated in the semiconductor film 205, whereby conductive films which should be electrically isolated are likely to be electrically connected through the semiconductor film 205. Thus, in one embodiment of the present invention, after etching for formation of the insulating film 206 is performed, cleaning treatment for removing impurities which are supposed to be attached on the surfaces of the semiconductor film 205 and the insulating film 206 is performed.

The cleaning treatment can be performed with use of an alkaline solution such as a tetramethyl ammonium hydroxide (TMAH) solution, water, dilute hydrofluoric acid, or the like. Specifically, in the case where dilute hydrofluoric acid is used for the cleaning treatment, hydrofluoric acid (50 wt. %) is preferably diluted 100 times to 100000 times with water and used for the cleaning treatment. In other words, it is preferable to use dilute hydrofluoric acid with a concentration of 0.5 wt. % to $5 \times 10^{-4}$ wt. % for the cleaning treatment. By the cleaning treatment, the impurities attached onto the surfaces of the semiconductor film 205 and the insulating film 206 can be removed. Further, in the case of using dilute hydrofluoric acid for the cleaning treatment, the impurities attached to the semiconductor film 205 as well as part of the semiconductor film 205 can be removed.

Figure 9D:
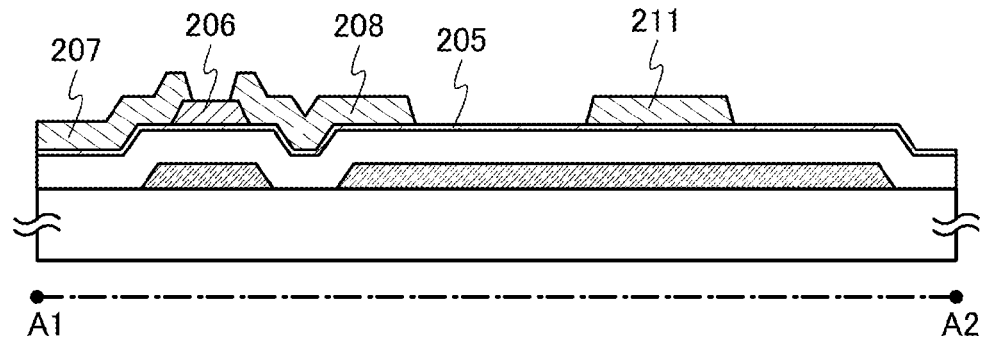

Next, a conductive film is formed over the semiconductor film 205 by a sputtering method or a vacuum evaporation method, and then the conductive film is etched with a photolithography method (patterned). Thus, as illustrated in FIG. 9D, over the semiconductor film 205, the conductive film 207 and the conductive film 208 between which the insulating film 206 is sandwiched are formed. In addition, over the gate insulating film 204 and the semiconductor film 205, the conductive film 211 is formed to overlap with the conductive film 210. The conductive film 207 functions as one of the source electrode and the drain electrode of the transistor 12, and the conductive film 208 functions as the other of the source electrode and the drain electrode of the transistor 12. Further, the conductive film 211 functions as an electrode of the capacitor 14.

The conductive film 207, the conductive film 208, and the conductive film 211 can be formed using a structure and a material similar to those of the conductive film 203 and the conductive film 210. In the case where heat treatment is performed after the conductive film 207, the conductive film 208, and the conductive film 211 are formed, the conductive films preferably have heat resistance against the heat treatment. In this embodiment, each of the conductive film 207, the conductive film 208, and the conductive film 211 is a 150-nm-thick tungsten film.

Note that when the conductive film 207, the conductive film 208, and the conductive film 211 are formed by etching, materials and etching conditions are adjusted as appropriate so that the semiconductor film 205 is removed as little as possible. Depending on the etching conditions, an exposed portion of the semiconductor film 205 is partly etched, so that a groove (a recessed portion) is formed in some cases.

In this embodiment, the conductive film 207, the conductive film 208, and the conductive film 211 are formed by dry etching with an ICP etching method. As a specific dry etching method, the conditions are changed during etching. The conditions at an initial state are as follows: the flow rate of sulfur hexafluoride used for an etching gas is 50 sccm; the reaction pressure is 1.5 Pa; the temperature of a lower electrode is 70° C.; the RF (13.56 MHz) power applied to a coil-shaped electrode is 500 W; and power applied to the lower electrode (the bias side) is 50 W. The changed conditions are as follows: the flow rates of boron trichloride and chlorine used for an etching gas are 60 sccm and 20 sccm, respectively; the reaction pressure is 1.9 Pa; the temperature of the lower electrode is 21° C.; the RF (13.56 MHz) power applied to the coil-shaped electrode is 450 W; and power applied to the lower electrode (the bias side) is 100 W.

In order to reduce the number of photomasks and steps in a photolithography method, etching may be performed with use of a resist mask formed using a multi-tone mask through which light is transmitted so as to have a plurality of intensities. A resist mask formed with use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. As a result, the number of light-exposure masks can be reduced, and the steps can be simplified.

Note that impurities such as boron, chlorine, fluorine, carbon, or aluminum are easily attached to surfaces of the semiconductor film 205 and the insulating film 206, which are exposed by etching for forming the conductive film 207, the conductive film 208, and the conductive film 211. In addition, the above impurities include an element constituting the conductive film 207, the conductive film 208, and the conductive film 211 in some cases.

When the impurities are attached to the surface of the semiconductor film 205, an increase in the amount of off-state current of the transistor or deterioration in electric characteristics of the transistor is likely to occur as described above. In addition, a parasitic channel is easily generated in the semiconductor film 205, whereby conductive films which should be electrically isolated are likely to be electrically connected through the semiconductor film 205. Thus, in one embodiment of the present invention, after etching for formation of the conductive film 207, the conductive film 208, and the conductive film 211 is performed, cleaning treatment for removing impurities which are supposed to be attached on the surfaces of the semiconductor film 205 and the insulating film 206 is performed.

The cleaning treatment can be performed with use of an alkaline solution such as a tetramethyl ammonium hydroxide (TMAH) solution, water, dilute hydrofluoric acid, or the like. Specifically, in the case where dilute hydrofluoric acid is used for the cleaning treatment, hydrofluoric acid (50 wt. %) is preferably diluted 100 times to 100000 times with water and used for the cleaning treatment. In other words, it is preferable to use dilute hydrofluoric acid with a concentration of 0.5 wt. % to $5 \times 10^{-4}$ wt. % for the cleaning treatment. By the cleaning treatment, the impurities attached onto the surfaces of the semiconductor film 205 and the insulating film 206 can be removed. Further, in the case of using dilute hydrofluoric acid for the cleaning treatment, the impurities attached to the semiconductor film 205 as well as part of the semiconductor film 205 can be removed.

Although in this embodiment, the cleaning treatment for removal of the impurities after the etching is performed twice (first cleaning treatment is performed after the insulating film 206 is formed, and second cleaning treatment is performed after the conductive film 207, the conductive film 208, and the conductive film 211 are formed), the cleaning treatment may be performed once in one embodiment of the present invention.

Figure 12:
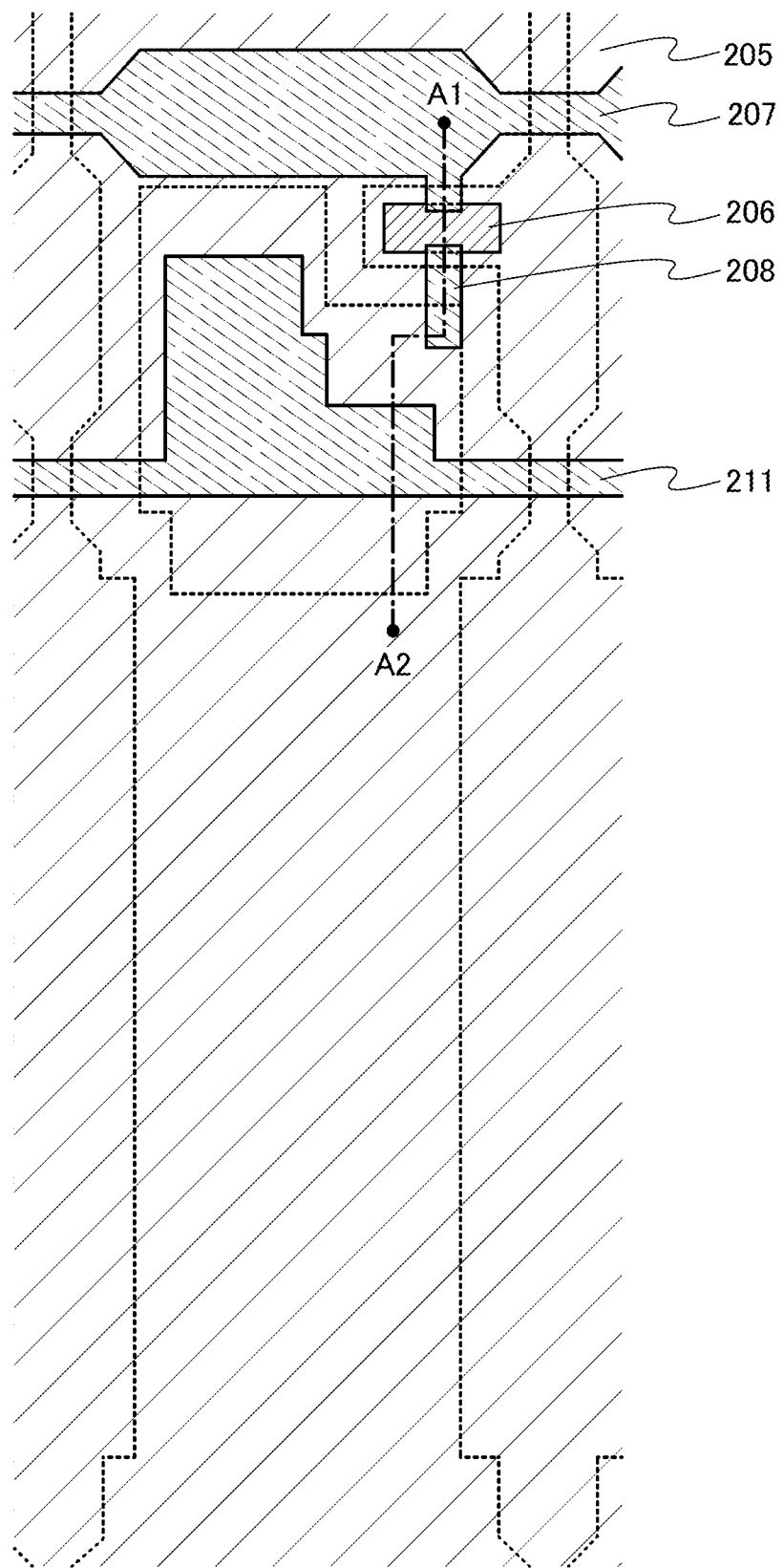
FIG. 12 illustrates a method for manufacturing a liquid crystal display device.

Note that FIG. 12 is a top view illustrating the liquid crystal display device at the time when the above steps are finished. A cross-sectional view along dashed-dotted line A1-A2 in FIG. 12 corresponds to FIG. 9D.

Figure 10A:
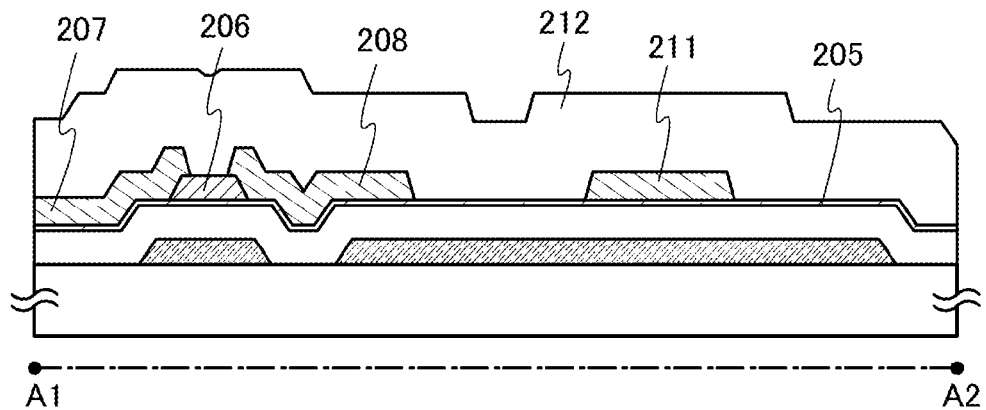
FIGS. 10A to 10C illustrate a method for manufacturing a liquid crystal display device.

Next, as illustrated in FIG. 10A, the insulating film 212 is formed so as to cover the semiconductor film 205, the insulating film 206, the conductive film 207, the conductive film 208, and the conductive film 211. The insulating film 212 preferably contains impurities such as moisture or hydrogen as little as possible. An insulating film of a single layer or a plurality of insulating films stacked may be employed as the insulating film 212. When hydrogen is included in the insulating film 212, the hydrogen enters the semiconductor film 205 or extracts oxygen in the semiconductor film 205, whereby resistance of the vicinity of the surface of the semiconductor film 205 is reduced (i.e., the vicinity of the surface of the semiconductor film becomes an n-type semiconductor). Further, a parasitic channel is easily generated in the vicinity of the surface of the semiconductor film 205 where resistance is reduced, and thus, the conductive film 208 and the conductive film 211 are likely to be electrically connected through the parasitic channel. Therefore, it is important that hydrogen be not used in a formation method in order to form the insulating film 212 containing as little hydrogen as possible.

Even in the case where the cleaning treatment is performed, when the substrate 202 is exposed to air before the insulating film 212 is formed, impurities such as carbon included in air may be attached to the surfaces of the semiconductor film 205 and the insulating film 206. Thus, in one embodiment of the present invention, before the insulating film 212 is formed, in a treatment chamber where the insulating film 212 is formed, the surfaces of the semiconductor film 205 and the insulating film 206 may be cleaned by plasma treatment using oxygen, dinitrogen monoxide, a rare gas (typically argon), or the like, so that impurities such as carbon attached to the surfaces of the semiconductor film 205 and the insulating film 206 are removed. After the impurities are removed by plasma treatment, the insulating film 212 is formed in a state where the substrate 202 is not exposed to air, whereby impurities are prevented from entering the vicinity of the interface between the semiconductor film 205 and the insulating film 212 and between the insulating film 206 and the insulating film 212. Accordingly, an increase in the amount of off-state current of the transistor or deterioration in electric characteristics of the transistor can be prevented.

A material having a high barrier property is preferably used for the insulating film 212. For example, as the insulating film having a high barrier property, a silicon nitride film, a silicon nitride oxide film, an aluminum nitride film, an aluminum oxide film, an aluminum nitride oxide film, or the like can be used. In the case where an insulating film has a stacked structure of a plurality of films, an insulating film containing oxygen such as a silicon oxide film or a silicon oxynitride film is formed to be closer to the semiconductor film 205 than the insulating film having a high barrier property is. The insulating film having a high barrier property is formed so as to overlap with the semiconductor film 205 with the insulating film containing oxygen interposed therebetween. By using the insulating film having a high barrier property, the impurities such as moisture or hydrogen can be prevented from entering the semiconductor film 205, the gate insulating film 204, or the interface between the semiconductor film 205 and another insulating film and the vicinity thereof.

Further, in the case where a stacked structure of a plurality of insulating films is used for the insulating film 212, as an insulating film other than a first layer, an organic material having heat resistance, such as an acrylic resin, a polyimide resin, a benzocyclobutene-based resin, a polyamide resin, or an epoxy-based resin can be used for example. Other than the above organic material, a siloxane-based resin, silicon oxide, silicon nitride, silicon oxynitride, silicon nitride oxide, alumina, or the like can be used. A siloxane-based resin refers to a material in which a skeleton structure is formed by the bond of silicon (Si) and oxygen (O). As well as hydrogen, at least one of fluorine, a fluoro group, and an organic group (e.g., an alkyl group or aromatic hydrocarbon) may be used as a substituent. The insulating film 212 can be formed, depending on the material, by a method such as CVD, sputtering, SOG, spin coating, dipping, spray coating, a droplet discharge method (e.g., an inkjet method), a printing method (a screen printing method or an offset printing method) or the like. Further, the insulating film may be formed using a tool such as a doctor knife, a roll coater, a curtain coater, or a knife coater. Alternatively, as an insulating film other than a first layer, a silicon oxide film formed by chemical vapor deposition using organosilane can be used. For organosilane, tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), or the like can be used.

In this embodiment, a silicon oxide film with a thickness of 300 nm which is formed by a sputtering method is used as the insulating film 212. The substrate temperature in film formation may be higher than or equal to room temperature and lower than or equal to 300° C. and in this embodiment, is 100° C.

Figure 10B:
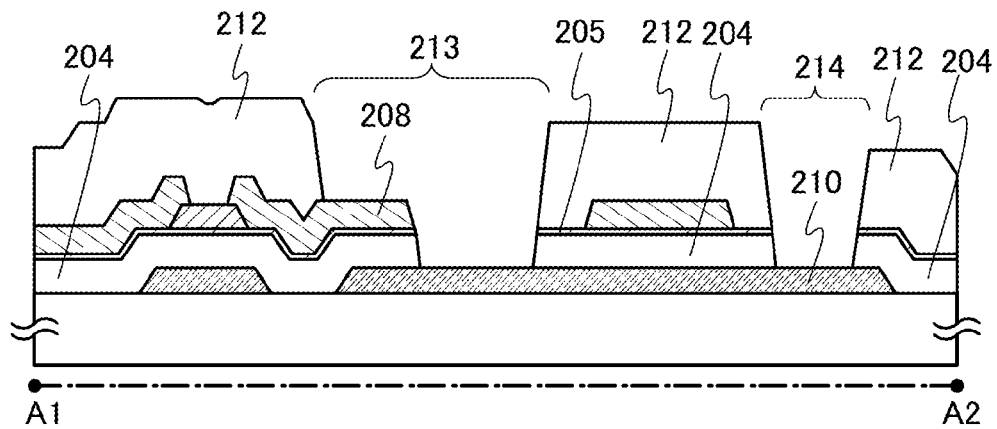

Next, as illustrated in FIG. 10B, the gate insulating film 204, the semiconductor film 205, and the insulating film 212 are etched with a photolithography method to have desired shapes, so that the opening portion 213 and the opening portion 214 are formed.

In this embodiment, the gate insulating film 204, the semiconductor film 205, and the insulating film 212 are patterned by dry etching with an ICP etching method. Specifically, dry etching is performed under the following conditions: flow rates of trifluoromethane, helium, and methane used for an etching gas are 22.5 sccm, 127.5 sccm, and 5 sccm, respectively; the reaction pressure is 3.5 Pa; the temperature of a lower electrode is 21° C.; the RF (13.56 MHz) power applied to a coil-shaped electrode is 475 W; and the power applied to the lower electrode (bias side) is 300 W.

A region where the opening portion 213 is formed overlaps with part of a region where the conductive film 208 is formed and part of a region where the conductive film 210 is formed; thus, in the opening portion 213, the conductive film 208 and the conductive film 210 are partly exposed. Further, a region where the opening portion 214 is formed overlaps with part of a region where the conductive film 210 is formed; thus, in the opening portion 214, the conductive film 210 is partly exposed.

Figure 13:
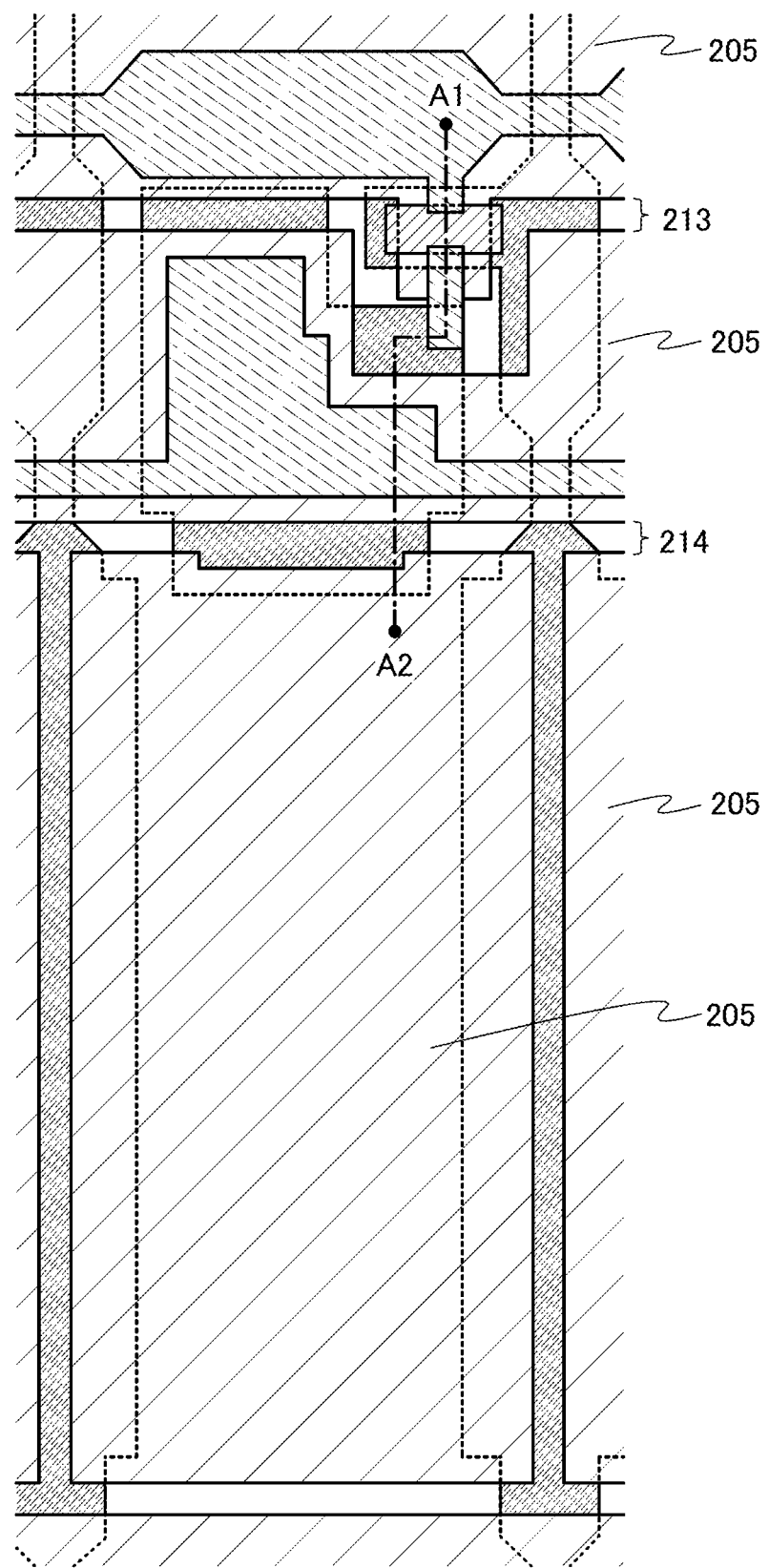
FIG. 13 illustrates a method for manufacturing a liquid crystal display device.

FIG. 13 is a top view illustrating the liquid crystal display device at the time when the above steps are finished. A cross-sectional view along dashed-dotted line A1-A2 in FIG. 13 corresponds to FIG. 10B.

Figure 10C:
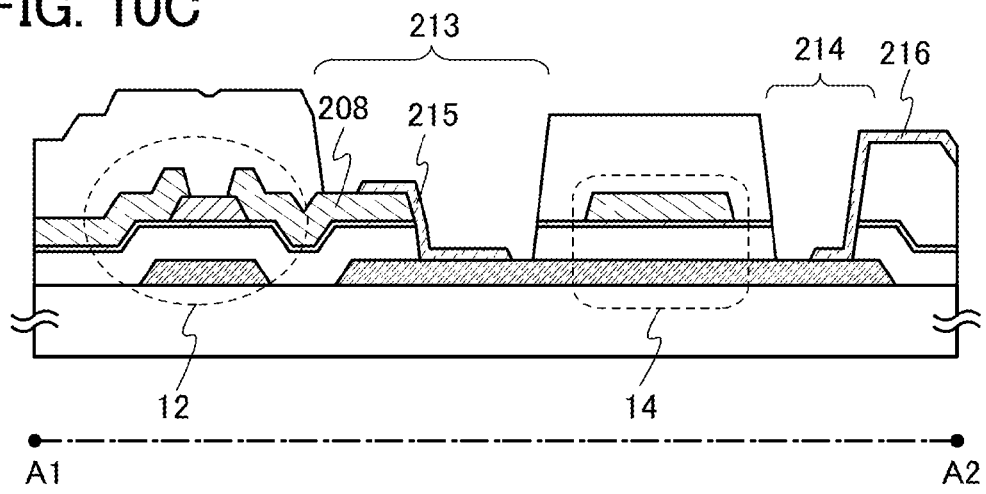

Next, as illustrated in FIG. 10C, the conductive film 215 and the conductive film 216 are formed. The conductive film 215 is in contact with the conductive film 208 and the conductive film 210 in the opening portion 213, and the conductive film 216 is in contact with the conductive film 210 in the opening portion 214. The conductive film 216 functions as a pixel electrode, and part thereof is provided also over the insulating film 212.

In the case of a transmissive liquid crystal display device, the conductive film 215 and the conductive film 216 are preferably formed using a light-transmitting conductive material. In the case of a reflective liquid crystal display device, the conductive film 215 and the conductive film 216 are preferably formed using a conductive material which reflects light.

Specifically, for the conductive film 215 and the conductive film 216, the following materials can be used: indium oxide, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, an Al—Zn-based oxide semiconductor containing nitrogen, a Zn-based oxide semiconductor containing nitrogen, a Sn—Zn-based oxide semiconductor containing nitrogen, gold (Au), platinum (Pt), nickel (Ni), tungsten (W), chromium (Cr), molybdenum (Mo), iron (Fe), cobalt (Co), copper (Cu), palladium (Pd), or titanium (Ti). In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (e.g., MgAg or AlLi), a rare earth metal such as europium (Eu) or ytterbium (Yb), an alloy containing such an element, or the like can be used. Note that the conductive film 215 and the conductive film 216 can be formed in the following manner: a conductive film is formed using the above material by a sputtering method or an evaporation method (including vacuum evaporation), for example, and then the conductive film is processed by etching with a photolithography method to be a desired shape.

After the above steps, an insulating film functioning as a spacer is formed over the insulating film 212. A counter electrode which is separately provided is made to face the conductive film 216 functioning as a pixel electrode so that a liquid crystal layer is sandwiched therebetween. Thus, a liquid crystal display device can be manufactured.

Although in this embodiment, the case in which the transistor 12 is a single-gate transistor, a multi-gate transistor that includes a plurality of conductive films 203 which are electrically connected to each other and thus has a plurality of channel formation regions can be formed.

This embodiment can be implemented in combination with any of the other embodiments as appropriate.

Embodiment 4

Figure 14A:
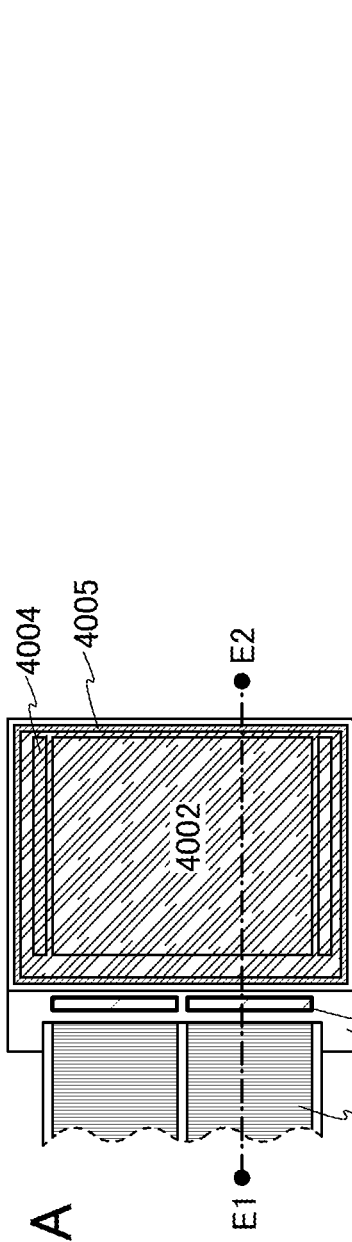
FIGS. 14A and 14B illustrate a structure of a panel.
Figure 14B:
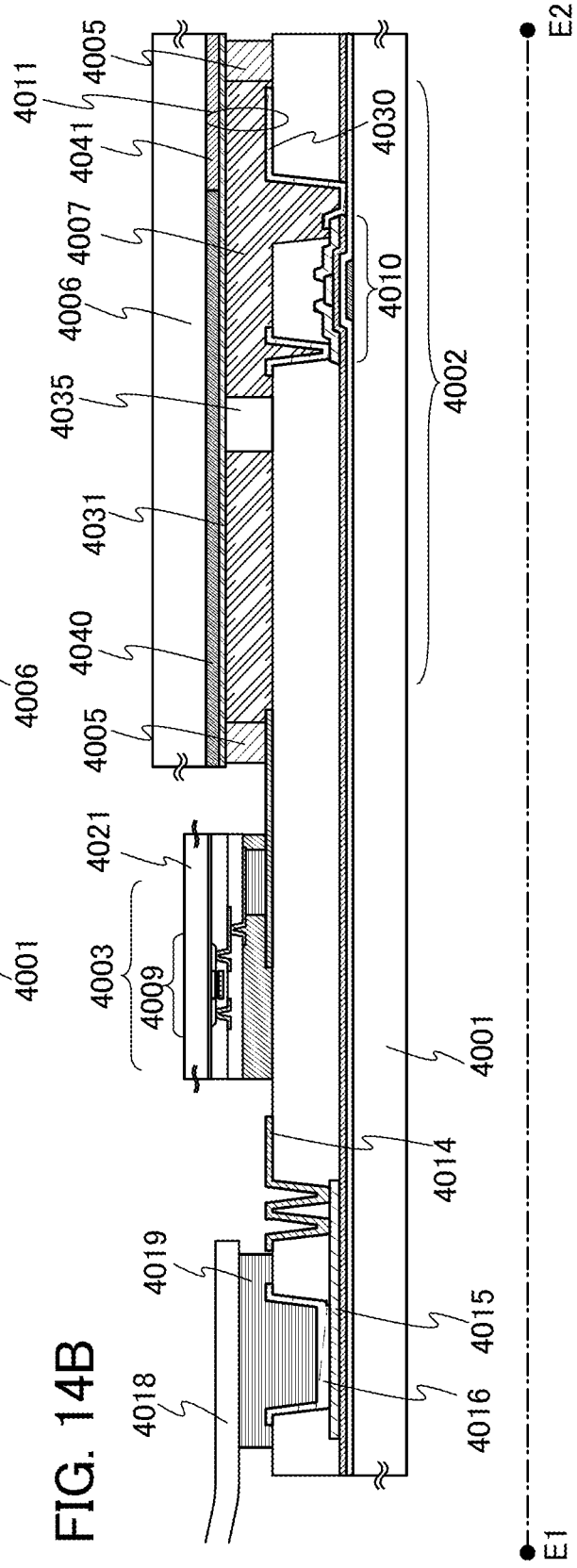

Next, the appearance of a panel of a liquid crystal display panel according to one embodiment of the present invention will be described with reference to FIGS. 14A and 14B. FIG. 14A is a top view of a panel in which a substrate 4001 and a counter substrate 4006 are attached to each other with a sealant 4005, and FIG. 14B is a cross-sectional view taken along dashed-dotted line E1-E2 in FIG. 14A.

The sealant 4005 is provided so as to surround a pixel portion 4002 and a scan line driver circuit 4004 provided over the substrate 4001. In addition, the counter substrate 4006 is provided over the pixel portion 4002 and the scan line driver circuit 4004. Thus, the pixel portion 4002 and the scan line driver circuit 4004 are sealed together with a liquid crystal layer 4007 by the substrate 4001, the sealant 4005, and the counter substrate 4006.

A substrate 4021 provided with a signal line driver circuit 4003 is mounted in a region which is different from a region surrounded by the sealant 4005 over the substrate 4001. FIG. 14B illustrates a transistor 4009 in the signal line driver circuit 4003. Although in this embodiment, both the scan line driver circuit 4004 and the pixel portion 4002 are provided over the substrate 4001, the scan line driver circuit 4004 provided over another substrate may be mounted over the substrate 4001. Further, although in this embodiment, the signal line driver circuit 4003 provided over the substrate 4021 is mounted over the substrate 4001, the signal line driver circuit 4003 may be formed over the substrate 4001 over which the pixel portion 4002 is formed. Alternatively, a structure in which part of the signal line driver circuit 4003 or part of the scan line driver circuit 4004 is provided over the substrate 4001 over which the pixel portion 4002 may be employed.

A plurality of transistors are included in the pixel portion 4002 and the scan line driver circuit 4004 which are provided over the substrate 4001. FIG. 14B illustrates a transistor 4010 included in the pixel portion 4002. A pixel electrode 4030 included in a liquid crystal element 4011 is electrically connected to the transistor 4010. A counter electrode 4031 of the liquid crystal element 4011 is formed on the counter substrate 4006. A portion where the pixel electrode 4030, the counter electrode 4031, and the liquid crystal layer 4007 overlap with each other corresponds to the liquid crystal element 4011.

A blocking film 4040 formed on the counter substrate 4006 overlaps with a region where the transistor 4010 is formed. The counter substrate 4006 is provided with a coloring layer 4041 through which only visible light in a particular wavelength region is preferentially transmitted, and the coloring layer 4041 overlaps with a region where the liquid crystal element 4011 is formed.

When the coloring layer 4041 through which light in a wavelength region corresponding to red, blue, or green is preferentially transmitted is provided in each pixel, a full color image can be displayed. In this case, it is preferable to use a backlight by which white light can be obtained so that color purity of an image is increased. As the backlight by which white light can be obtained, for example, a structure in which a red light source, a blue light source, and a green light source are combined; a structure in which a yellow or orange light source and a blue light source are combined; a structure in which only a white light source is used; a structure in which a cyan light source, a magenta light source, and a yellow light source are combined; or the like can be employed.

Alternatively, light in a wavelength region corresponding to red, blue, and green may be output sequentially from the backlight. In this case, a full color image can be displayed even when a color filter is not used, and luminous efficiency of the liquid crystal display device can be increased.

In addition to a cold-cathode tube, a light-emitting element such as an LED or an OLED can be used as a light source for a backlight. Note that because a wavelength of light to be obtained is different depending on a light source, a light source may be selected as appropriate in accordance with a required color.

Note that although FIG. 14B shows an example in which the blocking film 4040 and the coloring layer 4041 are provided on the counter substrate 4006 side, the blocking film 4040 or the coloring layer 4041 may be provided on the substrate 4001 side. The positions of the blocking film 4040 and the coloring layer 4041 can be set as appropriate in accordance with a direction of light incident on the liquid crystal element 4011 and an emission direction of light transmitted through the liquid crystal element 4011.

A spacer 4035 is provided to adjust a distance (cell gap) between the pixel electrode 4030 and the counter electrode 4031. Note that FIG. 14B shows the case where the spacer 4035 is formed by patterning an insulating film; however, a spherical spacer may be used.

A variety of signals and potentials are supplied to the signal line driver circuit 4003, the scan line driver circuit 4004, and the pixel portion 4002 from a connection terminal 4016 through lead wirings 4014 and 4015. The connection terminal 4016 is electrically connected to a terminal included in the FPC 4018 through an anisotropic conductive film 4019.

This embodiment can be implemented in combination with any of the other embodiments as appropriate.

Embodiment 5

Figure 15:
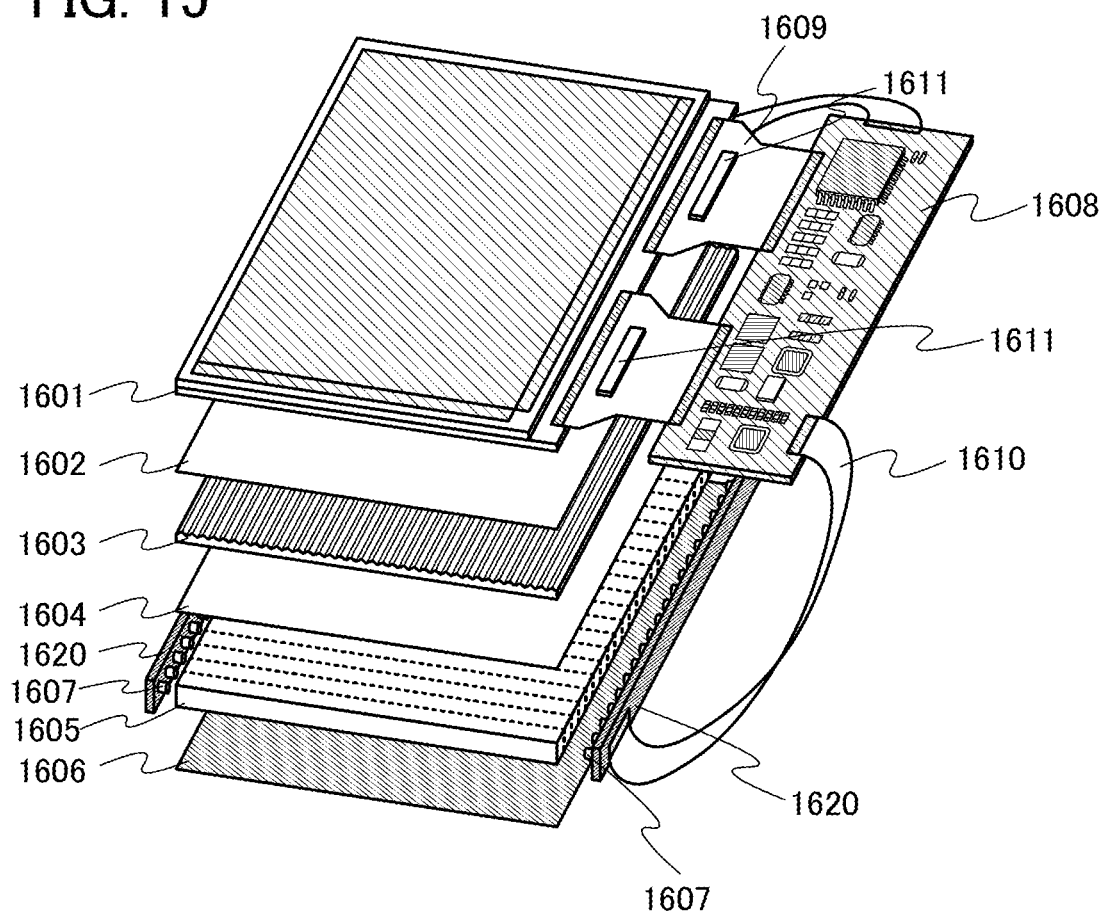
FIG. 15 is a perspective view of a liquid crystal display device.

FIG. 15 illustrates an example of a perspective view illustrating a structure of the liquid crystal display device. The liquid crystal display device illustrated in FIG. 15 includes a panel 1601 in which a pixel portion is formed between a pair of substrates, a first diffuser plate 1602, a prism sheet 1603, a second diffuser plate 1604, a light guide plate 1605, a backlight 1620 including a plurality of light sources 1607, a reflective plate 1606, a circuit board 1608, and a substrate 1611 provided with a signal line driver circuit.

The panel 1601, the first diffuser plate 1602, the prism sheet 1603, the second diffuser plate 1604, the light guide plate 1605, and the reflective plate 1606 are sequentially stacked. The backlight 1620 is provided at an end portion of the light guide plate 1605. Light from the light sources 1607, which is diffused in the light guide plate 1605, is uniformly delivered to the panel 1601 through the first diffuser plate 1602, the prism sheet 1603, and the second diffuser plate 1604.

Although the first diffuser plate 1602 and the second diffuser plate 1604 are used in this embodiment, the number of diffuser plates is not limited thereto. The number of diffuser plates may be one, or may be three or more. The diffuser plate may be provided between the light guide plate 1605 and the panel 1601. Therefore, the diffuser plate may be provided only on the side closer to the panel 1601 than the prism sheet 1603, or may be provided only on the side closer to the light guide plate 1605 than the prism sheet 1603.

Moreover, the shape of the cross section of the prism sheet 1603 is not limited to a sawtooth shape as illustrated in FIG. 15, and may be a shape capable of collecting light from the light guide plate 1605 over the panel 1601.

The circuit board 1608 is provided with a circuit which generates various signals input to the panel 1601, a circuit which processes the signals, or the like. In FIG. 15, the circuit board 1608 and the panel 1601 are connected to each other via a COF tape 1609. Further, the substrates 1611 provided with the signal line driver circuits are connected to the COF tapes 1609 by a chip on film (COF) method.

FIG. 15 illustrates an example in which the circuit board 1608 is provided with a control circuit which controls driving of the backlight 1620 and the control circuit and the backlight 1620 are connected to each other through an FPC 1610. Note that the control circuit may be formed over the panel 1601. In that case, the panel 1601 and the backlight 1620 are connected to each other through an FPC or the like.

In the example of FIG. 15, the edge-light type backlight 1620 provided at an end portion of the panel 1601 is used; however, the present invention is not limited to this structure. In one embodiment of the present invention, a direct-below type backlight provided directly below the panel 1601 may be used. Alternatively, in one embodiment of the present invention, a frontlight may be used.

This embodiment can be implemented in combination with any of the other embodiments as appropriate.

Embodiment 6

Figure 17A:
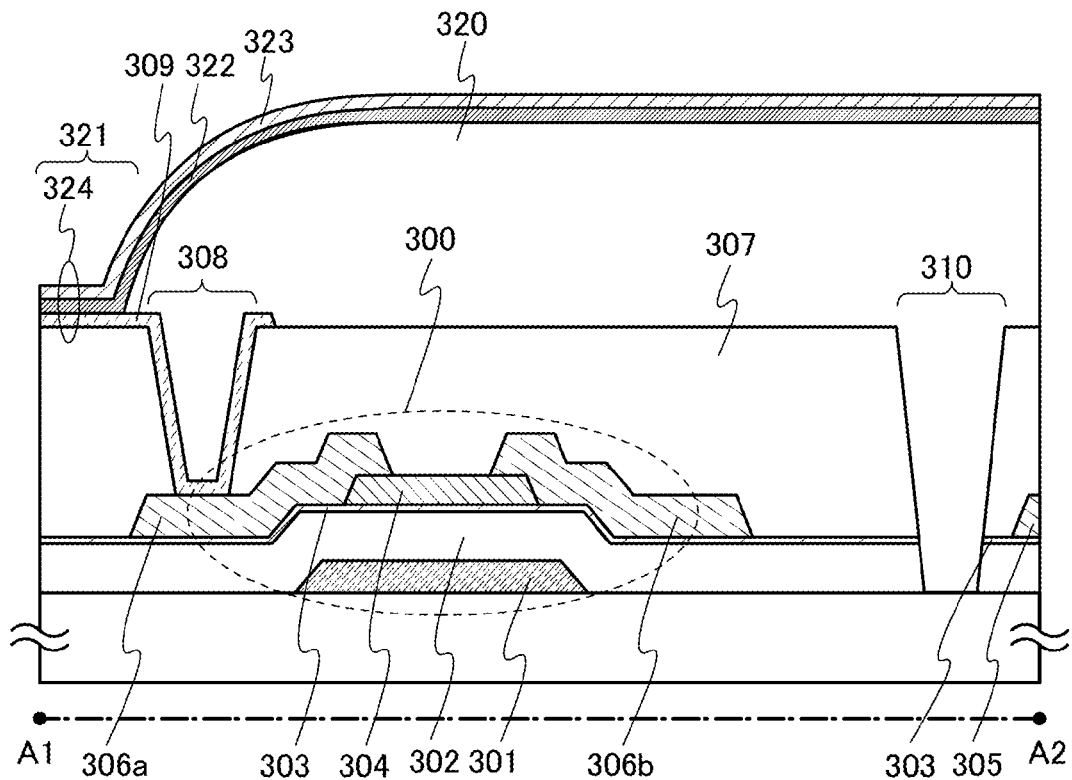
FIGS. 17A and 17B illustrate a structure of a light-emitting device.
Figure 17B:
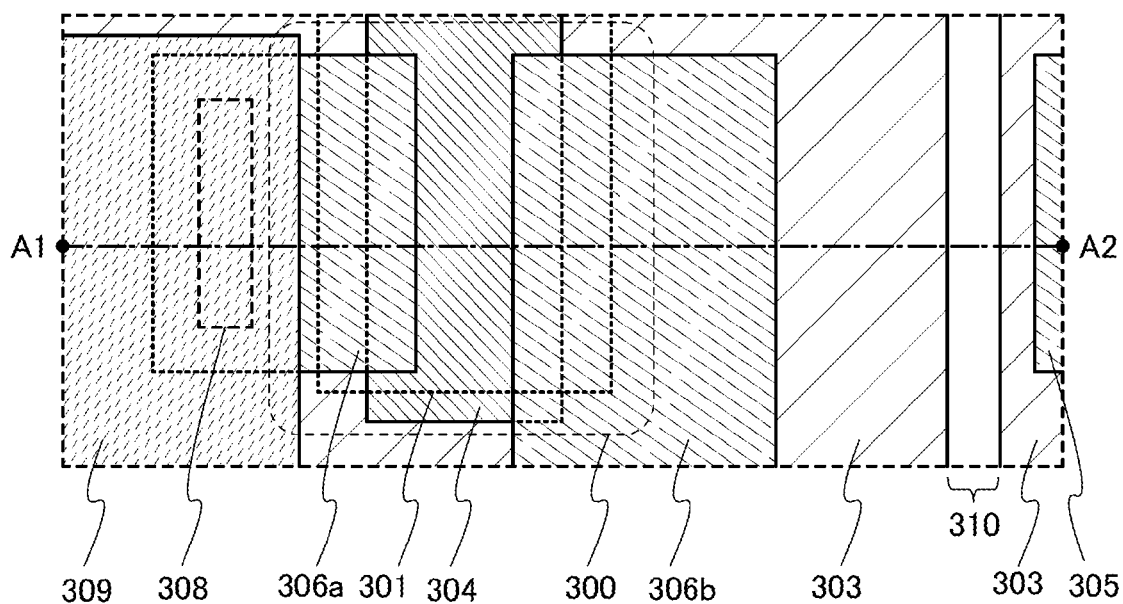

FIGS. 17A and 17B illustrate an example of a structure of a light-emitting device according to one embodiment of the present invention. FIG. 17A is an example of a cross-sectional view in the channel length direction of a transistor 300 included in a pixel.

FIG. 17A illustrates the following components: a gate electrode 301 over an insulating surface; a gate insulating film 302 provided over the gate electrode 301; a semiconductor film 303 which is provided over the gate insulating film 302 and overlaps with the gate electrode 301; an island-shaped insulating film 304 which is provided over the semiconductor film 303 and overlaps with the gate electrode 301; a conductive film 305 provided over the semiconductor film 303; a conductive film 306a and a conductive film 306b which are provided over the semiconductor film 303 and between which the insulating film 304 is sandwiched; an insulating film 307 provided over the semiconductor film 303, the insulating film 304, the conductive film 305, the conductive film 306a and the conductive film 306b; a pixel electrode 309 which is provided over the insulating film 307 and connected to the conductive film 306a through an opening portion 308 formed in the insulating film 307; an opening portion 310 formed in the insulating film 307 and the semiconductor film 303; an insulating film 320 provided over the pixel electrode 309; and an EL layer 322 and a counter electrode 323 which are stacked over the pixel electrode 309 in this order in an opening portion 321 formed in an insulating film 320.

The transistor 300 in FIG. 17A includes the gate electrode 301, the gate insulating film 302, the semiconductor film 303, the insulating film 304 functioning as a channel protective film, the conductive film 306a, and the conductive film 306b. One of the conductive film 306a and the conductive film 306b functions as a source electrode, and the other functions as a drain electrode.

Further, in FIG. 17A, a portion where the pixel electrode 309, the EL layer 322, and the counter electrode 323 are stacked in the opening portion 321 corresponds to a light-emitting element 324.

In a method for manufacturing a light-emitting device according to one embodiment of the present invention, a photolithography method with use of a mask is used for the following steps: a step in which the gate electrode 301 is formed; a step in which the insulating film 304 is formed; a step in which the conductive film 305, the conductive film 306a, and the conductive film 306b are formed; a step in which the opening portion 308 is formed in the insulating film 307 and the opening portion 310 is formed in the insulating film 307 and the semiconductor film 303; a step in which the pixel electrode 309 is formed; and a step in which the opening portion 321 is formed in the insulating film 320. In other words, in one embodiment of the present invention, an independent photolithography step only for processing the semiconductor film 303 to change its shape can be omitted because the semiconductor film 303 is shaped in the step in which the opening portion 310 is formed in the insulating film 307. Thus, part of a series of steps (formation of a photoresist, exposure, development, etching, separation, and the like) performed in a photolithography method can be skipped in manufacture of the light-emitting device according to one embodiment of the present invention. As a result, the number of light-exposure masks which are expensive can be small, and cost for manufacturing light-emitting devices can be accordingly reduced.

Note that the conductive film 305, the conductive film 306a, and the conductive film 306b are provided between the insulating film 307 and the semiconductor film 303. Thus, in the case where the semiconductor film 303 is processed to change its shape in the step for forming the opening portion 308 in the insulating film 307, it is difficult to process portions of the semiconductor film 303, which are positioned below the conductive film 305, the conductive film 306a, and the conductive film 306b. When the conductive film 305, the conductive film 306a, and the conductive film 306b overlaps with the semiconductor film 303, a parasitic channel may be formed in the semiconductor film 303 by an electric field applied from the pixel electrode 309 to the semiconductor film 303. When the parasitic channel is formed, the conductive film 305 and the conductive film 306a or 306b which should be electrically isolated are connected electrically through the semiconductor film 303. Thus, deterioration in displayed images is caused.

Thus, in a light-emitting device according to one embodiment of the present invention, the opening portion 310 is positioned between the conductive film 305 and the conductive film 306a or 306b, and the semiconductor film 303 is partly etched. Note that FIG. 17A illustrates an example in which in the opening portion 310, the gate insulating film 302 as well as the semiconductor film 303 and the insulating film 307 is removed. In one embodiment of the present invention, the gate insulating film 302 is not necessarily removed in the opening portion 310, and the gate insulating film 302 may be left in the opening portion 310.

FIG. 17B shows an example of a top view of the light-emitting device having the cross-sectional structure illustrated in FIG. 17A. Note that in the top view in FIG. 17B, the gate insulating film 302, the insulating film 307, the insulating film 320, the EL layer 322, and the counter electrode 323 are omitted for a simple layout of the light-emitting device. A cross-sectional view along dashed-dotted line A1-A2 in FIG. 17B corresponds to FIG. 17A.

As illustrated in FIGS. 17A and 17B, in one embodiment of the present invention, the opening portion 310 is provided in the semiconductor film 303 and the insulating film 307 so as to be positioned between the conductive film 305 and the conductive film 306a or 306b.

As illustrated in FIGS. 17A and 17B, in one embodiment of the present invention, the semiconductor film 303 is divided by the opening portion 310 into the semiconductor film 303 positioned below the conductive film 306a or 306b and the semiconductor film 303 positioned below the conductive film 305. The divided semiconductor films are apart from each other. Thus, in one embodiment of the present invention, even when an electric field is applied from the pixel electrode 309 or the like to the semiconductor film 303, formation of a parasitic channel in the semiconductor film 303 can be suppressed by the opening portion 310 which is positioned between the conductive film 305 and the conductive film 306a or 306b. Furthermore, when formation of a parasitic channel is suppressed, unintentional electrical connection between the conductive film 305 and the conductive film 306a or 306b can be prevented; accordingly, deterioration in images displayed on the light-emitting device can be prevented.

Note that FIG. 17B illustrates a case where the semiconductor film 303 positioned below the conductive film 306a or 306b and the semiconductor film 303 positioned below the conductive film 305 are definitely separated. However, in one embodiment of the present invention, the semiconductor film 303 is not necessarily divided definitely. The semiconductor film 303 positioned between the conductive film 305 and the conductive film 306a or 306b may be partly divided.

Figure 18:
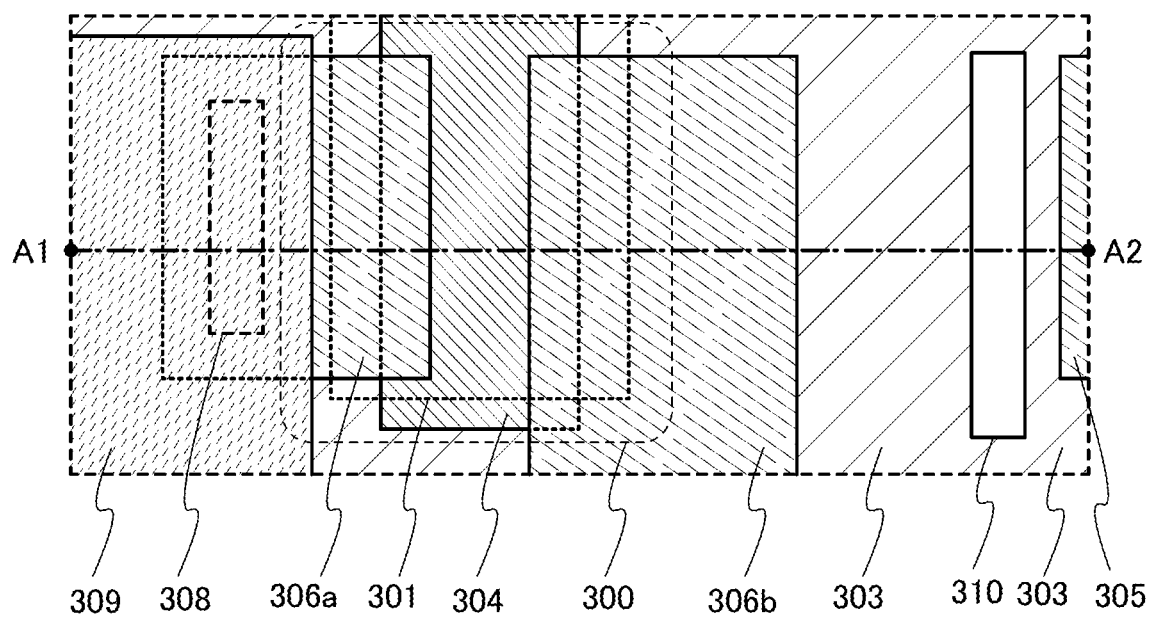
FIG. 18 illustrates a structure of a light-emitting device.

FIG. 18 shows an example of a top view of the light-emitting device having the cross-sectional structure illustrated in FIG. 17A. Note that in the top view of FIG. 18, the gate insulating film 302, the insulating film 307, the insulating film 320, the EL layer 322, and the counter electrode 323 are omitted for a simple layout of the light-emitting device.

In the light-emitting device illustrated in FIG. 18, the shape of the opening portion 310 is different from that in FIG. 17B. In FIG. 18, although the opening portion 310 is positioned between the conductive film 305 and the conductive film 306a or 306b as in the case of FIG. 17B, in a region other than opening portion 310, the semiconductor film 303 positioned below the conductive film 306a or 306b is connected to the semiconductor film 303 positioned below the conductive film 305. In other words, in FIG. 18, the semiconductor film 303 positioned between the conductive film 305 and the conductive film 306a or 306b is partly divided. Even in the state where the semiconductor film 303 is partly divided, an effect of suppression of generation of a parasitic channel can be obtained.

Further, part of a region where the opening portion 310 is formed may overlap with the conductive film 306a or the conductive film 306b. Alternatively, part of a region where the opening portion 310 is formed may overlap with a region where the conductive film 305 is formed.

Figure 19A:
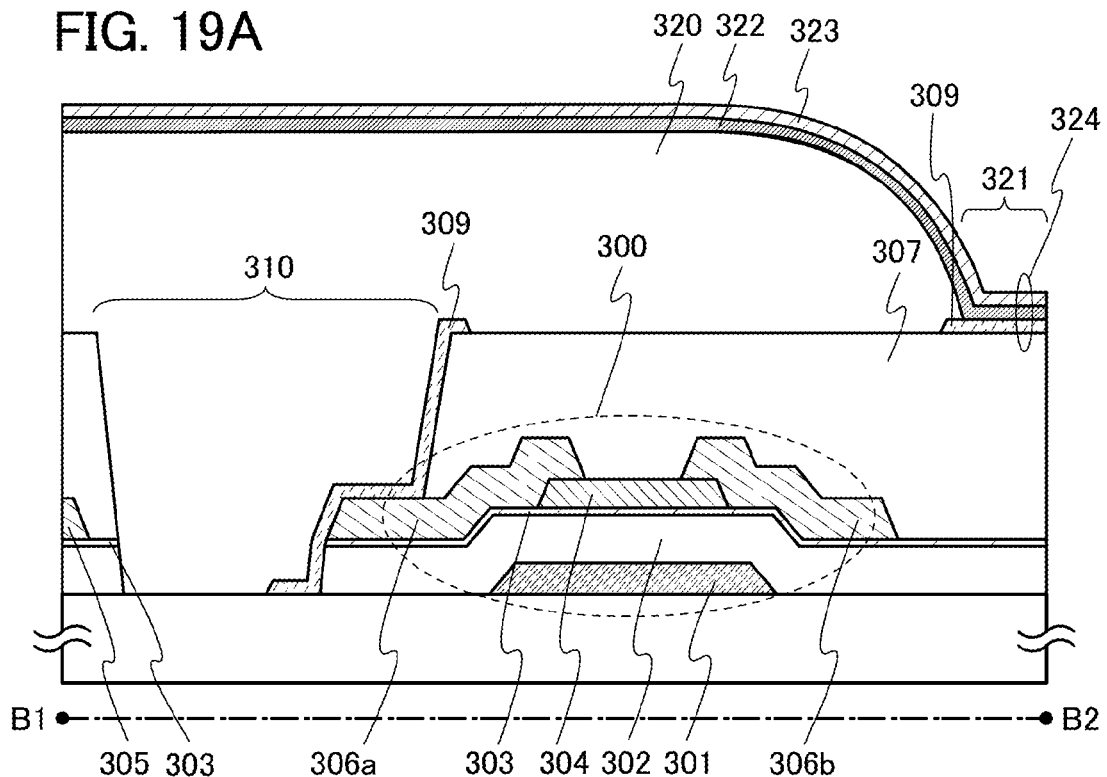
FIGS. 19A and 19B illustrate a structure of a light-emitting device.
Figure 19B:
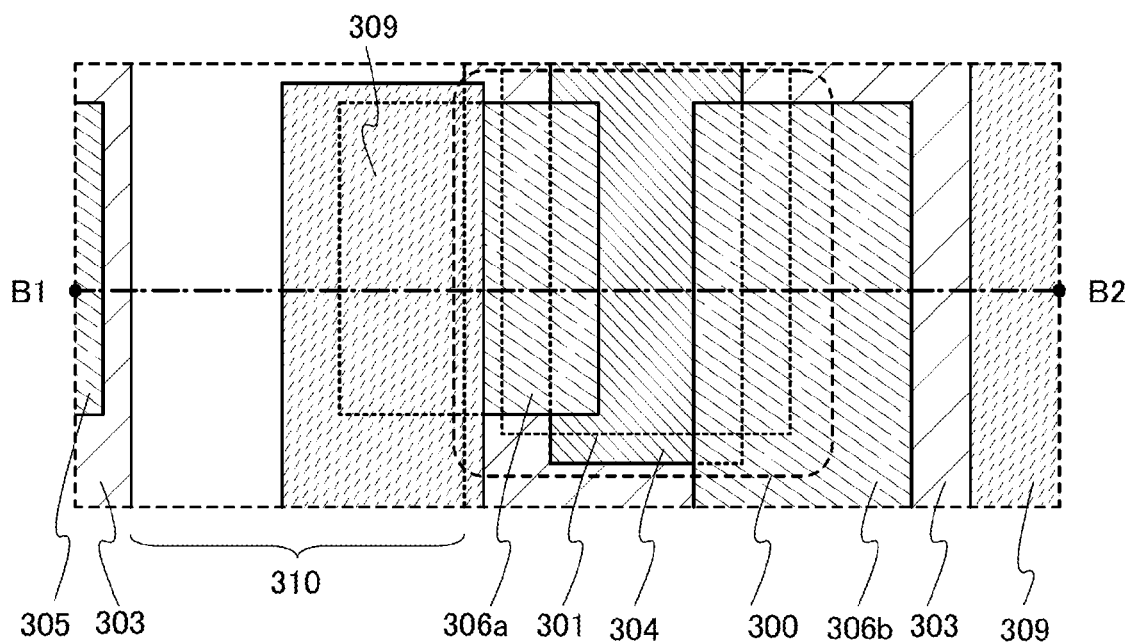

FIG. 19A shows an example of a cross-sectional view in the channel length direction of a transistor 300 included in a pixel. FIG. 19B shows an example of a top view of a light-emitting device having the cross-sectional structure illustrated in FIG. 19A. Note that in the top view of FIG. 19B, the gate insulating film 302, the insulating film 307, the insulating film 320, the EL layer 322, and the counter electrode 323 are omitted for a simple layout of the light-emitting device. A cross-sectional view along dashed-dotted line B1-B2 in FIG. 19B corresponds to FIG. 19A.

A region where the opening portion 310 is formed in the light-emitting device illustrated in FIGS. 19A and 19B is different from that in FIGS. 17A and 17B. In FIGS. 19A and 19B, part of the region where the opening portion 310 is formed overlaps with a region where the conductive film 306a is formed. The semiconductor film 303 positioned below the conductive film 306a is not removed in formation of the opening portion 310. Thus, in the region where the opening portion 310 is formed, the semiconductor film 303 is partly left, and an end portion of the semiconductor film 303 and an end portion of the insulating film 307 are not aligned with each other in the opening portion 310.

In one embodiment of the present invention, as illustrated in FIGS. 19A and 19B, even when part of the region where the opening portion 310 is formed overlaps with a region where the conductive film 306a is formed, the semiconductor film 303 positioned below the conductive film 306a can be separated from the semiconductor film 303 positioned below the conductive film 305. As a result, an effect of suppression of generation of a parasitic channel can be obtained.

Note that also in the case where part of the region where the opening portion 310 is formed overlaps with a region where the conductive film 306b is formed, an effect of suppression of generation of a parasitic channel can be obtained. Alternatively, also in the case where part of the region where the opening portion 310 is formed overlaps with a region where the conductive film 305 is formed, an effect of suppression of generation of a parasitic channel can be obtained.

Further, in the case where the region where the opening portion 310 is formed partly overlaps with the region where the conductive film 306a is formed, it is not necessary to form the opening portion 308 for connecting the conductive film 306a and the pixel electrode 309. Thus, a region where the opening portion 308 is formed does not need to be ensured; accordingly, high definition of a pixel portion can be achieved.

Figure 20A:
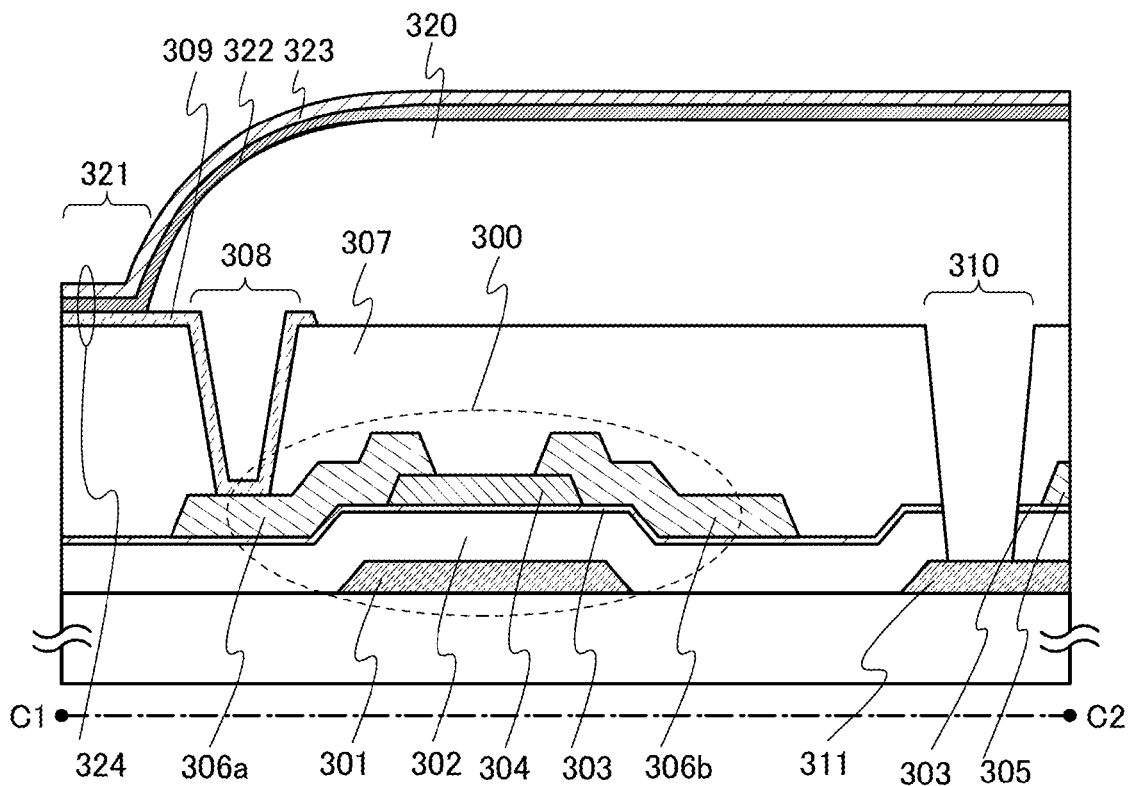
FIGS. 20A and 20B illustrate a structure of a light-emitting device.
Figure 20B:
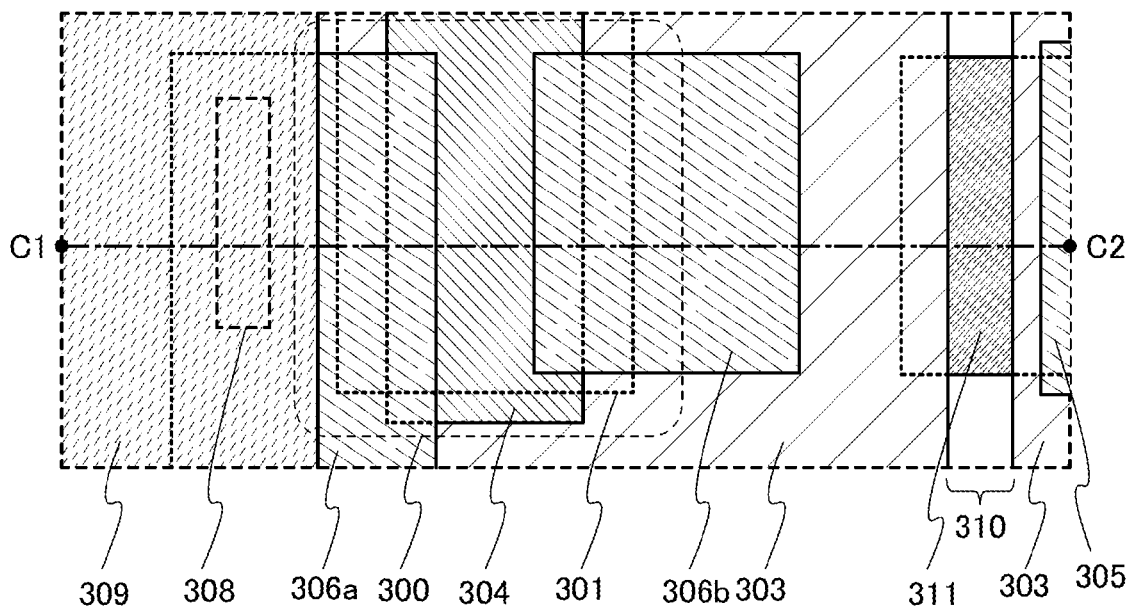

FIG. 20A shows an example of a cross-sectional view of a transistor 300 included in a pixel in the channel length direction. FIG. 20B shows an example of a top view of a light-emitting device having the cross-sectional structure illustrated in FIG. 20A. Note that in the top view of FIG. 20B, the gate insulating film 302, the insulating film 307, the insulating film 320, the EL layer 322, and the counter electrode 323 are omitted for a simple layout of the light-emitting device. A cross-sectional view along dashed-dotted line C1-C2 in FIG. 20B corresponds to FIG. 20A.

In the light-emitting device illustrated in FIGS. 20A and 20B, a conductive film 311 is formed in the same layer as the gate electrode 301, which is different from the structure of the light-emitting device illustrated in FIGS. 17A and 17B. Specifically, in FIGS. 20A and 20B, the conductive film 311 is provided over an insulating surface, the gate insulating film 302 and the semiconductor film 303 are stacked in this order over the conductive film 311, and the conductive film 305 is provided over the semiconductor film 303 to overlap with the conductive film 311.

In addition, in FIGS. 20A and 20B, a region where the opening portion 310 is formed partly overlaps with a region where the conductive film 311 is formed, whereby part of the conductive film 311 is exposed in the opening portion 310. Since the conductive film 311 is positioned below the semiconductor film 303, the semiconductor film 303 is partly removed in the opening portion 310. Thus, also in the case of FIGS. 20A and 20B, the semiconductor film 303 positioned below the conductive film 306a or 306b is separated from the semiconductor film 303 positioned below the conductive film 305; accordingly, an effect of suppression of generation of a parasitic channel can be obtained.

Note that in the light-emitting device according to one embodiment of the present invention, the semiconductor film 303 included in the transistor 300 contains a wide-gap semiconductor such as the above oxide semiconductor.

Embodiment 7

Next, an example of a specific structure of a pixel portion in a light-emitting device according to one embodiment of the present invention will be described.

Figure 24A:
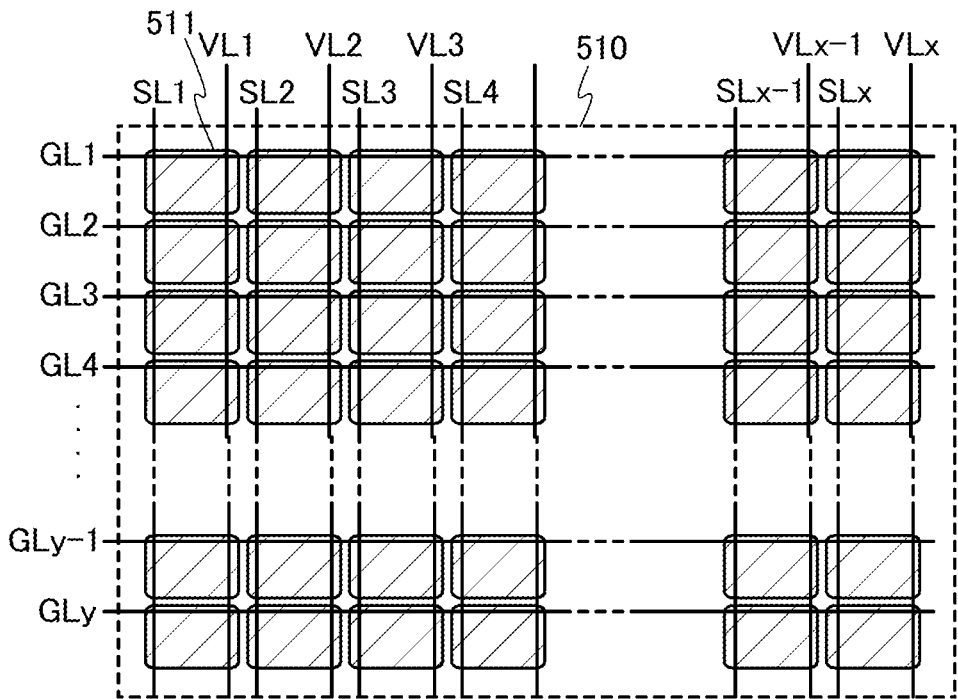
FIG. 24A illustrates a structure of a pixel portion of a light-emitting device.

FIG. 24A illustrates a structure example of a pixel portion 510. In FIG. 24A, y scan lines GL (GL1 to GLy) whose potentials are controlled by a scan line driver circuit, x signal lines SL (SL1 to SLx) whose potentials are controlled by a signal line driver circuit, and x power supply lines VL (VL1 to VLx) which supply potential to a pixel electrode are provided in the pixel portion 510.

The scan lines GL are connected to a plurality of pixels 511. Specifically, each scan line GL is connected to x pixels 511 in a given row, among the plurality of pixels 511 arranged in matrix.

Each signal line SL is connected to y pixels 511 in a given column, among the plurality of pixels 511 arranged in matrix of x columns and y rows in the pixel portion 510. Each power supply line VL is connected to y pixels 511 in a given column, among the plurality of pixels 511 arranged in matrix of x columns and y rows in the pixel portion 510.

Note that in this embodiment, the case where each pixel 511 is connected to the scan line GL, the signal line SL, and the power supply line VL is shown. However, the kinds and number of the lines connected to the pixel 511 can be determined by the structure, number, and arrangement of the pixels 511, as appropriate.

Figure 24B:
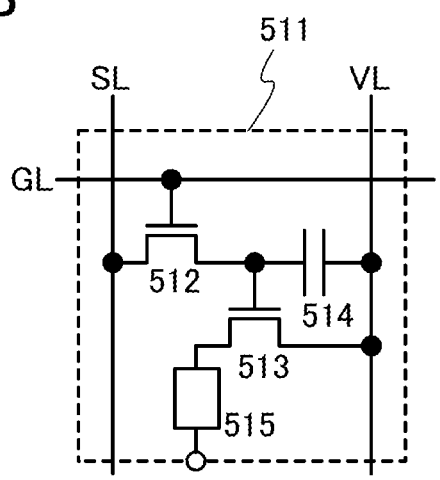
FIG. 24B is a circuit diagram of a pixel.

FIG. 24B shows an example of a circuit diagram of the pixel 511. The pixel 511 includes a transistor 512, a light-emitting element 515, a transistor 513, and a capacitor 514. The transistor 512 controls input of an image signal to the pixel 511. The light-emitting element 515 includes a pixel electrode, a counter electrode, and an EL layer provided between the pixel electrode and the counter electrode. The transistor 513 controls a potential of the pixel electrode of the light-emitting element 515 in accordance with an image signal. The capacitor 514 holds a potential of an image signal.

Note that the pixel 511 shown in FIG. 24B includes the capacitor 514. However, for example, in the case where gate capacitance generated between a gate electrode and an active layer of the transistor 513 is high, i.e., the case where a potential of an image signal can be sufficiently held by another capacitor, the capacitor 514 is not necessarily provided in the pixel 511.

Examples of the light-emitting element 515 include an element, luminance of which is controlled by current or voltage. For example, an OLED element or the like can be used as the light-emitting element 515. An OLED element includes at least an EL layer, an anode, and a cathode. One of the anode and the cathode serves as a pixel electrode and the other serves as a counter electrode. The EL layer is provided between the anode and the cathode and has a single-layer structure or a stacked structure. Such layers may include an inorganic compound. The luminescence in the EL layer includes light emission (fluorescence) which is obtained in returning from a singlet excited state to the ground state, and light emission (phosphorescence) which is obtained in returning from a triplet excited state to the ground state.

The potential of the pixel electrode in the light-emitting element 515 is controlled by an image signal input to the pixel 511. The luminance of the light-emitting element 515 depends on a potential difference between the pixel electrode and the counter electrode. In each of a plurality of pixels 511 included in the pixel portion 510, the luminance of the light-emitting element 515 is controlled in accordance with the image signal, so that an image is displayed on the pixel portion 510.

Note that the pixel 511 may further include another circuit element such as a transistor, a diode, a resistor, a capacitor, or an inductor, as needed.

Next, connection between the transistor 512, the transistor 513, the capacitor 514, and the light-emitting element 515 which are included in the pixel 511 is described.

One of a source terminal and a drain terminal of the transistor 512 is connected to a signal line SL, and the other of the source terminal and the drain terminal is connected to a gate electrode of the transistor 513. One of a source terminal and a drain terminal of the transistor 513 is connected to a power supply line VL, and the other of the source terminal and the drain terminal is connected to the light-emitting element 515. The light-emitting element 515 includes a pixel electrode, a counter electrode, and an EL layer that is positioned between the pixel electrode and the counter electrode. Specifically, the other of the source terminal and the drain terminal of the transistor 513 is connected to the pixel electrode of the light-emitting element 515. A potential (common potential) is supplied to the counter electrode of the light-emitting element 515.

A potential difference between the power supply potential and the common potential is such a level that a forward bias voltage which enables the light-emitting element 515 to emit light is applied between the pixel electrode and the counter electrode of the light-emitting element 515 when the transistor 513 is in an on state.

Note that the transistor 512 and the transistor 513 each include at least a gate electrode on one side of an active layer. Alternatively, the transistor 512 and the transistor 513 may include a pair of gate electrodes with the active layer interposed therebetween. In addition, each of the transistor 512 and the transistor 513 may be either a single-gate transistor which includes a single gate electrode and a single channel formation region, or a multi-gate transistor which includes a plurality of gate electrodes electrically connected to each other and thus includes a plurality of channel formation regions.

Next, an example of a method for driving the light-emitting device in FIGS. 24A and 24B is described.

The scan lines GL1 to GLy are sequentially selected. For example, when the scan line GLj (j is a natural number greater than or equal to 1 and less than or equal to y) is selected, the transistors 512 each of which has a gate electrode connected to the scan line GLj are turned on. Since the transistors 512 are turned on, the potentials of image signals that have been input to the signal lines SL1 to SLx are supplied to the gate electrodes of the corresponding transistors 513. After the selection of the scan line GLj is finished, the corresponding transistors 512 are turned off, so that the potentials of the image signals are held at the gate electrodes of the transistors 513.

Then, in the case where the transistor 513 are on in accordance with the potentials of the image signals, these light-emitting elements 515 are supplied with current and then turned on. The value of current flowing through the light-emitting element 515 is determined by a drain current of the transistor 513, and thus luminance of the light-emitting element 515 depends on the potential of the image signal. On the other hand, in the case where the transistors 513 are off in accordance with the potential of the image signal, current is not supplied to the light-emitting elements 515, so that the light-emitting elements 515 emit no light.

An image can be displayed by the above-stated operation.

Although FIG. 24B shows the case where one transistor 512 is used as a switching element, the present invention is not limited to this structure. In the pixel 511, a plurality of transistors may be used as one switching element. In the case where a plurality of transistors function as switching elements, the plurality of transistors may be connected to each other in parallel, in series, or in combination of parallel connection and series connection.

When an oxide semiconductor is included in a channel formation region in the transistor 512, the transistor 512 with an extremely small amount of off-state current and high withstand voltage can be obtained. Further, when the transistor 512 having the above-described structure is used as a switching element, leakage of electric charge accumulated in the gate electrode of the transistor 513 can be prevented more effectively than the case of using a transistor including a normal semiconductor material such as silicon or germanium.

With use of the transistor 512 with an extremely small amount of off-state current, a period during which potential of the gate electrode of the transistor 513 can be held can be longer. Accordingly, in the case where image signals each having the same image data are written to a pixel portion 510 for some consecutive frame periods, like a still image, display of an image can be maintained even when driving frequency is low, in other words, the number of writing operations of an image signal to the pixel portion 510, during a certain period is reduced. For example, the transistor 512 in which a highly purified oxide semiconductor film is used as an active layer is employed, whereby an interval between writings of image signals can be increased to 10 seconds or more, preferably 30 seconds or more, further preferably 1 minute or more. As the interval between writings of image signals is made longer, power consumption can be further reduced.

In addition, since the potential of an image signal can be held for a longer period, the quality of the displayed image can be prevented from being lowered even when the capacitor 514 for holding the potential of an image signal is not connected to the gate electrode of the transistor 513. Thus, it is possible to increase the aperture ratio by reducing the size of the capacitor 514 or by not providing the capacitor 514, which leads to reduction in power consumption of the light-emitting device.

Figure 21:
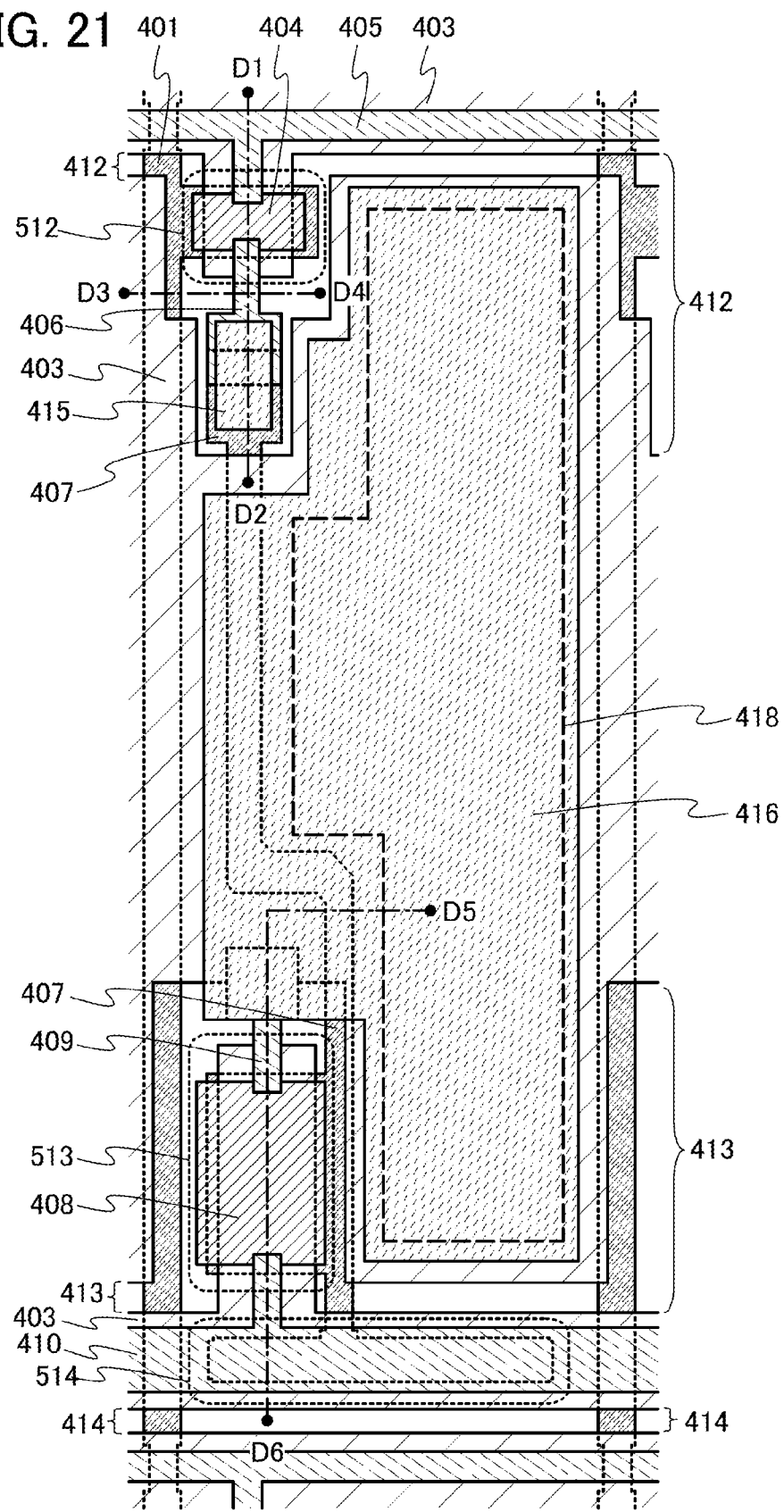
FIG. 21 is a top view of a pixel of a light-emitting device.
Figure 22:
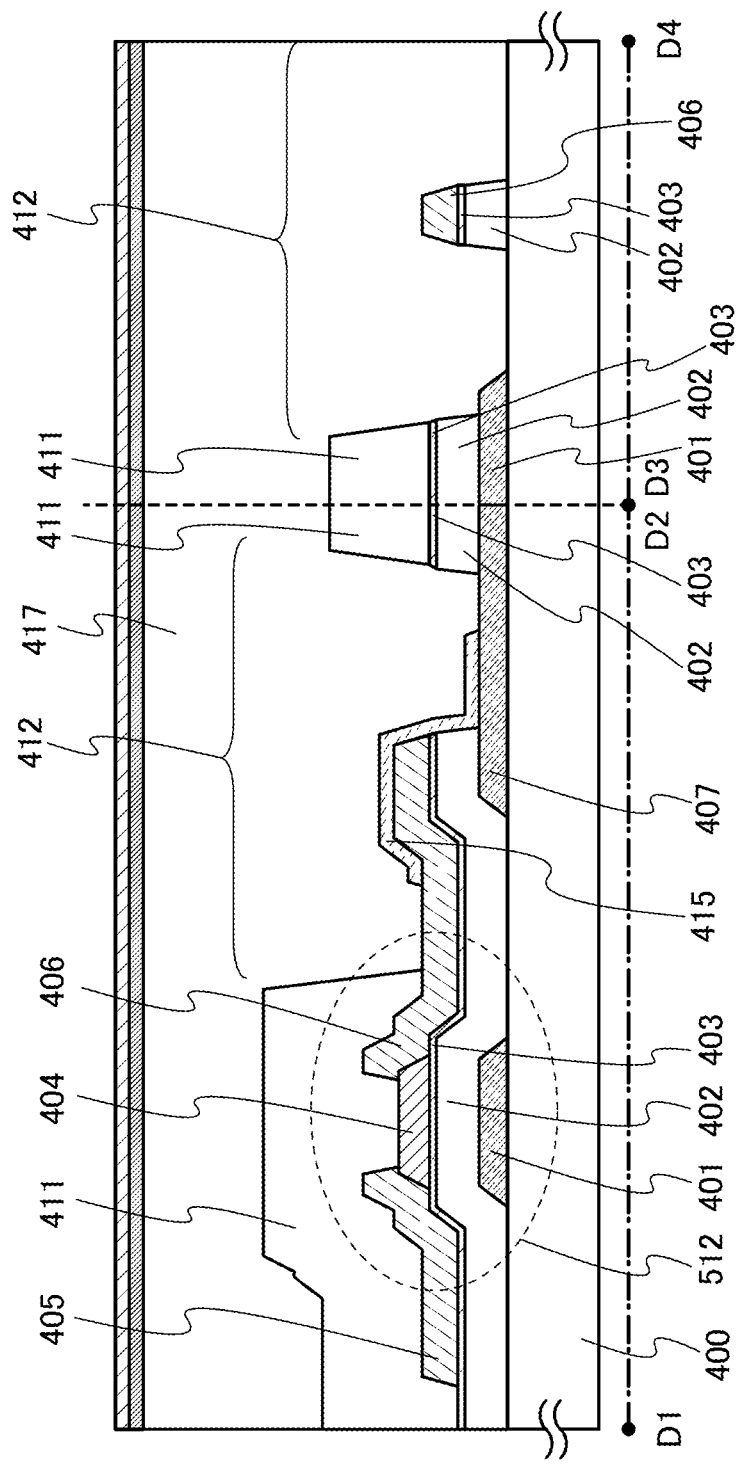
FIG. 22 is a cross-sectional view of a pixel of a light-emitting device.
Figure 23:
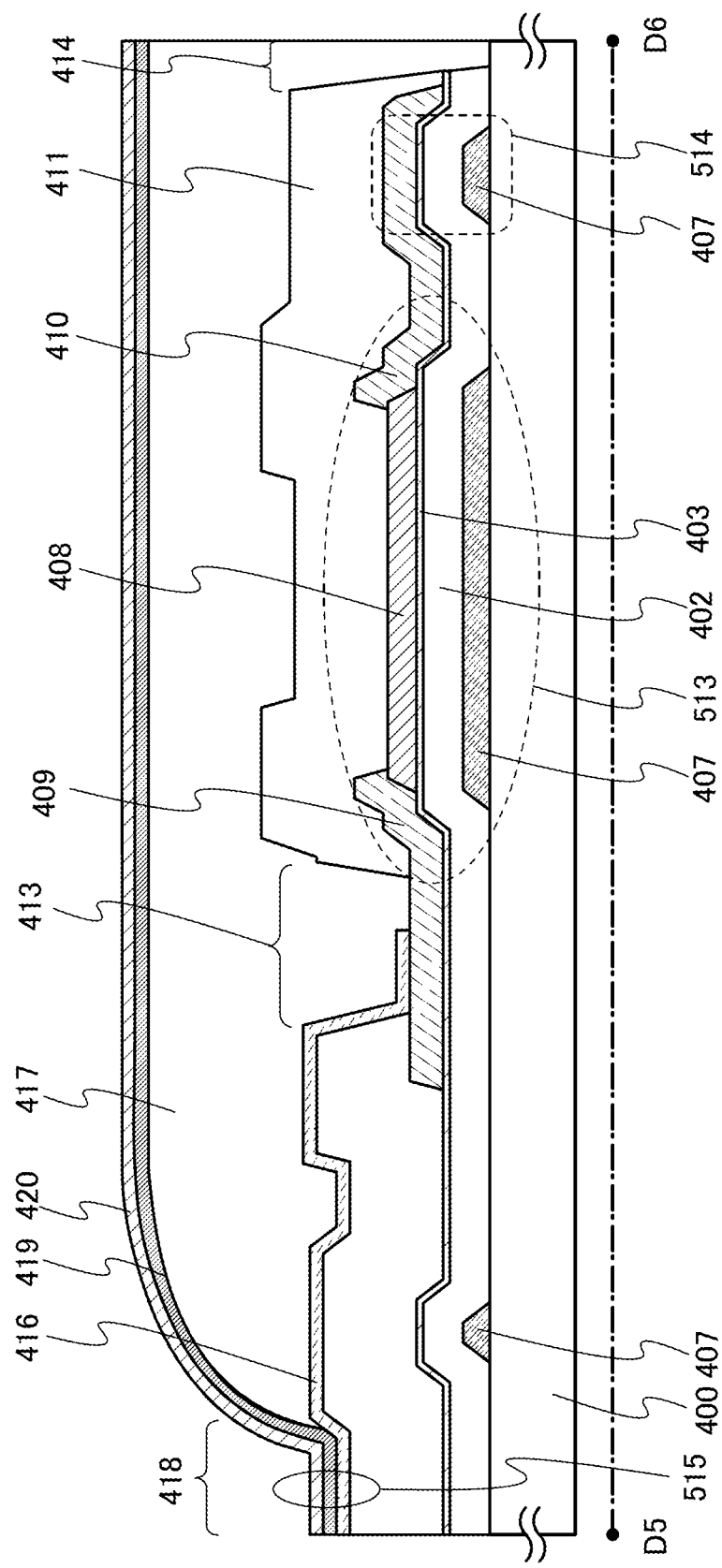
FIG. 23 is a cross-sectional view of a pixel of a light-emitting device.

Next, a layout of the pixel 511 shown in FIG. 24B is described with reference to FIG. 21, FIG. 22, and FIG. 23. FIG. 21 is an example of a top view of the pixel 511. FIG. 22 corresponds to an example of a cross-sectional view taken along dashed-dotted line D1-D2 and dashed-dotted line D3-D4 of the top view in FIG. 21. FIG. 23 corresponds to an example of a cross-sectional view taken along dashed-dotted line D5-D6 of the top view in FIG. 21. Note that in order to clearly show the layout of the pixel 511, various insulating films are not illustrated in the top view of the pixel 511 in FIG. 21. In addition, in order to clearly show the layout of semiconductor elements in the pixel 511, the EL layer and the counter electrode of the light-emitting element 515 are not illustrated in the top view of the pixel 511 in FIG. 21.

In the pixel 511 shown in FIG. 21, FIG. 22, and FIG. 23, the transistor 512 includes, over a substrate 400 having an insulating surface, a conductive film 401 functioning as a gate electrode, a gate insulating film 402 over the conductive film 401, a semiconductor film 403 provided over the gate insulating film 402 to overlap with the conductive film 401, an insulating film 404 which functions as a channel protective film and is provided over the semiconductor film 403 to overlap with the conductive film 401, and a conductive film 405 and a conductive film 406 which function as a source terminal or a drain terminal and are provided over the semiconductor film 403.

The conductive film 401 also functions as the scan line GL which supplies a potential to the gate electrode of the transistor 512. The conductive film 405 also functions as the signal line SL which supplies a potential of an image signal to the pixel 511.

Further, the transistor 513 includes, over the substrate 400 having an insulating surface, a conductive film 407 functioning as a gate electrode, the gate insulating film 402 provided over the conductive film 407, the semiconductor film 403 provided over the gate insulating film 402 to overlap with the conductive film 407, an insulating film 408 which functions as a channel protective film and provided over the semiconductor film 403 to overlap with the conductive film 407, and a conductive film 409 and a conductive film 410 which function as a source terminal or a drain terminal and is provided over the semiconductor film 403.

The capacitor 514 includes over the substrate 400 having an insulating surface, the conductive film 407, the gate insulating film 402 and the semiconductor film 403 over the conductive film 407, and the conductive film 410 provided over the gate insulating film 402 and the semiconductor film 403 so as to overlap with the conductive film 407.

In addition, an insulating film 411 is provided over the conductive film 405, the conductive film 406, the conductive film 409, and the conductive film 410. An opening portion 412, an opening portion 413, and an opening portion 414 are provided in the insulating film 411, the semiconductor film 403, and the gate insulating film 402.

The opening portion 412 is provided between the conductive film 406 and the conductive film 409. A region where the opening portion 412 is formed partly overlaps with a region where the conductive film 406 is formed and a region where the conductive film 407 is formed. In the opening portion 412, part of the insulating film over the conductive film 406, part of the insulating film 411 over the conductive film 407, the semiconductor film 403, and the gate insulating film 402 are removed. The conductive film 406 and the conductive film 407 are electrically connected with a conductive film 415 provided over the conductive film 406 and the conductive film 407.

The opening portion 413 is provided between the conductive film 410 and the conductive film 405 and the conductive film 406. A region where the opening portion 413 is formed partly overlaps with a region where the conductive film 409 is formed. In the opening portion 413, part of the insulating film 411 over the conductive film 409 is removed, the conductive film 409 is connected to a conductive film 416 functioning as a pixel electrode over the conductive film 409 and the insulating film 411.

The opening portion 414 is provided between the conductive film 410 and the conductive film 405 of the adjacent pixel 511. In the opening portion 414, the insulating film 411, the semiconductor film 403, and the gate insulating film 402 are removed.

Note that FIG. 21, FIG. 22, and FIG. 23 each show the case where the region where the opening portion 412 is formed partly overlaps with the region where the conductive film 406 is formed and the region where the conductive film 407 is formed. In this case, connection between the conductive film 406 and the conductive film 415 and connection between the conductive film 407 and the conductive film 415 are both made in the opening portion 412. However, in one embodiment of the present invention, connection between the conductive film 406 and the conductive film 415 and connection between the conductive film 407 and the conductive film 415 may be made in different opening portions.

Figure 25:
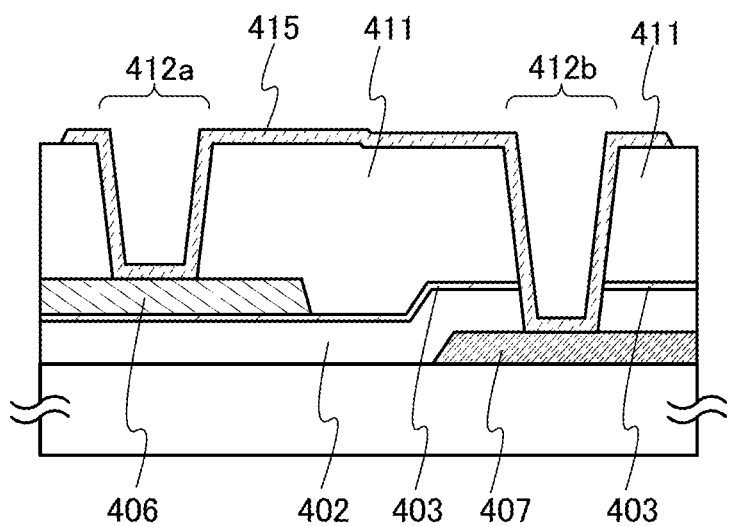
FIG. 25 illustrates a structure of a light-emitting device.

FIG. 25 shows an example of a cross-sectional view of the pixel 511 in a connection portion of the conductive film 415 with the conductive film 406 and the conductive film 407. In FIG. 25, the conductive film 406 and the conductive film 415 are connected to each other in an opening portion 412a formed in the insulating film 411. Further, the conductive film 407 and the conductive film 415 are connected to each other in an opening portion 412b formed in the insulating film, the semiconductor film 403, and the gate insulating film 402.

However, as shown in FIG. 21, FIG. 22, and FIG. 23, in the case where the connection between the conductive film 406 and the conductive film 415 and the connection between the conductive film 407 and the conductive film 415 are both made in the opening portion 412, regions for forming a plurality of opening portions are not necessarily ensured; thus, high definition of the pixel portion 510 can be achieved.

Further, an insulating film 417 is provided over the insulating film 411 so as to partly overlap with the conductive film 416. An opening portion 418 formed in the insulating film 417 partly overlaps with the conductive film 416. In the opening portion 418, an EL layer 419 and a conductive film 420 functioning as a counter electrode are stacked in this order over the conductive film 416. A portion where the conductive film 416, the EL layer 419, and the conductive film 420 are stacked functions as the light-emitting element 515.

This embodiment can be implemented in combination with any of the other embodiments as appropriate.

Embodiment 8

In this embodiment, a method for manufacturing a light-emitting device according to one embodiment of the present invention will be described with use of the pixel 511 shown in FIG. 21, FIG. 22, and FIG. 23 as an example.

Figure 26A:
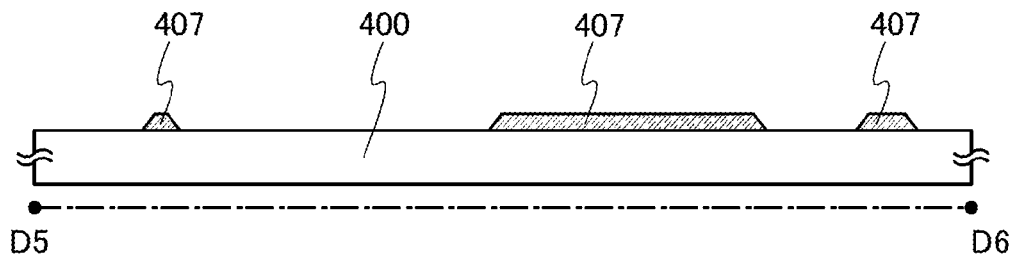
FIGS. 26A to 26D illustrate a method for manufacturing a light-emitting device.

First, as illustrated in FIG. 26A, over the substrate 400 having an insulating surface, the conductive film 407 functioning as a gate electrode is formed.

Although there is no particular limitation on a substrate that can be used as the substrate 400 having an insulating surface, the substrate needs to have heat resistance high enough to withstand at least heat treatment to be performed in a later step. For example, a glass substrate manufactured by a fusion process or a float process can be used. In addition, when the temperature of the heat treatment performed later is high, a glass substrate having a strain point of 730° C. or higher is preferably used. As a glass substrate, a glass material such as aluminosilicate glass, aluminoborosilicate glass, or barium borosilicate glass is used, for example.

Note that instead of the above glass substrate, a substrate formed of an insulator such as a ceramic substrate, a quartz substrate, or a sapphire substrate may be used. Alternatively, crystallized glass or the like may be used. Alternatively, a metal substrate such as a stainless steel alloy substrate the surface of which is provided with an insulating film may be used. Note that when the light-emitting device has a bottom emission structure in which light emitted from the light-emitting element 515 travels toward the substrate 400 side, a light-transmitting substrate is used as the substrate 400.

The conductive film 407 can be formed using a single layer or a stacked layer of a conductive film including a metal material such as molybdenum, titanium, chromium, tantalum, tungsten, aluminum, copper, neodymium, scandium, or niobium, an alloy material which contains any of these metal materials as a main component, or a nitride of any of these metals. Note that aluminum or copper can also be used as such a metal material if it can withstand the temperature of heat treatment to be performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, when the conductive film 407 has a two-layer structure, it is preferable to employ any of a two-layer structure in which a copper film is stacked over a titanium film, a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked. When the conductive film 407 has a three-layer structure in which a titanium nitride film, a copper film, and a tungsten film are stacked.

A light-transmitting metal oxide of indium oxide, indium oxide-tin oxide, indium oxide-zinc oxide, zinc oxide, zinc aluminum oxide, zinc aluminum oxynitride, gallium zinc oxide, or the like can be used for the conductive film 407.

The thickness of the conductive film 407 is 10 nm to 400 nm, preferably 100 nm to 200 nm. In this embodiment, the conductive film 407 is formed in the following manner: a tungsten film is formed to a thickness of 200 nm by a sputtering method, and the tungsten film is processed to have a desired shape by etching with a photolithography method (patterning). Note that the end portion of the formed conductive film 407 is preferably tapered because coverage with the gate insulating film 402 stacked thereover is improved. Note that a resist mask may be formed by an inkjet method. Formation of the resist mask by an inkjet method needs no photomask; thus, manufacturing cost can be reduced.

Although in this embodiment, the conductive film 407 is formed directly on the substrate 400, an insulating film functioning as a base film may be formed over the substrate 400, and then the conductive film 407 may be formed over the base film. As the base film, for example, a single layer of a silicon oxide film, a silicon oxynitride film, a silicon nitride film, a silicon nitride oxide film, an aluminum nitride film, or an aluminum nitride oxide film or a stacked layer of a plurality of these films can be used. In particular, an insulating film having a high barrier property, for example, a silicon nitride film, a silicon nitride oxide film, an aluminum nitride film, an aluminum oxide film, or an aluminum nitride oxide film is used for the base film, so that impurities in an atmosphere, such as moisture or hydrogen, or impurities included in the substrate 400, such as an alkali metal or a heavy metal, can be prevented from entering the semiconductor film 403 formed later, the gate insulating film 402 formed later or at the interface between the semiconductor film 403 and another insulating film and the vicinity thereof.

Also, in this specification, an oxynitride compound denotes a material containing a higher quantity of oxygen than that of nitrogen, and a nitride oxide compound denotes a material containing a higher quantity of nitrogen than that of oxygen.

Figure 28:
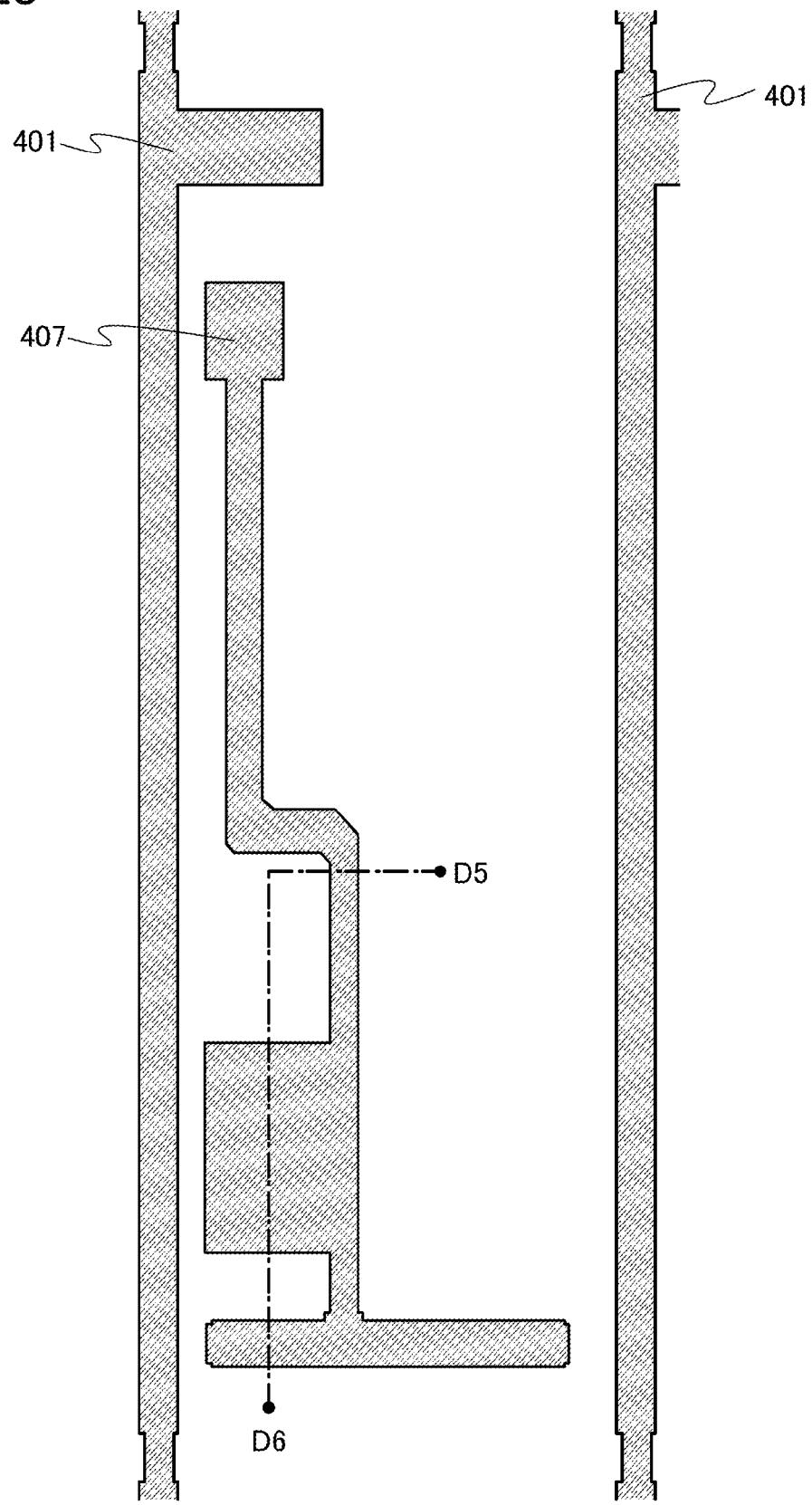
FIG. 28 illustrates a method for manufacturing a light-emitting device.

Note that FIG. 28 is a top view of the light-emitting device at the time when the above steps are finished. A cross-sectional view along dashed-dotted line D5-D6 in FIG. 28 corresponds to FIG. 26A.

Figure 26B:
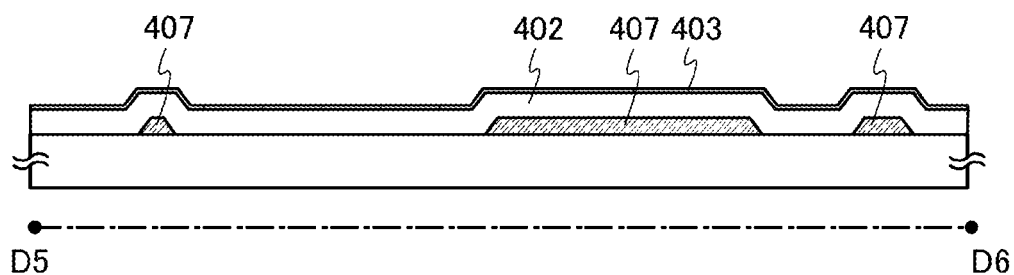

Next, as illustrated in FIG. 26B, the gate insulating film 402 is formed over the conductive film 407. The gate insulating film 402 can be formed with a single-layer structure or a stacked structure including any of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a yttrium oxide film, a gallium oxide film, a lanthanum oxide film, or a tantalum oxide film, by a plasma CVD method, a sputtering method, or the like. It is preferable that the gate insulating film 402 contain impurities such as moisture and hydrogen as little as possible.

The gate insulating film 402 may be formed with a single insulating film or a stacked structure including a plurality of insulating films. In either structure, the gate insulating film 402 is preferably formed so that an insulating film containing a larger amount of oxygen than the stoichiometric amount thereof is in contact with the semiconductor film 403 which is formed in a later step. With the above structure, oxygen can be supplied from the gate insulating film 402 to the semiconductor film 403, so that the transistor 513 with favorable electric characteristics can be provided.

Further, in the case of forming the gate insulating film 402 with a structure in which an insulating film having a high barrier property and an insulating film containing oxygen are stacked, the insulating film having a high barrier property is preferably formed between the insulating film containing oxygen and the conductive film 407. The insulating film having a high barrier property can prevent impurities in an atmosphere, such as moisture or hydrogen, or impurities in the substrate 400, such as an alkali metal or a heavy metal, from entering the semiconductor film 403, the gate insulating film 402, or the interface between the semiconductor film 403 and another insulating film and the vicinity thereof. As the insulating film having a high barrier property, a silicon nitride film, a silicon nitride oxide film, an aluminum nitride film, an aluminum oxide film, an aluminum nitride oxide film, or the like can be given, for example.

The thickness of the gate insulating film 402 may be determined as appropriate, depending on characteristics necessary for the transistor 513, for example, the thickness is greater than or equal to 1 nm and less than or equal to 800 nm, preferably greater than or equal to 200 nm and less than or equal to 500 nm. When the gate insulating film 402 is formed to have a large thickness, the withstand voltage of the transistor 513 can be improved. In this embodiment, a silicon oxynitride film with a thickness of 100 nm which is formed by a plasma CVD method is used as the gate insulating film 402.

Next, as illustrated in FIG. 26B, over the gate insulating film 402, the semiconductor film 403 is formed to have a thickness greater than or equal to 2 nm and less than or equal to 200 nm, preferably greater than or equal to 3 nm and less than or equal to 50 nm, further preferably greater than or equal to 3 nm and less than or equal to 20 nm. The semiconductor film 403 is formed by a sputtering method with use of an oxide semiconductor as a target. Further, the semiconductor film 403 can be formed by a sputtering method in a rare gas (e.g., argon) atmosphere, an oxygen atmosphere, or a mixed atmosphere of a rare gas (e.g., argon) and oxygen.

Note that before the oxide semiconductor film is formed by a sputtering method, dust on a surface of the gate insulating film 402 is preferably removed by reverse sputtering in which an argon gas is introduced and plasma is generated. The reverse sputtering refers to a method in which voltage is applied to a substrate side, but not to a target side, in an argon atmosphere by using an RF power supply and plasma is generated in the vicinity of the substrate to modify a surface. Note that a nitrogen atmosphere, a helium atmosphere, or the like may be used instead of an argon atmosphere. Alternatively, an argon atmosphere to which oxygen, nitrous oxide, or the like is added may be used. Alternatively, an argon atmosphere to which chlorine, carbon tetrafluoride, or the like is added may be used.

As an oxide semiconductor used for the semiconductor film 403, the following can be given: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like.

For example, the semiconductor film 403 can be formed by a sputtering method using a target including indium (In), gallium (Ga), and zinc (Zn). In the case where the In—Ga—Zn-based semiconductor film 403 is deposited by a sputtering method, it is preferable to use an In—Ga—Zn-based oxide target having an atomic ratio where In:Ga:Zn=1:1:1, 4:2:3, 3:1:2, 1:1:2, 2:1:3, or 3:1:4. When an oxide semiconductor film is formed using an In—Ga—Zn-based oxide target having the aforementioned atomic ratio, a polycrystal or CAAC is readily formed. The filling factor of the target including In, Ga, and Zn is higher than or equal to 90% and lower than or equal to 100%, and preferably higher than or equal to 95% and lower than or equal to 100%. With use of the target with high filling factor, a dense oxide semiconductor film is formed.

In the case where an In—Zn-based material is used as an oxide semiconductor, a target used has a composition where In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor as the semiconductor film 403 which has an atomic ratio where In:Zn: 0=X:Y:Z, the relation of Z>(1.5X+Y) is satisfied. The mobility can be improved by keeping the ratio of Zn within the above range.

In the case where a material of an In—Sn—Zn-based oxide is used as the oxide semiconductor, a composition of the target to be used is preferably In:Sn:Zn=1:2:2, 2:1:3, 1:1:1, or 20:45:35 in an atomic ratio.

In this embodiment, the oxide semiconductor film is formed over the substrate 400 in such a manner that the substrate is held in the treatment chamber kept at reduced pressure, a sputtering gas from which hydrogen and moisture have been removed is introduced into the treatment chamber while moisture remaining therein is removed, and the above-described target is used. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (preferably, also a compound containing a carbon atom), and the like are removed, whereby the concentration of impurities contained in the oxide semiconductor film formed in the treatment chamber can be reduced.

There are three methods for forming the semiconductor film 403 including a CAAC-OS. One of the methods (first method) is to form the semiconductor film 403 at a temperature higher than or equal to 200° C. and lower than or equal to 450° C. Another method (second method) is to form the semiconductor film 403 with a small thickness and then heat it at a temperature higher than or equal to 200° C. and lower than or equal to 700° C. The other method (third method) is to form a first oxide semiconductor film with a small thickness, then heat it at a temperature higher than or equal to 200° C. and lower than or equal to 700° C., and form a second oxide semiconductor film, thereby forming the semiconductor film 403.

In this embodiment, the semiconductor film 403 including an In—Ga—Zn-based oxide semiconductor is formed to have a thickness of 25 nm under such conditions that the distance between the substrate 400 and the target is 100 mm, the pressure is 0.4 Pa, the direct current (DC) power source is 0.5 kW, the substrate temperature is 250° C., and the argon flow rate and the oxygen flow rate are 30 sccm and 15 sccm, respectively.

In order for the semiconductor film 403 to contain impurities such as hydrogen, a hydroxyl group, or moisture as little as possible, it is preferable to preheat the substrate 400 provided with the gate insulating film 402 in a preheating chamber of a sputtering apparatus before the film formation so that impurities such as moisture or hydrogen adsorbed on the substrate 400 is discharged and removed. The temperature for the preheating is higher than or equal to 100° C. and lower than or equal to 400° C., preferably, higher than or equal to 150° C. and lower than or equal to 300° C.

Note that, in some cases, the semiconductor film 403 formed by sputtering or the like includes a large amount of moisture or hydrogen (including a hydroxyl group) as impurities. Moisture or hydrogen easily forms donor levels and thus serves as an impurity in the oxide semiconductor. In one embodiment of the present invention, in order to reduce impurities such as moisture or hydrogen in the semiconductor film 403 (to dehydrate or dehydrogenate the semiconductor film), the semiconductor film 403 is subjected to heat treatment in a reduced-pressure atmosphere, an inert gas atmosphere of nitrogen, a rare gas, or the like, after the semiconductor film 403 is formed.

By heat treatment performed on the semiconductor film 403, moisture or hydrogen in the semiconductor film 403 can be released. Specifically, heat treatment may be performed at a temperature higher than or equal to 250° C. and lower than or equal to 750° C., preferably higher than or equal to 400° C. and lower than the strain point of a substrate. When RTA is used for the heat treatment, dehydration or dehydrogenation can be performed in a short time; thus, treatment can be performed even at a temperature higher than the strain point of a glass substrate. In this embodiment, heat treatment is performed in an ultra-dry air atmosphere at 450° C. for one hour.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), further preferably greater than or equal to 7 N (99.99999%) (i.e., the impurity concentration is preferably less than or equal to 1 ppm, further preferably less than or equal to 0.1 ppm).

Through the above steps, the concentration of moisture or hydrogen in the semiconductor film 403 can be reduced. Note that in the semiconductor film 403, as well as a removal of moisture or hydrogen, an increase of oxygen vacancies due to release of oxygen might be caused by the heat treatment. Thus, it is preferable that treatment for supplying oxygen to the semiconductor film 403 be performed after the heat treatment, so that oxygen vacancies are reduced.

With the highly purified semiconductor film 403 in which the concentration of hydrogen or moisture is reduced and oxygen vacancies are reduced, the transistor 513 with high withstand voltage and an extremely small amount of off-state current can be manufactured.

For example, by heat treatment performed in an atmosphere containing oxygen, oxygen can be supplied to the semiconductor film 403. Heat treatment for supplying oxygen may be performed under conditions similar to those of the above heat treatment for reducing the concentration of moisture or hydrogen. Note that heat treatment for supplying oxygen is performed in an atmosphere such as an oxygen gas or an ultra dry air atmosphere (the moisture content is lower than or equal to 20 ppm (−55° C. by conversion into a dew point), preferably lower than or equal to 1 ppm, further preferably lower than or equal to 10 ppb, in the measurement with use of a dew point meter of a cavity ring down laser spectroscopy (CRDS) system).

It is preferable that in the gas containing oxygen, the concentration of water or hydrogen be low. Specifically, the concentration of impurities in the oxygen gas is lower than or equal to 1 ppm, preferably lower than or equal to 0.1 ppm.

Alternatively, as a method for supplying oxygen to the semiconductor film 403, an ion implantation method, an ion doping method, a plasma immersion ion implantation method, plasma treatment, or the like can be used. If a crystal part included in the semiconductor film 403 is damaged after oxygen is supplied to the semiconductor film 403, heat treatment may be performed so that the damaged crystal part is repaired.

A resist mask used for forming the semiconductor film 403 may be formed by an inkjet method. Formation of the resist mask by an inkjet method needs no photomask; thus, manufacturing cost can be reduced.

Figure 26C:
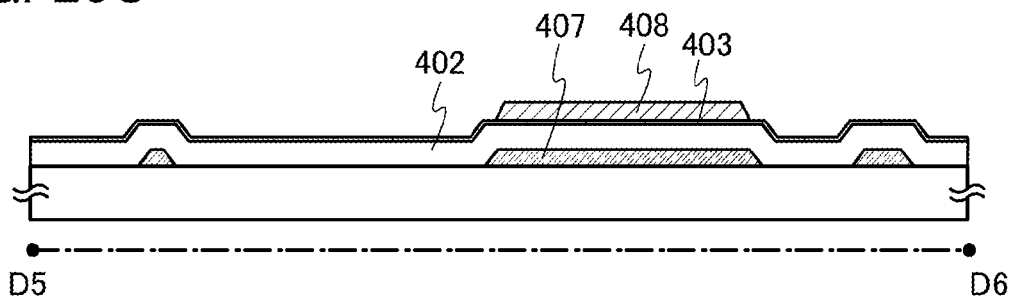

Next, as illustrated in FIG. 26C, the island-shaped insulating film 408 functioning as a channel protective film is formed in the following manner: an insulating film is formed over the semiconductor film 403, and then the insulating film is etched with a photolithography method to have a desired shape. The insulating film 408 is provided over the semiconductor film 403 to overlap with the conductive film 407.

The thickness of the insulating film 408 is greater than or equal to 50 nm and less than or equal to 600 nm, preferably greater than or equal to 100 nm and less than or equal to 400 nm. The insulating film 408 can be formed using a structure and a material similar to those of the gate insulating film 402. Further, the insulating film 408 preferably contains impurities such as moisture or hydrogen as little as possible and contains a large amount of oxygen exceeding its stoichiometry, like the gate insulating film 402. With the above structure, the concentration of impurities such as moisture or hydrogen in the semiconductor film 403 can be low, and oxygen can be supplied to the semiconductor film 403 from the insulating film 408. Thus, the transistor 513 to be manufactured can have favorable electric characteristics.

In this embodiment, a silicon oxynitride film with a thickness of 300 nm formed by a plasma CVD method is used as the insulating film 408.

Note that for the insulating film 408, a metal oxide which contains at least one of In and Zn and whose insulating property is improved when Ti, Zr, Hf, Ge, Ce, or the like is included may be used. The insulating property of such a metal oxide is superior to that of the semiconductor film 403.

For example, for the insulating film 408, an $In\text{-}M_1\text{-}M_2\text{-}Zn$-based oxide may be used. An element $M_1$ refers to any of trivalent elements belonging to Group 3A, Group 3B, and Group 4A. An element $M_2$ refers to any of quadrivalent elements belonging to Group 4A and Group 4B. Specifically, in the case where Ga is used for the element $M_1$, part of trivalent Ga is substituted with a quadrivalent element in the $In\text{-}M_1\text{-}M_2\text{-}Zn$-based oxide. The number of bonds of a quadrivalent element is larger by one than the number of bonds of a trivalent element. Thus, when part of trivalent elements is substituted with a quadrivalent element, the bonding force between oxygen and a metal element ($M_1$ or $M_2$) included in the $In\text{-}M_1\text{-}M_2\text{-}Zn$-based oxide can be increased. Therefore, when the $In\text{-}M_1\text{-}M_2\text{-}Zn$-based oxide is used for the insulating film 408, the insulating property of the insulating film 408 can be high. Specifically, examples of the element $M_2$ include Ti, Zr, Hf, Ge, and Ce.

For example, with use of a target in which In:Zr:Ga:Zn=3:0.05:0.95:2, the insulating film 408 may be formed using an $In\text{-}M_1\text{-}M_2\text{-}Zn$-based oxide by a sputtering method.

Alternatively, for example, an In-M-Zn-based oxide represented by a chemical formula $InMZnO_x$ may be used for the insulating film 408. An element M is an element for making the In-M-Zn-based oxide have a higher insulating property than the metal oxide included in the semiconductor film 403. For example, as the element M, a quadrivalent element such as Ti, Zr, Hf, Ge, or Ce can be employed. Since the number of bonds of a quadrivalent element is larger by one than the number of bonds of a trivalent element, in the In-M-Zn-based oxide including such a quadrivalent element as the element M, the bonding force between the element M and oxygen is strong. Thus, when the In-M-Zn-based oxide is used for the insulating film 408, the insulating property of the insulating film 408 can be increased.

For example, the energy gap of an In—Zr—Zn-based oxide in which Zr is used as the element M is larger than the energy gap of an In—Ga—Zn-based oxide (about 3.2 eV). In other words, the In—Zr—Zn-based oxide has a higher insulating property than the In—Ga—Zn-based oxide.

Further, electronegativity of yttrium is lower than that of Ga. When in the In-$M_1$-$M_2$-Zn-based oxide, yttrium is employed as the element $M_2$, a difference in electronegativity between oxygen and the element $M_2$ can be large, and the bond formed by an ionic bond with oxygen in the metal oxide can be strengthened. Thus, even in the case where yttrium is employed as the element $M_2$, the insulating property of the insulating film 408 including the In-$M_1$-$M_2$-Zn-based oxide can be enhanced. Further, when in the In-M-Zn-based oxide, yttrium is employed as the element M, a difference in electronegativity between oxygen and the element M can be large, and the bond formed by an ionic bond with oxygen in the metal oxide can be strengthened. Thus, even in the case where yttrium is employed as the element M, the insulating property of the insulating film 408 including the In-M-Zn-based oxide can be increased.

Further, in the In-M-Zn-based oxide, the content of the element M is greater than or equal to 0.3 times and less than 1.3 times as high as the content of In. Furthermore, in the In-M-Zn-based oxide, the content of the element M is greater than or equal to 0.3 times and less than 1.3 times as high as the content of Zn. As the relative number of In or Zn with respect to the element M becomes smaller, the insulating property of the insulating film 408 can be higher.

Specifically, in the case where the metal oxide material including the element M is formed by a sputtering method, it is preferable to use a metal oxide target with an atomic ratio where In:M:Zn=1:1:1, 3:1:3, 3:2:4, 2:1:3, 4:5:4, or 4:2:3.

When an In-M-Zn-based oxide or an In-$M_1$-$M_2$-Zn-based oxide is used for the insulating film 408, an interface between the insulating film 408 and the semiconductor film 403 can be kept in a favorable state, and the transistor 513 with favorable electric characteristics can be obtained.

Impurities are easily attached onto a surface of the semiconductor film 403, which is exposed by etching performed for forming the insulating film 408. The above impurities include an element included in an etching gas or an etchant used for etching or an element existing in the treatment chamber where etching is performed. As specific impurities, boron, chlorine, fluorine, carbon, aluminum, or the like can be given.

When the above impurities are attached on the surface of the semiconductor film 403, an increase in the amount of off-state current of the transistor or deterioration in electric characteristics of the transistor is likely to occur. In addition, a parasitic channel is easily generated in the semiconductor film 403, whereby conductive films which should be electrically isolated are likely to be electrically connected through the semiconductor film 403. Thus, in one embodiment of the present invention, after etching for formation of the insulating film 408 is performed, cleaning treatment for removing impurities which are supposed to be attached on the surfaces of the semiconductor film 403 and the insulating film 408 is performed.

The cleaning treatment can be performed with use of an alkaline solution such as a tetramethyl ammonium hydroxide (TMAH) solution, water, dilute hydrofluoric acid, or the like. Specifically, in the case where dilute hydrofluoric acid is used for the cleaning treatment, hydrofluoric acid (50 wt. %) is preferably diluted 100 times to 100000 times with water and used for the cleaning treatment. In other words, it is preferable to use dilute hydrofluoric acid with a concentration of 0.5 wt. % to $5 \times 10^{-4}$ wt. % for the cleaning treatment. By the cleaning treatment, the impurities attached onto the surfaces of the semiconductor film 403 and the insulating film 408 can be removed. Further, in the case of using dilute hydrofluoric acid for the cleaning treatment, the impurities attached to the semiconductor film 403 as well as part of the semiconductor film 403 can be removed.

Figure 26D:
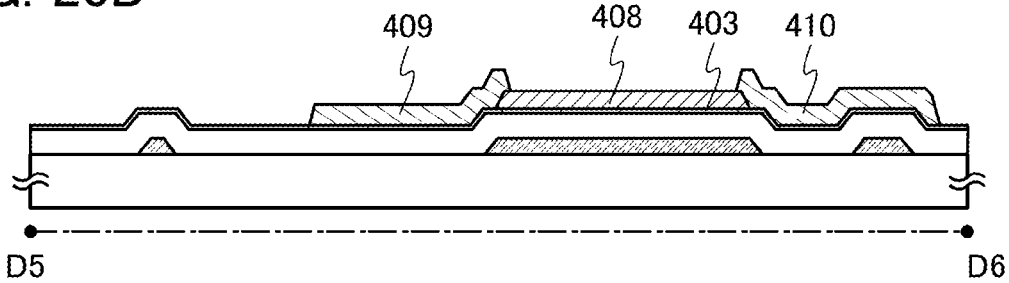

Next, a conductive film is formed over the semiconductor film 403 by a sputtering method or a vacuum evaporation method, and then the conductive film is etched (patterned) with a photolithography method. Thus, as illustrated in FIG. 26D, over the semiconductor film 403, the conductive film 409 and the conductive film 410 between which the insulating film 408 is sandwiched are formed. The conductive film 409 functions as one of the source electrode and the drain electrode of the transistor 513, and the conductive film 410 functions as the other of the source electrode and the drain electrode of the transistor 513.

The conductive film 409 and the conductive film 410 can be formed using a structure and a material similar to those of the conductive film 407. In the case where heat treatment is performed after the conductive film 409 and the conductive film 410 are formed, the conductive film 409 and the conductive film 410 preferably have heat resistance against this heat treatment. In this embodiment, each of the conductive film 409 and the conductive film 410 is a 150-nm-thick tungsten film.

Note that when conductive film 409 and the conductive film 410 are formed by etching, materials and etching conditions are adjusted as appropriate so that the semiconductor film 403 is removed as little as possible. Depending on the etching conditions, an exposed portion of the semiconductor film 403 is partly etched, so that a groove (a recessed portion) is formed in some cases.

In this embodiment, the conductive film 409 and the conductive film 410 are formed by dry etching with an ICP etching method. As a specific dry etching method, the conditions are changed during etching. The conditions at an initial state are as follows: the flow rate of sulfur hexafluoride used for an etching gas is 50 sccm; the reaction pressure is 1.5 Pa; the temperature of a lower electrode is 70° C.; the RF (13.56 MHz) power applied to a coil-shaped electrode is 500 W; and power applied to the lower electrode (the bias side) is 50 W. The changed conditions are as follows: the flow rates of boron trichloride and chlorine used for an etching gas are 60 sccm and 20 sccm, respectively; the reaction pressure is 1.9 Pa; the temperature of the lower electrode is 21° C.; the RF (13.56 MHz) power applied to the coil-shaped electrode is 450 W; and power applied to the lower electrode (the bias side) is 100 W.

In order to reduce the number of photomasks and steps in a photolithography method, etching may be performed with use of a resist mask formed using a multi-tone mask which is a light-exposure mask through which light is transmitted so as to have a plurality of intensities. A resist mask formed with use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. As a result, the number of light-exposure masks can be reduced, and the steps can be simplified.

Note that impurities such as boron, chlorine, fluorine, carbon, or aluminum are easily attached to surfaces of the semiconductor film 403 and the insulating film 408, which are exposed by etching for forming the conductive film 409 and the conductive film 410. In addition, the above impurities include an element constituting the conductive film 409 and the conductive film 410 in some cases.

When the impurities are attached to the surface of the semiconductor film 403, an increase in the amount of off-state current of the transistor or deterioration in electric characteristics of the transistor is likely to occur as described above. In addition, a parasitic channel is easily generated in the semiconductor film 403, whereby conductive films which should be electrically isolated are likely to be electrically connected through the semiconductor film 403. Thus, in one embodiment of the present invention, after etching for formation of the conductive film 409 and the conductive film 410 is performed, cleaning treatment for removing impurities which are supposed to be attached on the surfaces of the semiconductor film 403 and the insulating film 408 is performed.

The cleaning treatment can be performed with use of an alkaline solution such as a tetramethyl ammonium hydroxide (TMAH) solution, water, dilute hydrofluoric acid, or the like. Specifically, in the case where dilute hydrofluoric acid is used for the cleaning treatment, hydrofluoric acid (50 wt. %) is preferably diluted with 100 times to 100000 times water and used for the cleaning treatment. In other words, it is preferable to use dilute hydrofluoric acid with a concentration of 0.5 wt. % to $5 \times 10^{-4}$ wt. % for cleaning treatment. By the cleaning treatment, the impurities attached onto the surfaces of the semiconductor film 403 and the insulating film 408 can be removed. Further, in the case of using dilute hydrofluoric acid for the cleaning treatment, the impurities attached to the semiconductor film 403 as well as part of the semiconductor film 403 can be removed.

Although in this embodiment, the cleaning treatment for removal of the impurities after the etching is performed twice (first cleaning treatment is performed after the insulating film 408 is formed, and second cleaning treatment is performed after the conductive film 409 and the conductive film 410 are formed), the cleaning treatment may be performed once in one embodiment of the present invention.

Figure 29:
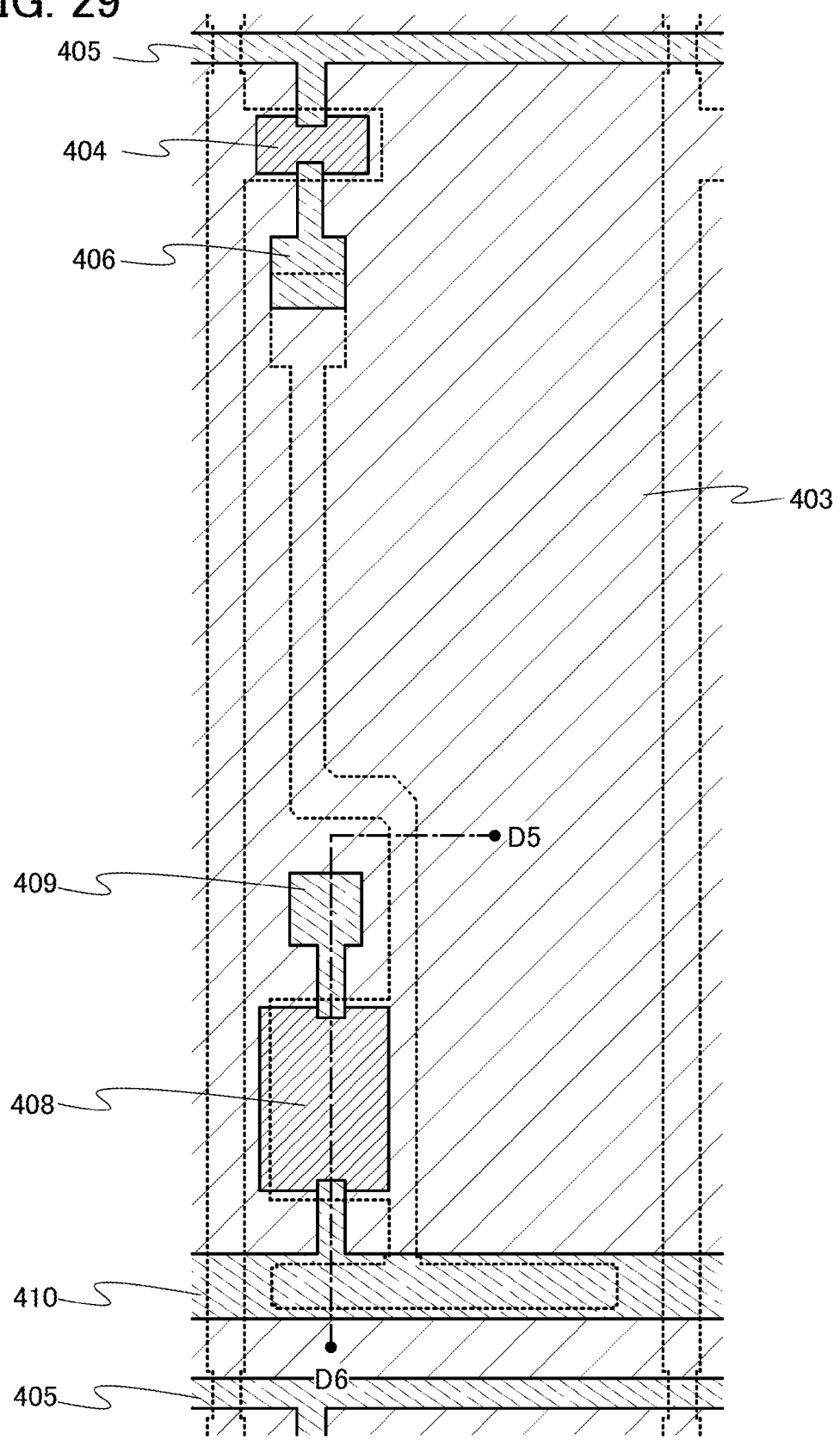
FIG. 29 illustrates a method for manufacturing a light-emitting device.

Note that FIG. 29 is a top view illustrating the light-emitting device at the time when the above steps are finished. A cross-sectional view taken along dashed-dotted line D5-D6 in FIG. 29 corresponds to FIG. 26D.

Figure 27A:
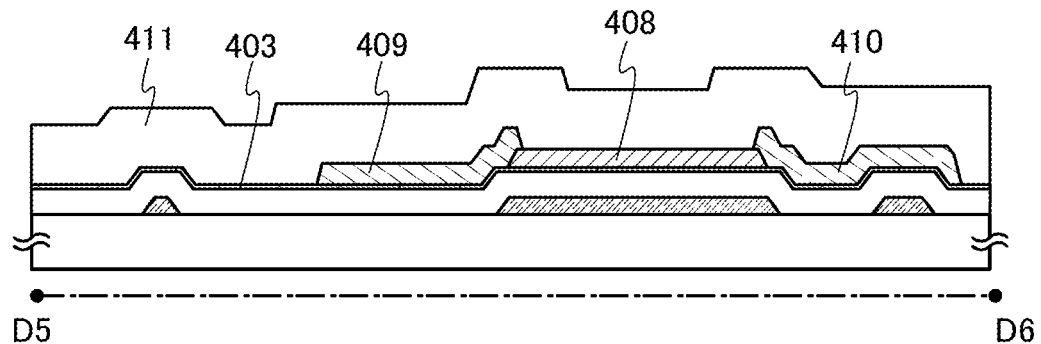
FIGS. 27A to 27C illustrate a method for manufacturing a light-emitting device.

Next, as illustrated in FIG. 27A, the insulating film 411 is formed to cover the semiconductor film 403, the insulating film 408, the conductive film 409, and the conductive film 410. The insulating film 411 preferably includes impurities such as moisture or hydrogen as little as possible, and the insulating film 411 may be formed using a single-layer insulating film or a plurality of insulating films stacked. When hydrogen is included in the insulating film 411, the hydrogen enters the semiconductor film 403 or extracts oxygen in the semiconductor film 403, whereby resistance of the vicinity of the surface of the semiconductor film 403 is reduced (i.e., the vicinity of the surface of the semiconductor film becomes an n-type semiconductor). Further, a parasitic channel is easily generated in the vicinity of the surface of the semiconductor film 403 where resistance is reduced, and thus, the conductive film 409 or the conductive film 410 might be electrically connected to another conductive film over the semiconductor film 403 due to the parasitic channel. Therefore, it is important that hydrogen be not used in a formation method in order to form the insulating film 411 containing as little hydrogen as possible.

Even in the case where the cleaning treatment is performed, when the substrate 400 is exposed to air before the insulating film 411 is formed, impurities such as carbon included in air may be attached to the surfaces of the semiconductor film 403 and the insulating film 408. Thus, in one embodiment of the present invention, before the insulating film 411 is formed, in a treatment chamber where the insulating film 411 is formed, the surfaces of the semiconductor film 403 and the insulating film 408 may be cleaned by plasma treatment using oxygen, dinitrogen monoxide, a rare gas (typically argon), or the like, so that impurities such as carbon attached to the surfaces of the semiconductor film 403 and the insulating film 408 are removed. After the impurities are removed by plasma treatment, the insulating film 411 is formed in a state where the substrate 400 is not exposed to air, whereby impurities are prevented from entering the vicinity of the interface between the semiconductor film 403 and the insulating film 411 and between the insulating film 408 and the insulating film 411. Accordingly, an increase in the amount of off-state current of the transistor or deterioration in electric characteristics of the transistor can be prevented.

A material having a high barrier property is preferably used for the insulating film 411. For example, as the insulating film having a high barrier property, a silicon nitride film, a silicon nitride oxide film, an aluminum nitride film, an aluminum oxide film, an aluminum nitride oxide film, or the like can be used. In the case where an insulating film has a stacked structure of a plurality of films, an insulating film such as a silicon oxide film containing oxygen or a silicon oxynitride film is formed on a side which is closer to the semiconductor film 403 than the insulating film having a high barrier property is. The insulating film having a high barrier property is formed so as to overlap with the semiconductor film 403 with the insulating film containing oxygen interposed therebetween. By using the insulating film having a high barrier property, the impurities such as moisture or hydrogen can be prevented from entering the semiconductor film 403, the gate insulating film 402, or the interface between the semiconductor film 403 and another insulating film and the vicinity thereof.

Further, in the case where a stacked structure of a plurality of insulating films is used for the insulating film 411, as an insulating film other than a first layer, an organic material having heat resistance, such as an acrylic resin, a polyimide resin, a benzocyclobutene-based resin, a polyamide resin, or an epoxy-based resin can be used for example. Other than the above organic material, a siloxane-based resin, silicon oxide, silicon nitride, silicon oxynitride, silicon nitride oxide, alumina, or the like can be used. A siloxane-based resin refers to a material in which a skeleton structure is formed by the bond of silicon (Si) and oxygen (O). As well as hydrogen, at least one of fluorine, a fluoro group, and an organic group (e.g., an alkyl group or aromatic hydrocarbon) may be used as a substituent. The insulating film 411 can be formed, depending on the material, by a method such as CVD, sputtering, SOG, spin coating, dipping, spray coating, a droplet discharge method (e.g., an inkjet method), a printing method (a screen printing method or an offset printing method) or the like. Further, the insulating film may be formed using a tool such as a doctor knife, a roll coater, a curtain coater, or a knife coater. Alternatively, as an insulating film other than a first layer, a silicon oxide film formed by chemical vapor deposition using organosilane can be used. For organosilane, tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: SiH(OC$_2$H$_5$)$_3$), tris(dimethylamino)silane (chemical formula: SiH(N(CH$_3$)$_2$)$_3$), or the like can be used.

In this embodiment, a silicon oxide film with a thickness of 300 nm which is formed by a sputtering method is used as the insulating film 411. The substrate temperature in film formation may be higher than or equal to room temperature and lower than or equal to 300° C. and in this embodiment, is 100° C.

Figure 27B:
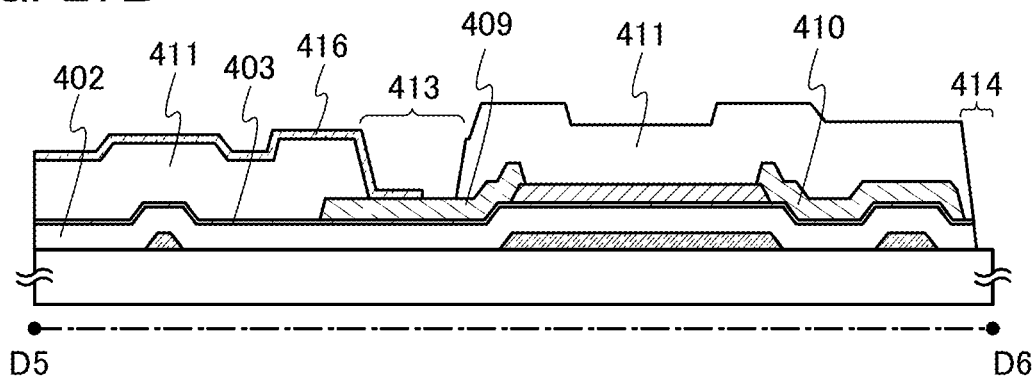

Next, as illustrated in FIG. 27B, the gate insulating film 402, the semiconductor film 403, and the insulating film 411 are etched with a photolithography method to have desired shapes, so that the opening portions 412 to 414 are formed.

In this embodiment, the gate insulating film 402, the semiconductor film 403, and the insulating film 411 are patterned by dry etching with an ICP etching method. Specifically, dry etching is performed under the following conditions: flow rates of trifluoromethane, helium, and methane used for an etching gas are 22.5 sccm, 127.5 sccm, and 5 sccm, respectively; the reaction pressure is 3.5 Pa; the temperature of a lower electrode is 21° C.; the RF (13.56 MHz) power applied to a coil-shaped electrode is 475 W; and the power applied to the lower electrode (bias side) is 300 W.

A region where the opening portion 413 is formed overlaps with part of a region where the conductive film 409 is formed; thus, the conductive film 409 is partly exposed in the opening portion 413.

Figure 30:
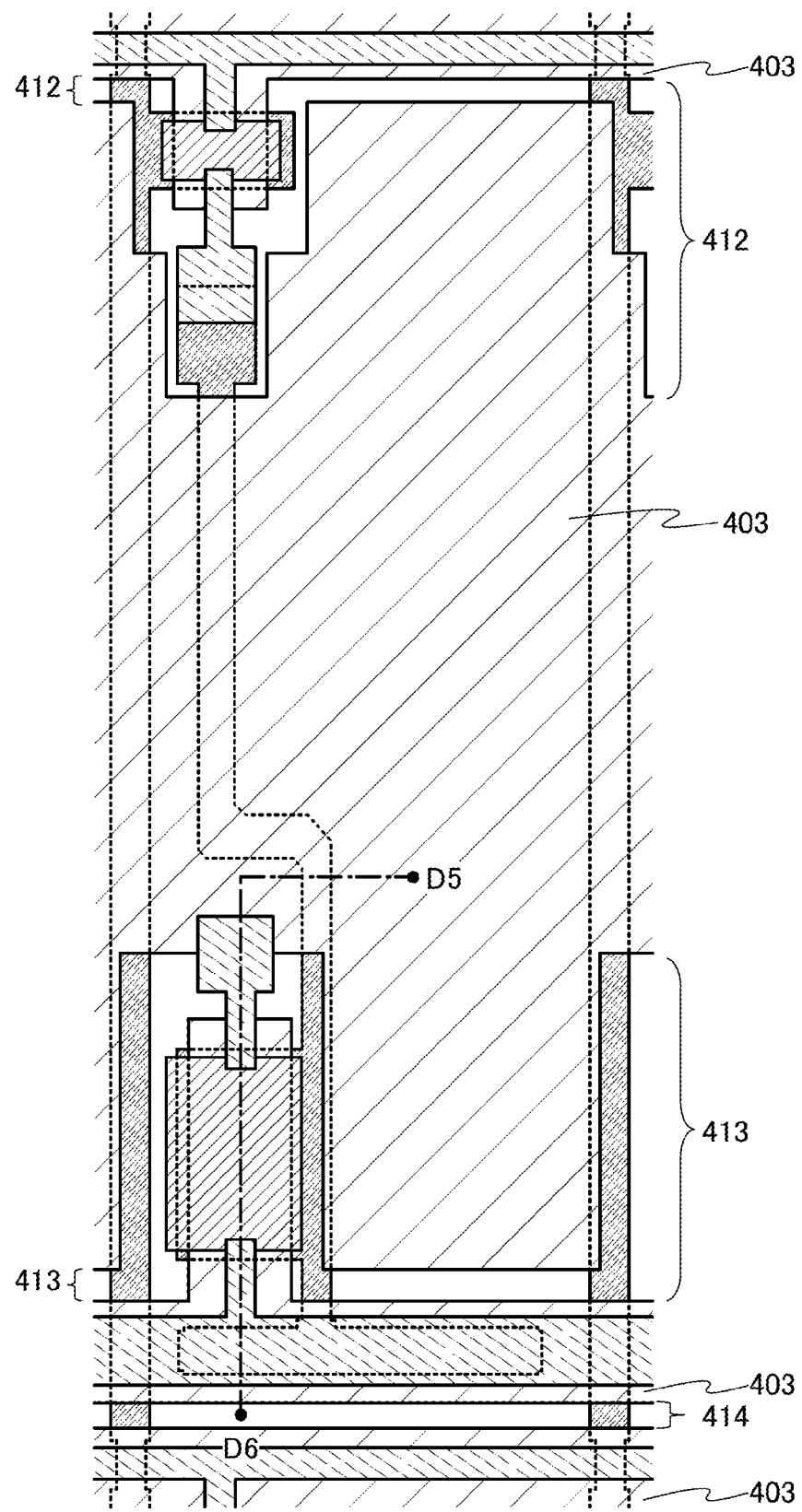
FIG. 30 illustrates a method for manufacturing a light-emitting device.

FIG. 30 is a top view illustrating the light-emitting device at the time when the above steps are finished. A cross-sectional view along dashed-dotted line D5-D6 in FIG. 30 corresponds to FIG. 27B.

Next, as illustrated in FIG. 27B, the conductive film 416 which is in contact with the conductive film 409 in the opening portion 413 is formed. The conductive film 416 functions as a pixel electrode, and part thereof is provided over the insulating film 411.

Figure 27C:
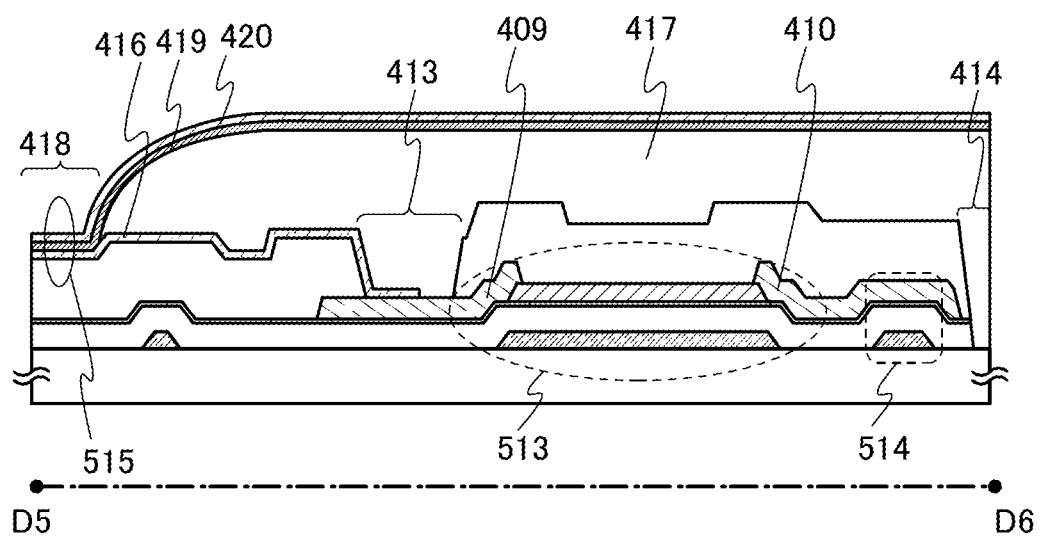

Next, as illustrated in FIG. 27C, the insulating film 417 having the opening portion 418 is formed over the conductive film 416 to cover part of the conductive film 416. The conductive film 416 is partly exposed in the opening portion 418 formed in the insulating film 417. The insulating film 417 can be formed using an inorganic insulating film, an organic resin film, or a siloxane-based insulating film. For example, an acrylic resin, a polyimide resin, a polyamide resin, or the like can be used as the organic resin film, and silicon oxide, silicon nitride oxide, or the like can be used as the inorganic insulating film. In particular, by using a photosensitive organic resin film for the insulating film 417 and forming the opening portion 418 over the conductive film 416 so that the side wall of the opening portion 418 has an inclined surface of continuous curvature, the conductive film 416 and the conductive film 420 which is to be formed later can be prevented from being connected to each other. A mask used for forming the opening portion 418 can be formed by a droplet discharge method or a printing method. Alternatively, the insulating film 417 itself may be formed by a droplet discharge method or a printing method.

Next, the EL layer 419 and the conductive film 420 are stacked in this order over the conductive film 416 and the insulating film 417. Through the above steps, the light-emitting element 515 in which the conductive film 416, the EL layer 419, and the conductive film 420 are stacked in this order can be formed in the opening portion 418 formed in the insulating film 417.

Note that the light-emitting element 515 may have a top-emission structure in which light emitted from the light-emitting element 515 travels in the direction of the substrate 400 side or a bottom-emission structure in which light emitted from the light-emitting element 515 travels in the direction opposite to the substrate 400 side. Alternatively, the light-emitting element 515 may have a dual-emission structure in which light emitted from the light-emitting element 515 travels both in the direction of the substrate 400 side and the direction opposite to the substrate 400 side. In accordance with any of the above three structures, materials and thicknesses of the conductive film 416 and the conductive film 420 are determined.

Specifically, for the conductive film 416 or the conductive film 420, the following materials can be used: indium oxide, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, an Al—Zn-based oxide semiconductor containing nitrogen, a Zn-based oxide semiconductor containing nitrogen, a Sn—Zn-based oxide semiconductor containing nitrogen, gold (Au), platinum (Pt), nickel (Ni), tungsten (W), chromium (Cr), molybdenum (Mo), iron (Fe), cobalt (Co), copper (Cu), palladium (Pd), or titanium (Ti). In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (e.g., MgAg or AlLi), a rare earth metal such as europium (Eu) or ytterbium (Yb), an alloy containing such an element, or the like can be used. Note that the conductive film 416 can be formed in the following manner: a conductive film is formed using the above material by a sputtering method or an evaporation method (including vacuum evaporation), for example, and then the conductive film is processed by etching with a photolithography method to be a desired shape.

Note that after the light-emitting element 515 is formed, it is preferable that the light-emitting element 515 be sealed between the substrate 400 and a cover material so as not to be exposed to air.

Although in this embodiment, the transistor 513 has a single-gate structure, a multi-gate transistor that includes a plurality of conductive films 407 electrically connected to each other and thus has a plurality of channel formation regions can be formed, if needed.

This embodiment can be implemented in combination with any of the other embodiments as appropriate.

Embodiment 9

Note that in a light-emitting device according to one embodiment of the present invention, a color filter method in which a color filter and a light-emitting element that emits light of a single color such as white are used in combination in order to display a full-color image can be employed. Alternatively, it is possible to employ a method in which full-color images are displayed by using a plurality of light-emitting elements which emit light of different hues. This method is referred to as a separate coloring method because EL layers, which are each placed between a pair of electrodes in a light-emitting element, are separately colored with their corresponding colors.

In the separate coloring method, in general, EL layers are separately deposited by vapor deposition with use of a mask such as a metal mask. Thus, the size of pixels depends on the accuracy of separate deposition of the EL layers by vapor deposition. On the other hand, unlike the separate coloring method, EL layers do not need to be separately formed in the color filter method. Accordingly, pixels can be downsized more easily than in the separate coloring method; thus, a high-definition pixel portion can be realized.

A light-emitting device includes, in its category, a bottom-emission light-emitting device in which light emitted from a light-emitting element is extracted from an element substrate side, over which a transistor is formed; and a top-emission light-emitting device in which light emitted from a light-emitting element is extracted from a side opposite to an element substrate. In the top-emission light-emitting device, light emitted from a light-emitting element is not blocked by an element such as a wiring, a transistor, or a capacitor, so that the efficiency of light extraction from a pixel can be made higher than that in the bottom-emission light-emitting device. Accordingly, the top-emission structure can achieve high luminance even when the amount of current supplied to the light-emitting element is reduced, and therefore is advantageous in improving the lifetime of a light-emitting element.

The light-emitting device according to one embodiment of the present invention may have a microcavity (micro optical resonator) structure in which light emitted from an EL layer resonates within a light-emitting element. With the microcavity structure, light having a specific wavelength can be extracted from the light-emitting element with high efficiency, so that the luminance and the color purity of the pixel portion can be improved.

FIG. 31 is an example of a cross-sectional view of pixels. FIG. 31 illustrates part of the cross section of a pixel emitting red light, part of the cross section of a pixel emitting blue light, and part of the cross section of a pixel emitting green light.

Specifically, FIG. 31 illustrates a pixel 340r emitting red light, a pixel 340g emitting green light, and a pixel 340b emitting blue light. The pixel 340r, the pixel 340g, and the pixel 340b include an anode 715r, an anode 715g, and an anode 715b, respectively. The anodes 715r, 715g, and 715b included in the pixels 340r, 340g, and 340b are provided over an insulating film 750 formed over a substrate 740.

A bank 730 formed using an insulating film is provided over the anodes 715r, 715g, and 715b. The bank 730 has openings, where parts of the anodes 715r, 715g, and 715b are exposed. An EL layer 731 and a cathode 732 that transmits visible light are stacked in this order over the bank 730 so as to cover the above exposed parts.

A portion where the anode 715r, the EL layer 731, and the cathode 732 overlap with one another corresponds to a light-emitting element 741r corresponding to red. A portion where the anode 715g, the EL layer 731, and the cathode 732 overlap with one another corresponds to a light-emitting element 741g corresponding to green. A portion where the anode 715b, the EL layer 731, and the cathode 732 overlap with one another corresponds to a light-emitting element 741b corresponding to blue.

In addition, a substrate 742 is provided to face the substrate 740 with the light-emitting elements 741r, 741g, and 741b interposed therebetween. A coloring layer 743r corresponding to the pixel 340r, a coloring layer 743g corresponding to the pixel 340g, and a coloring layer 743b corresponding to the pixel 340b are provided on the substrate 742. The coloring layer 743r is a layer whose transmittance of light in a wavelength range corresponding to red is higher than that of light in other wavelength ranges, the coloring layer 743g is a layer whose transmittance of light in a wavelength range corresponding to green is higher than that of light in other wavelength ranges, and the coloring layer 743b is a layer whose transmittance of light in a wavelength range corresponding to blue is higher than that of light in other wavelength ranges.

Further, an overcoat 744 is provided on the substrate 742 so as to cover the coloring layers 743r, 743g, and 743b. The overcoat 744 is a layer which transmits visible light and is provided for protecting the coloring layers 743r, 743g, and 743b, and a resin material with which planarity can be improved is preferably used therefor. The coloring layers 743r, 743g, and 743b and the overcoat 744 may be collectively regarded as a color filter, or each of the coloring layers 743r, 743g, and 743b may be regarded as a color filter.

In FIG. 31, a conductive film 745r with high visible-light reflectance and a conductive film 746r with higher visible-light transmittance than the conductive film 745r are stacked in this order to be used as the anode 715r. A conductive film 745g with high visible-light reflectance and a conductive film 746g with higher visible-light transmittance than the conductive film 745g are stacked in this order to be used as the anode 715g. The conductive film 746g has a smaller thickness than the conductive film 746r. A conductive film 745b with high visible-light reflectance is used as the anode 715b.

Thus, in the light-emitting device in FIG. 31, the optical path length of light emitted from the EL layer 731 in the light-emitting element 741r can be adjusted by the distance between the conductive film 745r and the cathode 732. The optical path length of light emitted from the EL layer 731 in the light-emitting element 741g can be adjusted by the distance between the conductive film 745g and the cathode 732. The optical path length of light emitted from the EL layer 731 in the light-emitting element 741b can be adjusted by the distance between the conductive film 745b and the cathode 732.

In one embodiment of the present invention, a microcavity structure may be employed, in which the above optical path lengths are adjusted in accordance with the wavelengths of light emitted from the light-emitting elements 741r, 741g, and 741b so that light emitted from the EL layer 731 resonates within each light-emitting element.

When the above microcavity structure is employed for the light-emitting device according to one embodiment of the present invention, light having a wavelength corresponding to red, of light emitted from the light-emitting element 741r, is increased in intensity by being resonated. Consequently, the color purity and the luminance of red light obtained through the coloring layer 743r are increased. Light having a wavelength corresponding to green, of light emitted from the light-emitting element 741g, is increased in intensity by being resonated. Consequently, the color purity and the luminance of green light obtained through the coloring layer 743g are increased. Light having a wavelength corresponding to blue, of light emitted from the light-emitting element 741b, is increased in intensity by being resonated. Consequently, the color purity and the luminance of blue light obtained through the coloring layer 743b are increased.

FIG. 31 illustrates a structure in which pixels emitting three colors of red, green, and blue are used; however, one embodiment of the present invention is not limited to the structure. In one embodiment of the present invention, a combination of four colors of red, green, blue, and yellow or a combination of three colors of cyan, magenta, and yellow may be used. Alternatively, the combination of the colors may include six colors of pale red, pale green, pale blue, deep red, deep green, and deep blue. Alternatively, the combination of the colors may be six colors of red, green, blue, cyan, magenta, and yellow.

Note that, for example, colors that can be expressed using the pixels of red (R), green (G), and blue (B) are limited to colors existing in the triangle made by the three points on the chromaticity diagram which correspond to the emission colors of the respective pixels. Therefore, as in the case where the pixels of red (R), green (G), blue (B), and yellow (Y) are used, by additionally providing a light-emitting element of a color existing outside the triangle on the chromaticity diagram, the range of the colors which can be expressed in the light-emitting device can be expanded, so that color reproducibility can be enhanced.

In FIG. 31, the conductive film 745b with high visible-light reflectance is used as the anode in the light-emitting element 741b which emits light with the shortest wavelength k among the light-emitting elements 741r, 741g, and 741b, and the conductive films 746r and 746g having different thicknesses are used in the other light-emitting elements 741r and 741g; thus, the optical path lengths are adjusted. In one embodiment of the present invention, a conductive film with high visible-light transmittance, like the conductive films 746r and 746g, may be provided over the conductive film 745b with high visible-light reflectance also in the light-emitting element 741b which emits light with the shortest wavelength λ. However, it is preferable to use the conductive film 745b with high visible-light reflectance as the anode of the light-emitting element 741b which emits light with the shortest wavelength λ as shown in FIG. 31, because the fabrication process of the anode can be simplified as compared to the case of using a conductive film with high visible-light transmittance for the anodes of all the light-emitting elements.

Note that in many cases, the work function of the conductive film 745b having high visible-light reflectance is smaller than those of the conductive films 746r and 746g having high visible-light transmittance. Accordingly, in the light-emitting element 741b which emits light with the shortest wavelength λ, holes are less likely to be injected from the anode 715b into the EL layer 731 than in the light-emitting elements 741r and 741g, resulting in low emission efficiency. In view of this, in one embodiment of the present invention, a composite material that contains a substance having a high hole-transport property and a substance having an acceptor property (electron-accepting property) with respect to the substance having a high hole-transport property is preferably used for part of the EL layer 731 that is in contact with the conductive film 745b with high visible-light reflectance in the light-emitting element 741b which emits light with the shortest wavelength 2. When the above composite material is formed to be in contact with the anode 715b, holes can be easily injected from the anode 715b into the EL layer 731, so that the emission efficiency of the light-emitting element 741b can be increased.

As the substance having an acceptor property, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their high acceptor property. Among these, molybdenum oxide is especially preferable since it is stable in the air and its hygroscopic property is low and thus, it is easily treated.

As the substance having a high hole-transport property used for the composite material, any of a variety of compounds such as an aromatic amine compound, a carbazole derivative, aromatic hydrocarbon, or a high molecular weight compound (e.g., an oligomer, a dendrimer, or a polymer) can be used. The organic compound used for the composite material is preferably an organic compound having a high hole-transport property. Specifically, a substance having a hole mobility of $10^{-6}$ cm$^2$/Vs or higher is preferably used. However, other substances than the above described materials may also be used as long as the substances have higher hole-transport properties than electron-transport properties.

The conductive films 745r, 745g, and 745b having high visible-light reflectance can be formed using a single layer or a stacked layer using aluminum, silver, an alloy containing such a metal material, or the like, for example. Alternatively, the conductive films 745r, 745g, and 745b may be formed by stacking a conductive film having high visible-light reflectance and a thin conductive film (preferably with a thickness of 20 nm or less, further preferably 10 nm or less). For example, a thin titanium film or a thin molybdenum film is stacked over a conductive film with high visible-light reflectance to form the conductive film 745b, so that an oxide film can be prevented from being formed on a surface of the conductive film with high visible-light reflectance (e.g., aluminum, an alloy containing aluminum, or silver).

For the conductive films 746r and 746g having high visible-light transmittance, for example, indium oxide, tin oxide, zinc oxide, indium tin oxide, indium zinc oxide, or the like can be used.

The cathode 732 can be formed, for example, by stacking a conductive film thin enough to transmit light (preferably with a thickness of 20 nm or less, further preferably 10 nm or less) and a conductive film including a conductive metal oxide. The conductive film thin enough to transmit light can be formed using a single layer or a stacked layer using silver, magnesium, an alloy containing such a metal material, or the like. As the conductive metal oxide, it is possible to use indium oxide, tin oxide, zinc oxide, indium oxide-tin oxide, indium oxide-zinc oxide, or any of these metal oxide materials containing silicon oxide.

This embodiment can be implemented in combination with any of the other embodiments as appropriate.

Embodiment 10

Next, an appearance of a panel of the light-emitting display device according to one embodiment of the present invention will be described with reference to FIGS. 32A and 32B. Note that FIG. 32A is a top view of a panel where a substrate 6001 and a substrate 6006 are bonded to each other with a sealant 6005. FIG. 32B corresponds to a cross-sectional view taken along dashed-dotted line E1-E2 in FIG. 32A.

A sealant 6005 is provided so as to surround a pixel portion 6002 and a scan line driver circuit 6004 provided over the substrate 6001. Further, the substrate 6006 is provided over the pixel portion 6002 and the scan line driver circuit 6004. Thus, the pixel portion 6002 and the scan line driver circuit 6004 are sealed together with a filler 6007 by the substrate 6001 and the substrate 6006.

In addition, an ultraviolet curable resin or a thermosetting resin can be used for the filler 6007 as well as inert gas such as nitrogen or argon. For the sealant 6005, a resin (such as an ultraviolet curable resin or a thermosetting resin), glass frit, or the like can be used.

A substrate 6021 provided with a signal line driver circuit 6003 is mounted in a region different from the region surrounded by the sealant 6005, over the substrate 6001. FIG. 32B illustrates a transistor 6009 included in the signal line driver circuit 6003. Although an example in which the scan line driver circuit 6004 and the pixel portion 6002 are provided over the substrate 6001 is shown in this embodiment, the scan line driver circuit 6004 provided on another substrate may be mounted on the substrate 6001. Further, although an example in which the signal line driver circuit 6003 provided on the substrate 6021 is mounted on the substrate 6001 is shown in this embodiment, the signal line driver circuit 6003 may be formed over the substrate 6001 over which the pixel portion 6002 is formed. Alternatively, part of the signal line driver circuit 6003 or part of the scan line driver circuit 6004 may be formed over the substrate 6001 over which the pixel portion 6002 is formed.

Each of the pixel portion 6002 and the scan line driver circuit 6004 provided over the substrate 6001 includes a plurality of transistors. FIG. 32B illustrates a transistor 6008 and a transistor 6010 included in the pixel portion 6002. A pixel electrode 6030 included in a light-emitting element 6011 is connected to the transistor 6010. A portion where the pixel electrode 6030, a counter electrode 6031, and an EL layer 6029 overlap with each other corresponds to the light-emitting element 6011.

A blocking film 6040 provided on the substrate 6006 overlaps with a region where the transistor 6008 and the transistor 6010 are formed. In addition, a coloring layer 6041 which preferentially transmits only visible light in a particular wavelength region is provided on the substrate 6006. The coloring layer 6041 overlaps with a region where the light-emitting element 6011 is formed.

The coloring layer 6041 which preferentially transmits light in a wavelength region corresponding to red, blue, or green is provided in each pixel, and the light-emitting element 6011 which emits white light is used, whereby a full color image can be displayed. Alternatively, the light-emitting element 6011 which emits red color and the coloring layer 6041 corresponding to a red color are combined, the light-emitting element 6011 which emits blue light and the coloring layer 6041 corresponding to a blue color are combined, and the light-emitting element 6011 which emits green light and the coloring layer 6041 corresponding to a green color are combined, whereby a full color image with high color purity can be displayed. Further alternatively, a plurality of light-emitting elements 6011 which emit red, blue, and green are provided in the pixel portion 6002 where the coloring layer 6041 is not provided, whereby a full color image can be displayed.

Note that although in FIG. 32B, the blocking film 6040 and the coloring layer 6041 are provided on the substrate 6006 side, the blocking film 6040 or the coloring layer 6041 may be provided on the substrate 6001 side. Positions of the blocking film 6040 and the coloring layer 6041 can be determined as appropriate, in accordance with the direction of light incident on the light-emitting element 6011 and the emission direction of light transmitted through the light-emitting element 6011.

A variety of signals and potentials that are given to the signal line driver circuit 6003, the scan line driver circuit 6004, and the pixel portion 6002 are supplied from a connection terminal 6016 through leading wirings 6014 and 6015. The connection terminal 6016 is electrically connected to a terminal included in an FPC 6018 through an anisotropic conductive film 6019.

This embodiment can be implemented in combination with any of the other embodiments as appropriate.

Embodiment 11

Figure 33:
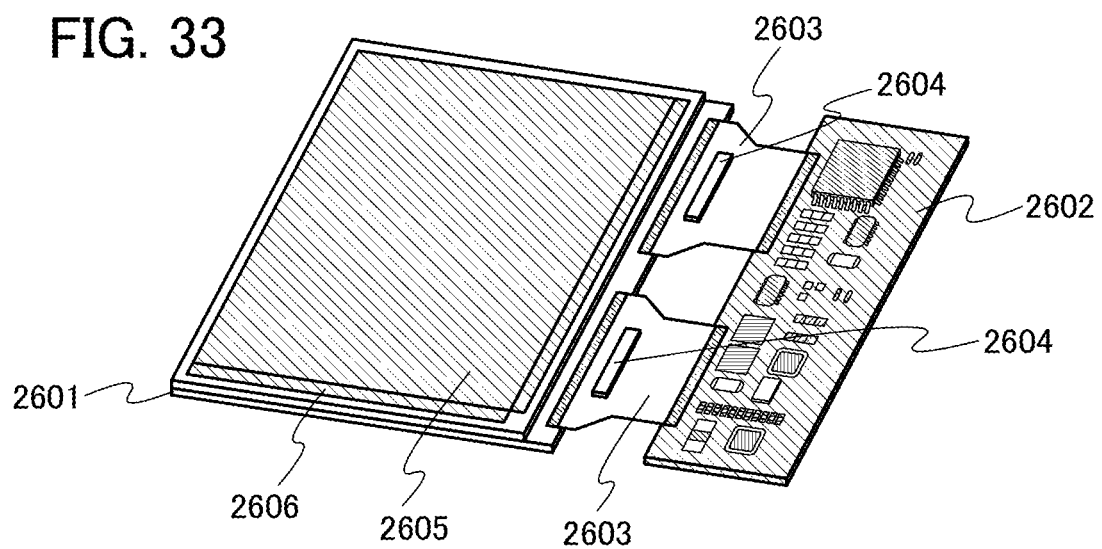
FIG. 33 is a perspective view of a light-emitting device.

FIG. 33 is an example of a perspective view of the light-emitting device according to one embodiment of the present invention.

The light-emitting device illustrated in FIG. 33 includes a panel 2601, a circuit board 2602, a COF tape 2603, and a chip 2604 provided with a signal line driver circuit. In addition, the chip 2604 provided with the signal line driver circuit is connected to the COF tape 2603 by a chip on film (COF) method. The circuit board 2602 is provided with a circuit which generates a variety of signals input to the panel 2601, a circuit which processes the signals, or the like. From the circuit board 2602, a variety of signals and potentials are input to the panel 2601 through the COF tape 2603.

The panel 2601 includes a pixel portion 2605 provided with a plurality of pixels and a scan line driver circuit 2606. The scan line driver circuit 2606 selects a plurality of pixels included in the pixel portion 2605 per row. The signal line driver circuit provided in the chip 2604 controls input of image signals to pixels in a row selected by the scan line driver circuit 2606.

Note that instead of the COF tape 2603, a flexible printed circuit (FPC) or the like is used for electrical connection between the circuit board 2602 and the panel 2601.

In the case of using the COF tape 2603, part of a circuit of the circuit board 2602 may be formed on a chip which is separately prepared, and the chip may be connected to the COF tape 2603 by a COF method. Alternatively, part or entire of the scan line driver circuit 2606 or part of the signal line driver circuit may be formed on another chip, and the chip may be connected to the COF tape 2603 by a COF method.

This embodiment can be implemented in combination with any of the other embodiments as appropriate.

Embodiment 12

A liquid crystal display device according to one embodiment of the present invention can be used in display devices, personal computers, and image reproducing devices provided with recording media (a typical example of which is devices reproducing the content of recording media such as digital versatile discs (DVDs) and having a display for displaying the reproduced images). Other examples of electronic devices that can include the liquid crystal display device or the light-emitting device according to one embodiment of the present invention are mobile phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of the display devices are illustrated in FIGS. 16A to 16E.

Figure 16A:
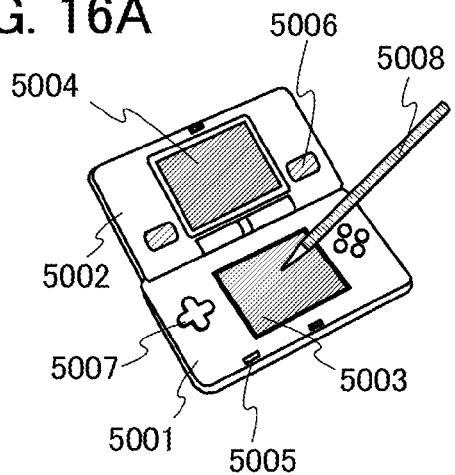
FIGS. 16A to 16E each illustrate an electronic device.

FIG. 16A illustrates a portable game machine including a housing 5001, a housing 5002, a display portion 5003, a display portion 5004, a microphone 5005, speakers 5006, operation keys 5007, a stylus 5008, and the like. The liquid crystal display device or the light-emitting device according to one embodiment of the present invention is used for the display portion 5003 or the display portion 5004, whereby a portable game machine with high reliability can be provided. Note that although the portable game machine illustrated in FIG. 16A has the two display portions 5003 and 5004, the number of display portions included in a portable game machine is not limited to this.

Figure 16B:
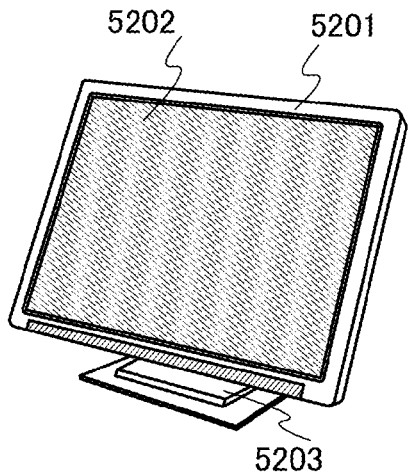

FIG. 16B illustrates a display device, which includes a housing 5201, a display portion 5202, a support 5203, and the like. The liquid crystal display device or the light-emitting device according to one embodiment of the present invention is used for the display portion 5202, whereby a display device with high reliability can be provided. Note that a display device includes, in its category, any display device for displaying information, such as display devices for personal computers, TV broadcast reception, and advertisement.

Figure 16C:
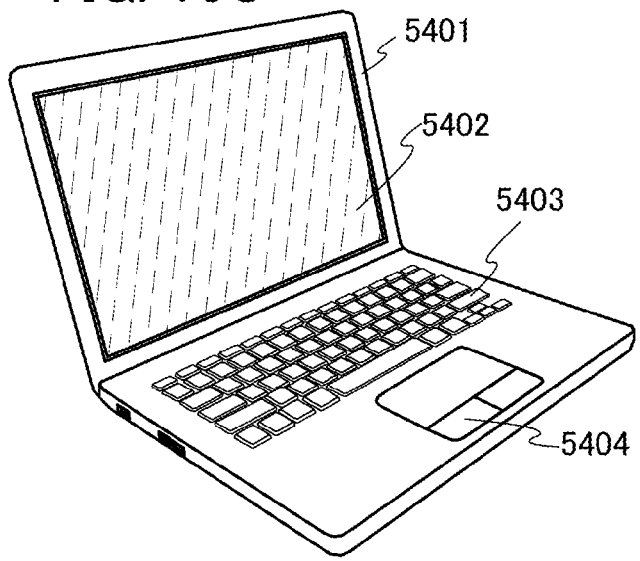

FIG. 16C illustrates a laptop personal computer, which includes a housing 5401, a display portion 5402, a keyboard 5403, a pointing device 5404, and the like. The liquid crystal display device or the light-emitting device according to one embodiment of the present invention is used for the display portion 5402, whereby a laptop personal computer with high reliability can be provided.

Figure 16D:
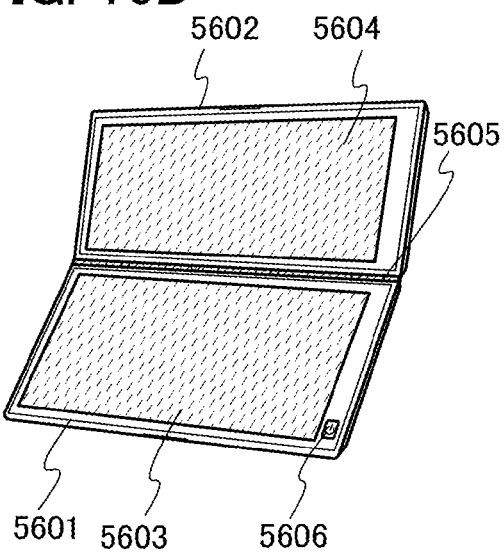

FIG. 16D illustrates a personal digital assistant, which includes a first housing 5601, a second housing 5602, a first display portion 5603, a second display portion 5604, a joint 5605, an operation key 5606, and the like. The first display portion 5603 is provided for the first housing 5601, and the second display portion 5604 is provided for the second housing 5602. The first housing 5601 and the second housing 5602 are connected to each other with the joint 5605, and an angle between the first housing 5601 and the second housing 5602 can be changed with the joint 5605. The image displayed on the first display portion 5603 may be switched depending on the angle in the joint 5605 between the first housing 5601 and the second housing 5602. A liquid crystal display device or a light-emitting device with a position input function may be used as at least one of the first display portion 5603 and the second display portion 5604. Note that the position input function can be added by provision of a touch panel in a liquid crystal display device or a light-emitting device. Alternatively, the position input function can be added by provision of a photoelectric conversion element called a photosensor in a pixel portion of a liquid crystal display device or a light-emitting device. The liquid crystal display device or the light-emitting device according to one embodiment of the present invention is used for the first display portion 5603 and the second display portion 5604, whereby a personal digital assistant with high reliability can be provided.

Figure 16E:
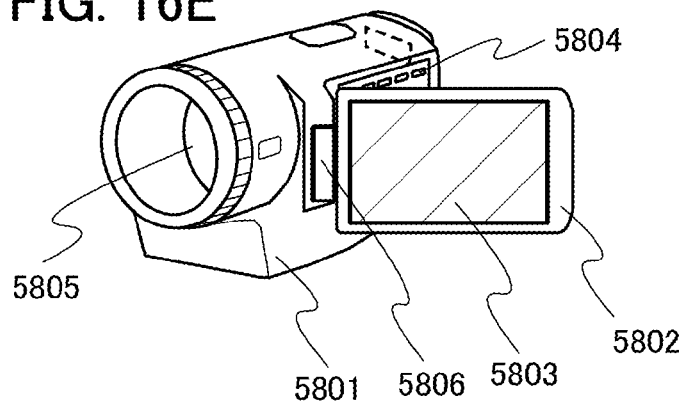

FIG. 16E illustrates a video camera, which includes a first housing 5801, a second housing 5802, a display portion 5803, operation keys 5804, a lens 5805, a connection portion 5806, and the like. The operation keys 5804 and the lens 5805 are provided for the first housing 5801, and the display portion 5803 is provided for the second housing 5802. The first housing 5801 is connected to the second housing 5802 by the connection portion 5806, and the angle between the first housing 5801 and the second housing 5802 can be changed by the connection portion 5806. The image displayed on the display portion 5803 may be switched depending on the angle in the connection portion 5806 between the first housing 5801 and the second housing 5802. The liquid crystal display device or the light-emitting device according to one embodiment of the present invention is used for the display portion 5803, whereby a video camera with high reliability can be provided.

This embodiment can be implemented in combination with any of the other embodiments as appropriate.

This application is based on Japanese Patent Application serial no. 2011-247258 filed with Japan Patent Office on Nov. 11, 2011 and Japanese Patent Application serial no. 2011-247256 filed with Japan Patent Office on Nov. 11, 2011, the entire contents of which are hereby incorporated by reference.

What is claimed is:

1. A semiconductor device comprising:
   a first insulating film and a second insulating film over a substrate;
   a first semiconductor film over the first insulating film;
   a second semiconductor film over the second insulating film;
   a third insulating film over the first semiconductor film;
   a first conductive film and a second conductive film over the first semiconductor film and the third insulating film, wherein the third insulating film is interposed between the first conductive film and the second conductive film;
   a fourth insulating film over the first semiconductor film, the first conductive film, and the second conductive film;
   a third conductive film over the second semiconductor film;
   a fifth insulating film over the second semiconductor film and the third conductive film; and
   an opening portion between the first insulating film and the second insulating film, between the first semiconductor film and the second semiconductor film, and between the fourth insulating film and the fifth insulating film, wherein the opening portion is provided between the third conductive film and at least one of the first conductive film and the second conductive film.

2. The semiconductor device according to claim 1, comprising a fourth conductive film over the substrate, wherein the first semiconductor film is provided over the fourth conductive film with the first insulating film interposed therebetween.

3. The semiconductor device according to claim 1, comprising a fourth conductive film over the fourth insulating film, wherein the fourth conductive film is in contact with one of the first conductive film and the second conductive film.

4. The semiconductor device according to claim 1, wherein each of the first semiconductor film and the second semiconductor film is an oxide semiconductor film.

5. The semiconductor device according to claim 4, wherein the oxide semiconductor film comprises indium and zinc.

6. The semiconductor device according to claim 5, wherein the oxide semiconductor film comprises gallium.

7. The semiconductor device according to claim 1,
   wherein the first conductive film and the second conductive film are on and in contact with the first semiconductor film, and
   wherein the third conductive film is on and in contact with the second semiconductor film.

8. The semiconductor device according to claim 1,
   wherein the first semiconductor film is on and in contact with the first insulating film, and
   wherein the second semiconductor film is on and in contact with the second insulating film.

9. A semiconductor device comprising:
   a first insulating film over a substrate;
   a semiconductor film over the first insulating film;
   a second insulating film over the semiconductor film;
   a first conductive film and a second conductive film over the semiconductor film and the second insulating film, wherein the second insulating film is interposed between the first conductive film and the second conductive film;
   a third conductive film over the semiconductor film;
   a third insulating film over the semiconductor film, the first conductive film, the second conductive film, and the third conductive film; and
   an opening portion in the first insulating film, the semiconductor film, and the third insulating film, wherein the opening portion is provided between the third conductive film and at least one of the first conductive film and the second conductive film.

10. The semiconductor device according to claim 9, wherein the opening portion is surrounded by the semiconductor film.

11. The semiconductor device according to claim 9, comprising a fourth conductive film over the substrate, wherein the semiconductor film is provided over the fourth conductive film with the first insulating film interposed therebetween.

12. The semiconductor device according to claim 9, comprising a fourth conductive film over the third insulating film, wherein the fourth conductive film is in contact with one of the first conductive film and the second conductive film.

13. The semiconductor device according to claim 9, wherein the semiconductor film is an oxide semiconductor film.

14. The semiconductor device according to claim 13, wherein the oxide semiconductor film comprises indium and zinc.

15. The semiconductor device according to claim 14, wherein the oxide semiconductor film comprises gallium.

16. The semiconductor device according to claim 9, wherein the first conductive film, the second conductive film, and the third conductive film are on and in contact with the semiconductor film.

17. The semiconductor device according to claim 9, wherein the semiconductor film is on and in contact with the first insulating film.

18. A method for manufacturing a semiconductor device, the method comprising the steps of:
    forming a first insulating film over a substrate;
    forming a semiconductor film over the first insulating film;
    forming a second insulating film over the semiconductor film;
    forming a first conductive film and a second conductive film over the semiconductor film and the second insulating film and forming a third conductive film over the semiconductor film;
    forming a third insulating film over the semiconductor film, the first conductive film, the second conductive film, and the third conductive film; and
    forming an opening portion between the third conductive film and at least one of the first conductive film and the second conductive film by removing parts of the third insulating film, the semiconductor film, and the first insulating film.

19. The method according to claim 18, wherein the opening portion is surrounded by the semiconductor film.

20. The method according to claim 18, comprising the step of forming a fourth conductive film over the substrate, wherein the semiconductor film is formed over the fourth conductive film with the first insulating film interposed therebetween.

21. The method according to claim 18, comprising the step of forming a fourth conductive film over the third insulating film, wherein the fourth conductive film is in contact with one of the first conductive film and the second conductive film.

22. The method according to claim 18, wherein the semiconductor film is an oxide semiconductor film.

23. The method according to claim 22, wherein the oxide semiconductor film comprises indium and zinc.

24. The method according to claim 23, wherein the oxide semiconductor film comprises gallium.

25. The method according to claim 18, wherein the first conductive film, the second conductive film, and the third conductive film are on and in contact with the semiconductor film.

26. The method according to claim 18, wherein the semiconductor film is on and in contact with the first insulating film.

* * * * *